US012701961B2

(12) United States Patent
Saito et al.

(10) Patent No.: US 12,701,961 B2
(45) Date of Patent: Aug. 4, 2026

(54) ELECTROSTATIC ATTRACTION DEVICE AND ELECTROSTATIC ADSORPTION METHOD

(71) Applicant: TOKYO INSTITUTE OF TECHNOLOGY, Tokyo (JP)

(72) Inventors: Shigeki Saito, Tokyo (JP); Tomohiro Ryo, Tokyo (JP); Yuki Taoka, Tokyo (JP); Sanchuan Xu, Tokyo (JP)

(73) Assignee: Tokyo Institute of Technology, Tokyo (JP)

( * ) Notice: Subject to any disclaimer, the term of this patent is extended or adjusted under 35 U.S.C. 154(b) by 191 days.

(21) Appl. No.: 18/684,533

(22) PCT Filed: Aug. 17, 2022

(86) PCT No.: PCT/JP2022/031126
§ 371 (c)(1),
(2) Date: Feb. 16, 2024

(87) PCT Pub. No.: WO2023/022180
PCT Pub. Date: Feb. 23, 2023

(65) Prior Publication Data
US 2024/0379399 A1    Nov. 14, 2024

(30) Foreign Application Priority Data

Aug. 20, 2021    (JP) ................................. 2021-134992

(51) Int. Cl.
*H10P 72/72*          (2026.01)
(52) U.S. Cl.
CPC .................................. *H10P 72/722* (2026.01)
(58) Field of Classification Search
CPC ... H02N 13/00; H01L 21/683; H01L 21/6833; H01L 21/67103; B25J 15/0085;
(Continued)

(56) References Cited

U.S. PATENT DOCUMENTS

| 2010/0003110 A1* | 1/2010 | Yokota | .................... B32B 38/18 |
| | | | 414/217.1 |
| 2014/0104744 A1* | 4/2014 | Prahlad | ................ B25J 15/0085 |
| | | | 361/234 |
| 2019/0134826 A1* | 5/2019 | Hwang | ................ B25J 15/0009 |

FOREIGN PATENT DOCUMENTS

| JP | 58-098827 U | 7/1983 |
| JP | 63-014207 A | 1/1988 |
| | (Continued) | |

OTHER PUBLICATIONS

Dhelika et al., "Electrostatic chuck consisting of polymeric electrostatic inductive fibers for handling of objects with rough surfaces," Smart Materials and Structures, 2013,22:095010, 1-9.
(Continued)

*Primary Examiner* — Danny Nguyen
(74) *Attorney, Agent, or Firm* — Foley & Lardner LLP

(57)          ABSTRACT

The adsorptive power and load capacity of an electrostatic chuck is vastly improved by maintaining an optimal state for in-plane stress produced at the interface between an adsorption surface and an object. The electrostatic adsorption module of the invention comprises a tip member having a bipolar adsorption surface and a support member that supports the tip member, wherein the tip member as a whole can be elastically displaced in the near and far direction with respect to the object to be adsorbed, and the tip member and the support member are coupled via a freely rotatable joint. The electrostatic adsorption device is provided with multiple tip members with bipolar adsorption surfaces that can be elastically displaced in the near and far direction with respect to the object to be adsorbed, the support member supporting the tip members extending from a substrate and the substrate being deformable. Also provided is an electrostatic adsorption method wherein an electrostatic adsorption (Continued)

module or electrostatic adsorption device is used to adsorb and grip an object to be adsorbed.

21 Claims, 29 Drawing Sheets

(58) Field of Classification Search
CPC .... B25J 15/12; B25J 9/14; B25J 15/00; H10P 72/722
USPC ........................................................ 361/234
See application file for complete search history.

(56) References Cited

FOREIGN PATENT DOCUMENTS

| | | | |
|---|---|---|---|
| JP | 10-316354 | A | 12/1998 |
| JP | 2001-353682 | A | 12/2001 |
| JP | 2011-099797 | A | 5/2011 |
| JP | 2013-519532 | A | 5/2013 |
| JP | 6846821 | B2 | 3/2021 |
| KR | 101019111 | B1 | 3/2011 |
| WO | WO-2011/100028 | A1 | 8/2011 |

OTHER PUBLICATIONS

Saruwatari et al., "Development of the electrostatic chuck for curved surface in photolithographic processes," Collection of 2015 Spring Conference Academic Lectures by the Japan Society for Precision Engineering, 2015, 805-806, with English abstract.

* cited by examiner

Fig. 1a
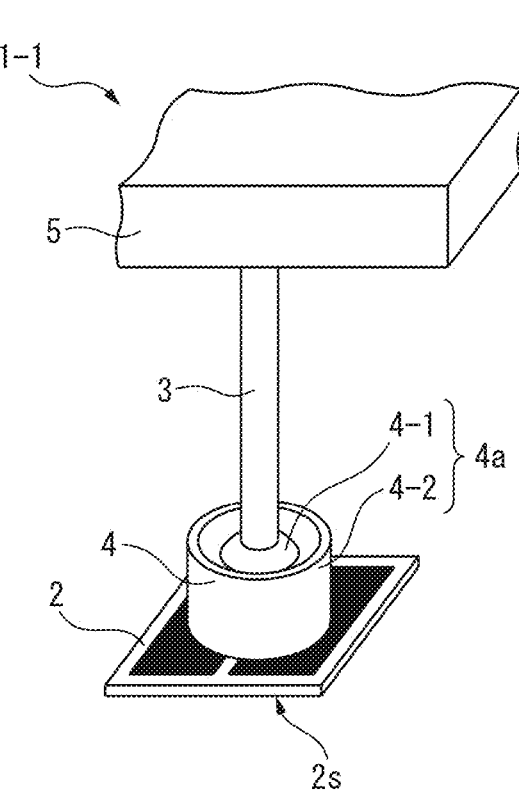
Fig. 1b
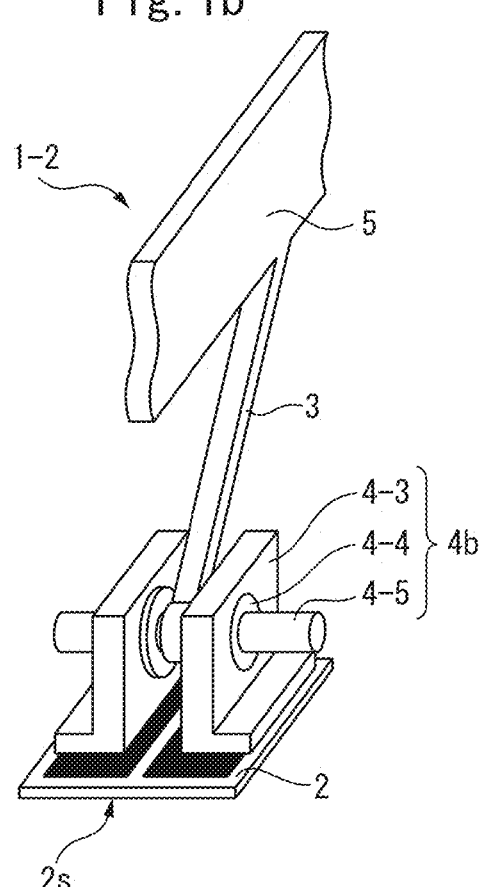
Fig. 1c
Fig. 1d
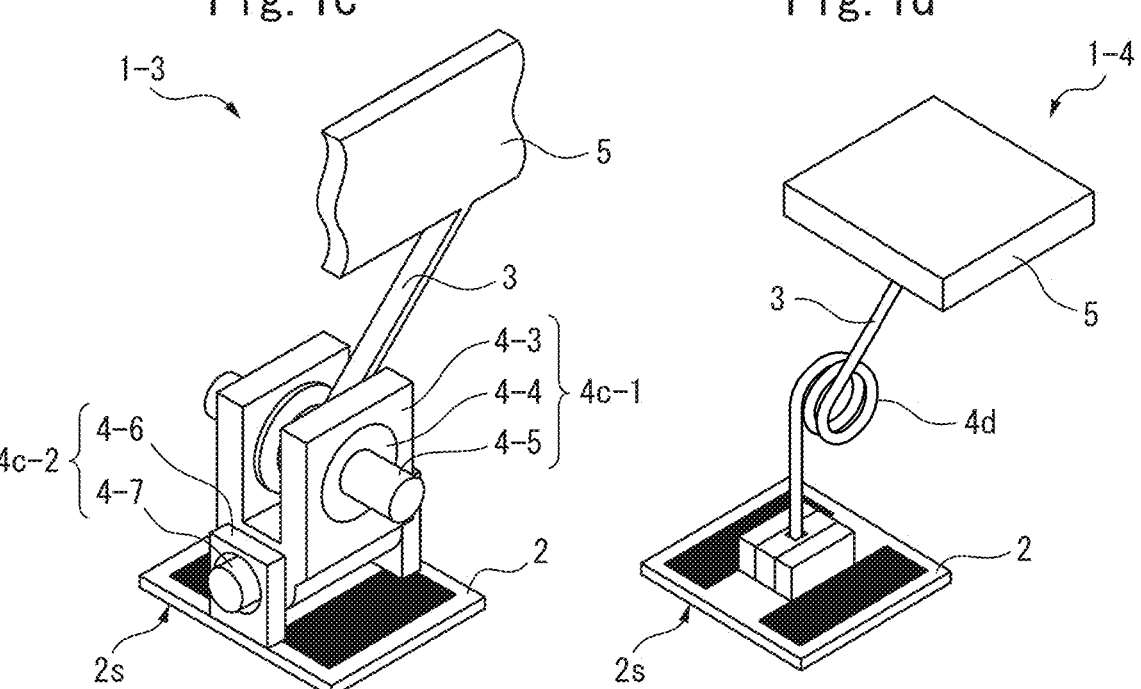

Fig. 14a
Fig. 14b
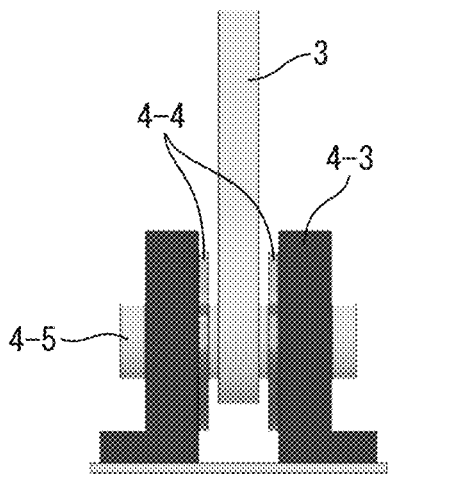
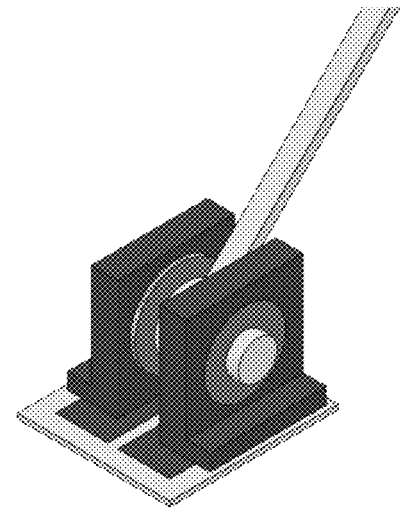

Fig. 18

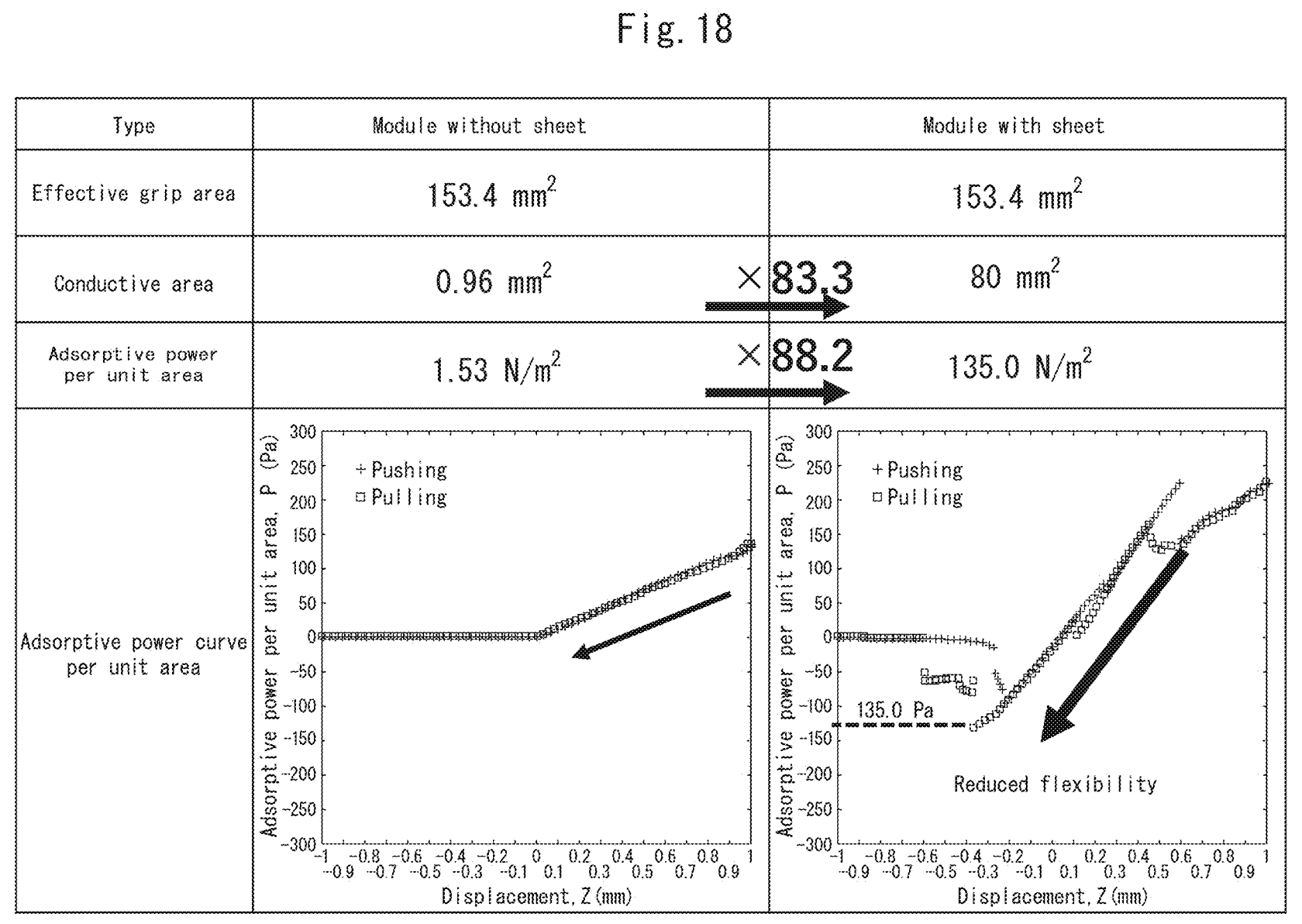

| Type | Module without sheet | | Module with sheet |
|---|---|---|---|
| Effective grip area | 153.4 mm$^2$ | | 153.4 mm$^2$ |
| Conductive area | 0.96 mm$^2$ | ×83.3 ↑ | 80 mm$^2$ |
| Adsorptive power per unit area | 1.53 N/m$^2$ | ×88.2 ↑ | 135.0 N/m$^2$ |

R = 100mm

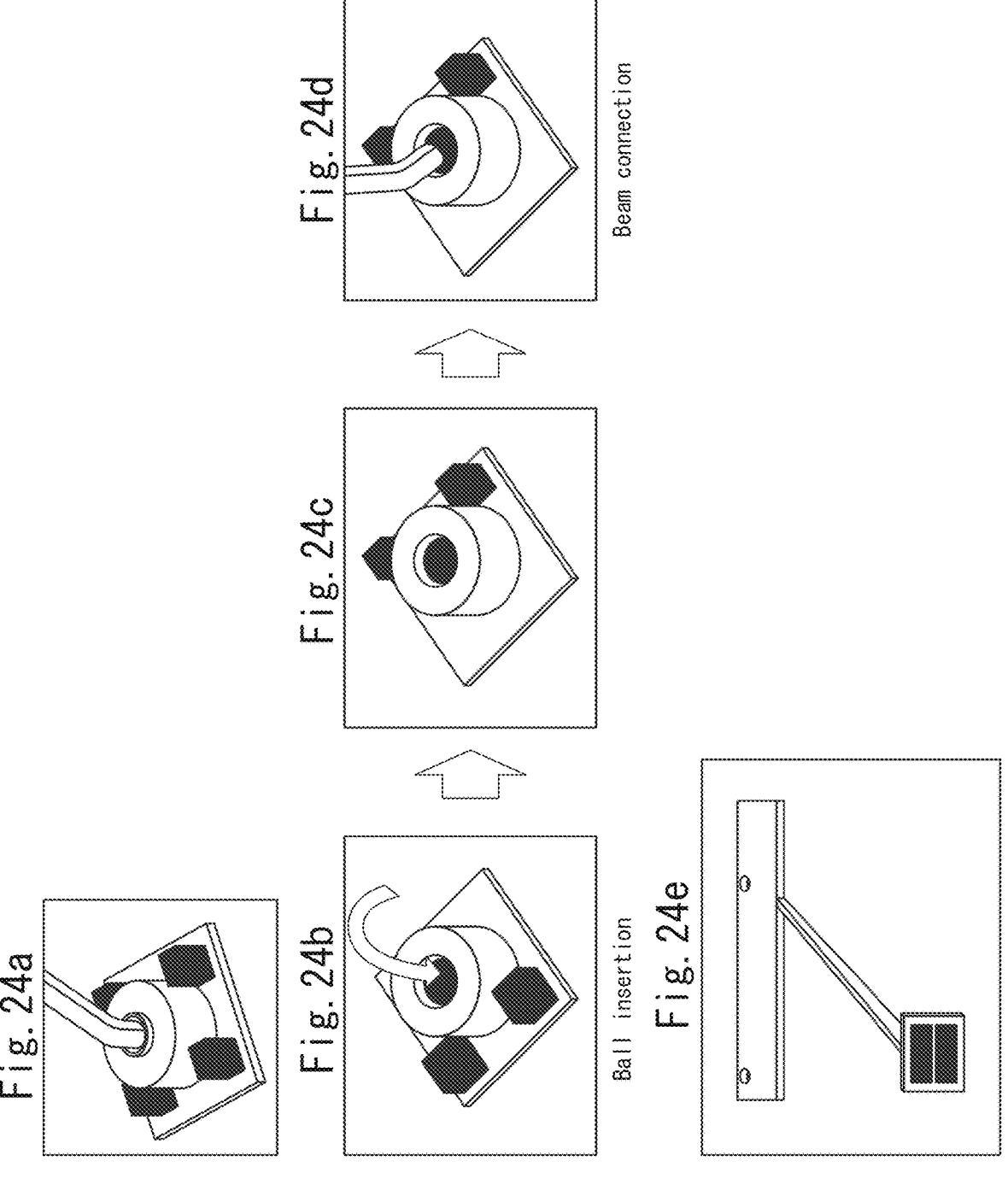

Fig. 28b
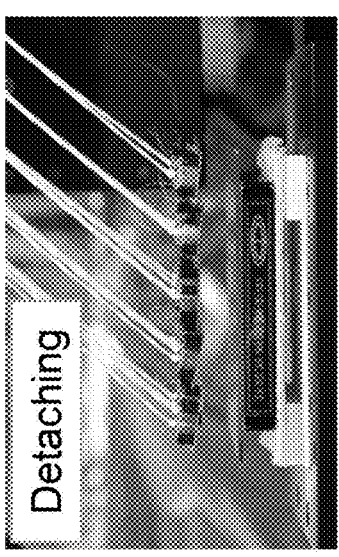
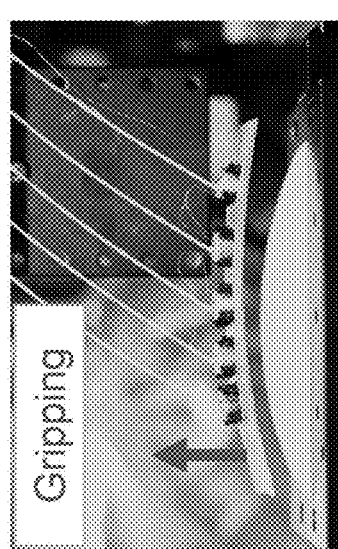
Fig. 28a
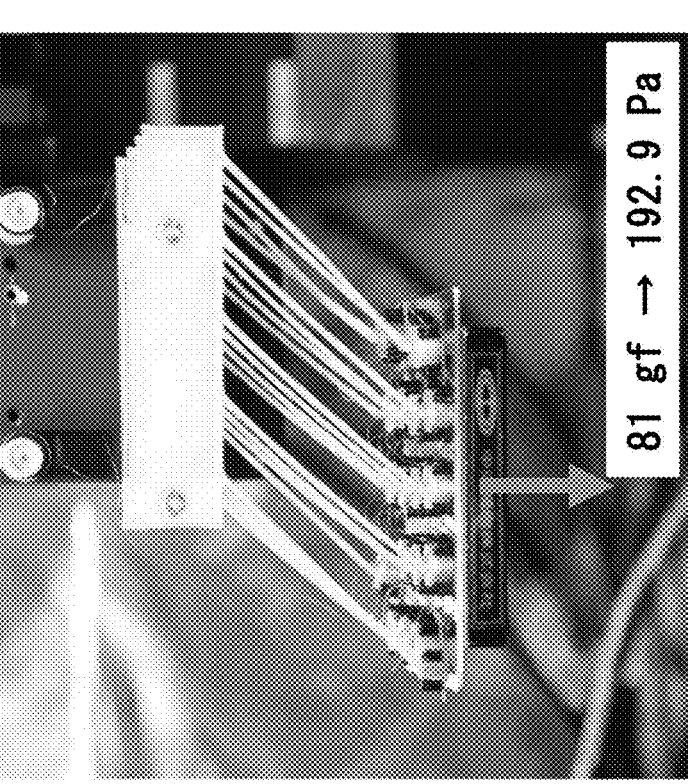

ELECTROSTATIC ATTRACTION DEVICE AND ELECTROSTATIC ADSORPTION METHOD

CROSS-REFERENCE TO RELATED APPLICATIONS

This application is the U.S. National Stage of PCT/JP2022/031126, filed Aug. 17, 2022, which claims priority to JP 2021-134992, filed Aug. 20, 2021.

FIELD

The present invention relates to an electrostatic adsorption module, an electrostatic adsorption device and an electrostatic adsorption method.

BACKGROUND

Electrostatic chucks are devices that grip and detach objects utilizing electrostatic force acting between the electrostatic chuck and an object while a voltage is applied. The mechanism of an electrostatic chuck creates a difference in potential between itself and the gripped object using electrodes, with the generated electrostatic force adsorbing the gripped object, and such mechanism may be a Coulomb force type using an insulating material as the dielectric material. An electrostatic chuck is useful because it is able to grip an object on one side by adsorption without sandwiching the object on both sides, while also allowing dielectric (non-magnetic) materials such as plastic or semiconductors to be gripped. However, since electrostatic force is dependent on the distance between the electrodes and the object, an electrostatic chuck has reduced adsorptive power for objects with curved surface shapes, for which reason it has conventionally been used to grip objects with flat surfaces such as silicon wafers on tables.

Radon et al. have developed an electrostatic chuck that is flexible on the adsorption surface, due to a structure with integrated electrostatic induction fibers (NPL 1). However the production process involves creating a dense arrangement of individual fibers, making it difficult to produce large areas or to form electrode wirings. Moreover, fibers formed by melt spinning have uneven tips due to deformation under residual stress. Another problem has been difficulty in handling, which is a barrier against integration. Sawatari et al. have proposed development of a device suited for curved surfaces, wherein fine conductive beams are aligned in a photolithography technique used for semiconductor production (NPL 2). However, this cannot be applied for dielectric materials since this research so far employs a monopolar electrostatic chuck.

The present inventors have developed, as an electrostatic chuck which is flexible on the adsorption surface and adaptable to dielectric materials, a bipolar electrostatic chuck which has a fine piliform structure on the adsorption surface and is suitable for thin-film dielectric materials such as plastic sheets (PTL 1). The present inventors have also developed a bipolar electrostatic chuck module which is an integrated three-layer molded body comprising an insulator sandwiched between two electric conductors, the module being layerable to allow a large-area fine piliform structure to be formed as the adsorption surface (PTL 1). However, one issue with this electrostatic adsorption device (electrostatic chuck) is that, while being a gripping/detaching device which can effectively exhibit electrostatic force with fibrous aggregates by flexible contact with a surface, its load capacity is low depending on the state of contact with the surface.

CITATION LIST

Patent Literature

[PTL 1] Japanese Patent Publication No. 6,846,821

Non Patent Literature

[NPL 1] R. Dhelika et al., Smart Mater Struct., Vol. 22 pp. 095010(1-9) 2013
[NPL 2] Sawatari et al., Collection of 2015 Spring Conference Academic Lectures by the Japan Society for Precision Engineering, pp. 805-806, 2015

SUMMARY

Technical Problem

It is an object of the present invention to provide an electrostatic adsorption device which is flexible on the adsorption surface, is suitable for dielectric materials and has increased adsorptive power, as well as an electrostatic adsorption method using the same.

Solution to Problem

The present invention according to a first aspect achieves this object, maintaining a suitable state of in-plane stress at the interface between the adsorption surface and an object and greatly increasing the adsorptive power and load capacity of the electrostatic chuck (electrostatic adsorption module), by allowing the tip of the electrostatic adsorption device to be elastically displaced in the near and far direction with respect to the object to be adsorbed, while applying a joint with rotational freedom to permit change in the orientation of the electrostatic adsorption plane in the rotational direction.

The invention according to a second aspect provides an electrostatic adsorption device wherein several electrostatic adsorption modules that are able to flexibly contact with the surface form of an object to be adsorbed, similar to the electrostatic adsorption module of the first aspect, are combined with second deformation means that is capable of greater deformation than the displacement possible by the electrostatic adsorption module, thereby allowing flexible adaptation to the surface forms of large-sized adsorbed objects.

The following are preferred aspects of the invention.
(Aspect 1)

An electrostatic adsorption module comprising a tip member having a bipolar adsorption surface and a support member that supports the tip member,
    wherein the tip member as a whole can be elastically displaced in the near and far direction with respect to the object to be adsorbed, and
    the tip member and the support member are coupled via a freely rotatable joint.
(Aspect 2)

The electrostatic adsorption module according to aspect 1, wherein the bipolar adsorption surface has a positive electrode, a negative electrode, and an insulation region between them.

3

(Aspect 3)

The electrostatic adsorption module according to aspect 1 or 2, wherein the joint has two-dimensional or three-dimensional rotational freedom.

(Aspect 4)

The electrostatic adsorption module according to any one of aspects 1 to 3, wherein the tip member is laminar and has the joint on the opposite end of the tip member from the electrostatic adsorption surface.

(Aspect 5)

The electrostatic adsorption module according to any one of aspects 1 to 4, wherein the support member is constructed of multiple members that can be displaced in the near and far direction, and an elastic member that joins the multiple members.

(Aspect 6)

The electrostatic adsorption module according to any one of aspects 1 to 4, wherein the support member is constructed of an elastic member that can be displaced in the near and far direction.

(Aspect 7)

The electrostatic adsorption module according to any one of aspects 1 to 6, which comprises multiple support members that support the tip member, the multiple support members being fixed to a support substrate on the opposite end from the tip member.

(Aspect 8)

An electrostatic adsorption device comprising:

a support substrate, multiple tip members each having a bipolar electrostatic adsorption surface, and multiple support members extending from the support substrate and supporting the multiple tip members, wherein the multiple support members are able to elastically displace the multiple tip members as a whole in the near and far direction with respect to the support substrate, and the support substrate itself is deformable.

(Aspect 9)

The electrostatic adsorption device according to aspect 8, wherein the support substrate is operated by a robotic arm.

(Aspect 10)

The electrostatic adsorption device according to aspect 8 or 9, wherein the multiple support members and the multiple tip members have a fine piliform structure, the fine piliform structure has an insulating layer between the positive electrode layer and the negative electrode layer, and a bipolar electrostatic adsorption surface is formed at the tip of the fine piliform structure.

(Aspect 11)

The electrostatic adsorption device according to aspect 8 or 9, wherein the multiple support members and the tip members are coupled via a freely rotatable joint.

(Aspect 12)

The electrostatic adsorption device according to any one of aspects 8 to 11, wherein the support substrate comprises multiple aligned laminar bodies, the multiple laminar bodies being connected together in an elastically refractable manner.

(Aspect 13)

The electrostatic adsorption device according to aspect 12, wherein each of the multiple laminar bodies supports multiple pairs of support members and tip members.

(Aspect 14)

An electrostatic adsorption method in which an object to be adsorbed is adsorbed and gripped using an electrostatic adsorption module according to any one of aspects 1 to 7 or an electrostatic adsorption device according to any one of aspects 8 to 13.

(Aspect 15)

The method according to aspect 14, wherein the object to be adsorbed is flexible or has a curved surface.

(Aspect 16)

The method according to aspect 14 or 15, which comprises the electrostatic adsorption module or electrostatic adsorption device conveying and detaching the object to be adsorbed after the electrostatic adsorption module or electrostatic adsorption device has adsorbed and gripped the object to be adsorbed.

(Aspect 17)

The method according to any one of aspects 14 to 16, which comprises using the electrostatic adsorption module or electrostatic adsorption device to adsorb and grip an object to be adsorbed which is flexible or has a curved surface, to convey the object to be adsorbed to a setting location having a curved surface and to adapt the object to be adsorbed to the curved surface of the setting location, and then detaching the object to be adsorbed from the electrostatic adsorption module or electrostatic adsorption device.

(Aspect 18)

The method according to aspect 17, wherein the detachment is carried out after the object to be adsorbed that is adapted to the curved surface of the setting location has been fixed to the curved surface.

(Aspect 19)

The method according to any one of aspects 14 to 18, wherein:

the electrostatic adsorption module or electrostatic adsorption device has multiple tip members arranged in rows from one end to the other end, the multiple tip members are used to adsorb and grip the object to be adsorbed and the object to be adsorbed is conveyed onto the setting base, after which the voltage applied to the multiple tip members for adsorption and gripping is turned OFF in polarity reversal attenuation mode, and the multiple tip members on the object to be adsorbed on the setting base are separated so that the object to be adsorbed at the other end recedes more quickly than the object to be adsorbed at the one end, with respect to the surface of the setting base, to detach the multiple tip members from the object to be adsorbed on the setting base while the object to be adsorbed is allowed to remain on the setting base.

Advantageous Effects of Invention

The electrostatic adsorption module according to the first aspect of the invention can be elastically displaced in the near and far direction of an object to be adsorbed on an adsorption surface, even if the object has a curved surface form or is a flexible object, while permitting change in the orientation of the adsorption surface in the near and far direction and rotational direction using a joint that provides the electrostatic adsorption surface with rotational freedom, so that a suitable state of in-plane stress can be maintained at the interface between the adsorption surface and the object, allowing the adsorptive power and load capacity to be greatly increased.

Also provided is an electrostatic adsorption module in which multiple such electrostatic adsorption modules are integrated and the support substrate gripping the multiple electrostatic adsorption modules is deformable, making it adaptable to both fine curved surfaces (large curvature) and large curved surfaces (small curvature) of objects to be adsorbed.

According to a second aspect of the invention there is provided an electrostatic adsorption device, as an electrostatic adsorption module that is able to flexibly contact with the surface form of an object to be adsorbed, and is combined with a second deformable member (preferably one that is capable of greater deformation than the displacement possible by the electrostatic adsorption module), allowing flexible adaptation to the surface forms of large-sized adsorbed objects.

Also provided is an electrostatic adsorption method wherein an electrostatic adsorption module according to the first aspect or an electrostatic adsorption device according to the second aspect is used to electrostatically grip a flexible object to be adsorbed, or to convey and detach the object to be adsorbed along a curved surface.

BRIEF DESCRIPTION OF DRAWINGS

FIGS. 1a to 1d are diagrams schematically showing an electrostatic adsorption module according to a first aspect of the invention.

FIGS. 12a and 12b are diagrams showing an electrostatic adsorption module having a fine piliform structure and a sheet-like tip adsorption surface.

FIGS. 14a and 14b are diagrams showing a joint using a ball bearing.

FIG. 18 is a chart showing measurement results for electrostatic adsorption force of electrostatic adsorption modules having a fine piliform structure and a sheet-like tip adsorption surface.

FIG. 24a is a photograph of the electrostatic adsorption module fabricated in Example 4, and FIGS. 24b-24e are schematic views showing the process of fabricating a ball joint mechanism.

FIG. 25 shows four different types of electrostatic adsorption modules fabricated in Example 5, the top row being schematic views of the models and the bottom row being photographs of fabricated models.

FIG. 28a shows electrostatic adsorption of an object to be adsorbed comprising slide glass attached to a metal sheet using the integrated model of FIGS. 27a and 27b. FIG. 28b shows the state of conveying and setting of a flexible plastic sheet on a curved surface using the integrated model of FIGS. 27a and 27b.

DESCRIPTION OF EMBODIMENTS

[Electrostatic Adsorption Module]

Figure 1E:
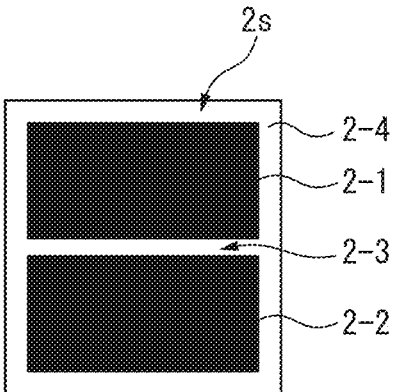
FIGS. 1e to 1f are diagrams schematically showing the adsorption surface of the electrostatic adsorption module of FIGS. 1a-1d.

The first aspect of the invention is an electrostatic adsorption module comprising a tip member having a bipolar adsorption surface and a support member that supports the tip member,

wherein the tip member is able to be elastically displaced in the near and far direction of the object to be adsorbed, and the tip member and the support member are coupled via a freely rotatable joint.

In the electrostatic adsorption module according to the first aspect of the invention, since the adsorption surface is not limited to the end face of a fine piliform structure, the area of the adsorption surface can be increased, and since it is unnecessary to set multiple fine piliform structures (effective adsorption surfaces; electrodes) at intervals as in a fine piliform structure, the adsorption surface area per unit area is not reduced and it is possible to greatly increase the adsorptive power per unit area and the load capacity by adsorption surface.

Moreover, in the electrostatic adsorption module according to the first aspect of the invention, the tip members that are not fine piliform structures on the adsorption surfaces but have electrostatic adsorption surfaces which are optionally sheet-like, are movable in the near and far direction with respect to the object to be adsorbed, and by also being freely rotatable via the joints, the module as a whole is adaptable to objects with curved surface forms or flexibility, allowing high adsorptive power to be exhibited.

A conventional electrostatic adsorption device is adaptable to flat objects such as semiconductor wafers, but no such device has even been proposed that is able to adapt to curved surface forms or flexible objects, other than the specialized devices described above under "Background".

According to the first aspect of the invention, the electrostatic adsorption module provided is the first electrostatic adsorption module to have freely rotatable joints that can also elastically displace tip members with optionally sheet-like electrostatic adsorption surfaces, in the near and far direction with respect to an object to be adsorbed, thereby having a flexible electrostatic adsorption surface that can adapt to objects which have curved surface forms or are flexible, while maintaining sufficient adsorption area.

Since the bipolar electrostatic module according to the first aspect of the invention is flexible on adsorption surfaces it is advantageous for objects with curved surface forms, while also allowing delicate gripping, conveying and attachment (or detachment) without applying excessive stress to thin soft materials such as plastic films, paper or fabrics, and being suitable for application to automation of the production processes for increasingly complex wearable devices and handling techniques for flexible media such as flexible electronics.

There has been particular demand for development of an electrostatic adsorption device as a gripping, conveying and detachment device for organic EL panels that allows sheet-like organic EL panels to be installed on curved surfaces of buildings, but no such device has been realized to date. There is also demand for development of an electrostatic adsorption device for gripping, conveying and detachment that can be used for attachment of protective films onto curved glass. The bipolar electrostatic module according to the first aspect of the invention is able to meet these demands.

(Tip Member with Electrostatic Adsorption Surface)

The electrostatic adsorption module according to the first aspect of the invention has a tip member, the tip member having a bipolar electrostatic adsorption surface.

In the electrostatic adsorption module according to the first aspect of the invention, the electrostatic adsorption surface is bipolar, and is composed of a positive electrode, a negative electrode and an insulation region between them. Since the electrostatic adsorption surface is bipolar, the electrostatic adsorption device is highly useful as the electrodes do not need to be connected or arranged on the side of the object to be adsorbed and the to be adsorbed can be conveyed by adsorption from one side of the object to be adsorbed.

The electrode material may be a metal such as stainless steel or aluminum, or a semiconductor such as a doped Si wafer, in addition to other materials.

The insulating material may also be polyamide, polyimide or acrylate, for example.

Any method may be used to produce the tip member, using a publicly known technique such as 3D printing or a water jet method.

In the electrostatic adsorption module according to the first aspect of the invention, the electrostatic adsorption surface of each tip member may have multiple positive electrodes and negative electrodes, or one of each, although one positive electrode and negative electrode each is preferred from the viewpoint of electrode area efficiency.

The shape of the positive electrode, negative electrode and insulation region is not particularly restricted, but preferably the positive electrode and negative electrode may be rectangular or square, with a linear insulation region between them. The entire region of the positive electrode, negative electrode and the insulation region between them is preferably surrounded by an insulation region. The bipolar electrostatic adsorption surface composed of one positive electrode and negative electrode each with an insulation region between them may have a high effective electrostatic adsorption area (electrode area), such as an effective area of 80% or greater or 90% or greater.

For uniform distribution of positive electrodes and negative electrodes on the adsorption surface of the tip member, the bipolar electrostatic adsorption surface of the tip member may have a plurality of fine square or arc-shaped positive electrodes and negative electrodes arranged in an alternately dispersed manner.

The shape of each electrode is not limited to rectangular, and may be square, trapezoidal, semicircular, elliptical, toric, arc-shaped, triangular, polygonal, circular or a division of polygonal shape, for example.

According to the first aspect of the invention, the bipolar electrostatic adsorption surfaces may be flat surfaces, as flat surfaces are preferred from the viewpoint of adsorptive power. However, non-flat surfaces may be used depending on the surface form of the object to be adsorbed. According to a preferred aspect, the electrostatic adsorption surfaces may be non-flat surfaces matching (complementary to) the non-flat surface form of an object to be adsorbed.

The electrostatic adsorption surface side and opposite side of each tip member may be either covered or not covered with an insulator (insulating layer). If the electrostatic adsorption surface side of the tip member has an insulating layer, and the insulating layer is elastically deformable or soft, then the insulating layer of the electrostatic adsorption surface will be able to adapt to the surface form such as the curved surface form of an object to be adsorbed by its own flexibility. The thickness of the insulating layer on the electrostatic adsorption surface side of the tip member is preferably 50 μm or smaller and more preferably 10 μm or smaller, for example. The thickness of the insulating layer on the opposite side from the electrostatic adsorption surface side of the tip member may be the same as, or greater than, the thickness of the insulating layer on the electrostatic adsorption surface side.

Similarly, if the electrodes of the tip member, and the layers of insulation regions between them and surrounding the electrodes and the insulation regions are elastically deformable or soft, then the electrode surfaces will be able to adapt to the surface forms such as the curved surface form of an object to be adsorbed by their own flexibility. Conductive rubber is an example of an elastically deformable conductive material. When the electrodes are formed of an elastically deformable material or flexible material, a non-elastic (rigid) support layer may be provided on the opposite side from the electrostatic adsorption surface for strength reinforcement and shape stability of the tip member.

The dimensions of the tip member or electrostatic adsorption surface in the electrostatic adsorption module according to the first aspect of the invention are not particularly restricted and may be selected as appropriate for the desired properties in relation to the dimensions, surface form and weight of the object to be adsorbed. Small dimensions and area or large dimensions and area may be selected. Smaller dimensions and area for the tip member or electrostatic adsorption surface are preferred for easier adaptation to small changes in the surface forms of objects to be adsorbed, but the adsorptive power will be reduced if they are too small. The module according to the first aspect of the invention will have a more flexible surface and will be able to adapt to objects of larger dimensions if the composite adsorption surface is constructed with a greater number of arranged modules, even if each of the modules have reduced adsorptive power. The tip member or electrostatic adsorption surface of individual modules may therefore be reduced within a range that allows the desired adsorptive power to be ensured.

On the other hand, for an object to be adsorbed that has large dimensions, integrating a large number of small modules increases production cost and may not even be necessary, and therefore the dimensions of the tip members of the module may be selected in consideration of the shape and dimensions of the object to be adsorbed.

The dimension of the tip member or bipolar electrostatic adsorption surface may be any of various dimensional ranges, such as about 10 μm to 1000 μm, about 1 to 10 mm, about 1 to 10 cm, or about 10 cm or greater, for example, in one direction (on one side). The dimension in the direction perpendicular to the one direction (one side) may be the same or different.

In the tip member according to the first aspect of the invention, the dimensions in the direction away from the adsorption surface (typically the direction perpendicular to the electrostatic adsorption surface) (the dimensions being the thickness and height: hereunder referred to as "dimension in the height direction" or "height", for convenience), may generally be smaller than the dimension of the electrostatic adsorption surface, since it is sufficient for the tip member to consist of the positive electrode, negative electrode and insulation region at the bipolar electrostatic adsorption surface. In other words, the electrostatic adsorption tip member may generally be laminar or sheet-like, optionally curved, especially flat or flat sheet-like.

The height (thicknesse) of the tip member may be any of various dimensional ranges, such as about 5 to 100 μm, about 100 to 1000 μm, about 1 to 10 mm, about 1 to 5 cm or about 5 cm or greater, for example, in one direction (on one side). The electrostatic adsorption module according to the first aspect of the invention may have a joint on the opposite side from the electrostatic adsorption surface of the tip member, in which case the above-mentioned height dimension does not include the joint.

The positive electrode and negative electrode of the tip member are electrically connected to the respective positive and negative electrodes of a power source, by any known connection method. They may be connected using simple flexible wires independently from the support member structure, or wiring may be embedded into all or some of the tip members, joints and support members, or wiring may be embedded as an internal structural component of the tip members, joints and support members.

In the electrostatic adsorption module according to the first aspect of the invention, each tip member can be elastically displaced in the near and far direction with respect to the object to be adsorbed, but since this function is mainly performed by the support member it will be explained below in relation to the support member.

(Support Member)

The electrostatic adsorption module according to the first aspect of the invention has a support member supporting a tip member.

The support member may support the tip member from above in a suspended manner, or from below in a supporting manner, or in any other manner. For convenience in the drawings, the support member will generally be described as one that supports the tip member by suspending from above, but it may be of another type which can be imagined based on the same explanation.

The support member may be any one that can support the tip member via the joint. A long-shaped member is generally preferred. The support member is a member extending from the support substrate, as the base of the support member, to the joint in the direction of the tip member. The support member is preferably straight linear, but it may be curved, or may be partially bent, or may have a helical or other shape. The direction in which the support member extends with respect to the support substrate is preferably perpendicular, but it may also be inclined.

In the electrostatic adsorption module according to the first aspect of the invention, the support member and/or tip member, and particularly the support member, have a structure or mechanism allowing the tip member to be elastically displaced in the near and far direction with respect to the adsorption surface (for example, the vertical direction with respect to the gripped and conveyed object). In order for the tip member having an electrostatic adsorption surface to adapt to the surface form of the object to be adsorbed, it is elastically displaceable in the near and far direction with respect to the adsorption surface while the electrostatic adsorption surface is also rotatable via the joint, thereby allowing the electrostatic adsorption surface of the tip member to adapt to the surface form of the object to be adsorbed or to changes in it, within the restrictions of the dimensions of the electrostatic adsorption surface.

The ability of the tip member to be displaced in the near and far direction with respect to the adsorption surface (usually the vertical direction) is not limited only to the near and far direction in the strict sense (the direction roughly perpendicular to the adsorption surface), but rather should be interpreted as including cases where the tip member can be displaced in a direction which includes the near and far direction (the direction roughly perpendicular to the adsorption surface), such as any direction that includes not only the near and far direction in the strict sense (the direction roughly perpendicular to the adsorption surface) but also a direction transverse to the near and far direction (for example, a direction roughly parallel to inclined with respect to the adsorption surface). In other words, that the tip member according to the first aspect of the invention can be displaced in the near and far direction with respect to the adsorption surface means that it can be displayed arbitrarily in the direction perpendicular to the near and far direction between the tip member and the adsorption surface, and displacement is possible in the shortest distance in the near and far direction between the tip member and the adsorption surface, and that displacement is possible at least in the near and far direction in the strict sense (the direction roughly perpendicular to the adsorption surface). According to the invention, the "near and far direction with respect to the object to be adsorbed" may also be referred to as "at least the near and far direction with respect to the object to be adsorbed", either for clarity or for emphasis.

The electrostatic adsorption module according to one aspect of the first aspect of the invention, may include a support substrate, the support member extending from the support substrate toward the tip member, in which case the fact that the "tip member can be displaced in the near and far direction with respect to the object to be adsorbed" may be stated as "the tip member can be displaced in the near and far direction with respect to the support substrate". The near and far direction with respect to the support substrate, when referring to the tip member, may be the direction with the shortest distance between the tip member and the support substrate when the electrostatic adsorption module is being used.

The structure or mechanism which allows the support member to elastically displace the tip member in the near and far direction with respect to the adsorption surface may be provided on the tip member side, but it is preferably provided on the support member side. For convenience, such a structure or mechanism will be described as being on the support member side.

In the electrostatic adsorption module according to the first aspect of the invention, preferably the support member is able to displace the tip member in the near and far direction with respect to the adsorption surface, and the displacement is elastic displacement. Specifically, elastic resistance force works against displacement of the tip member in the direction away from the adsorption surface. By allowing the support member to elastically displace the tip member, the electrostatic adsorption surface of the tip member easily adapts to the surface form of the object to be adsorbed, and also contributes to maintaining the adapted state.

The means for allowing such elastic displacement of the support member may be 1) a construction with a combination of a member that can be displaced in the near and far direction with respect to the adsorption surface, such as a double cylindrical member, and an elastic member such as a spring, or 2) a construction wherein the elastic member itself is the member that can be displaced in the near and far direction with respect to the adsorption surface, such as an elastic beam, or 3) any other means. According to a preferred aspect, therefore, the support member comprises an elastic member that can elastically displace the tip member in the near and far direction with respect to the adsorption surface (or support substrate).

Greater flexibility of elastic displacement of the support member (also referred to as "compliance", and represented as the reciprocal of rigidity or the inverse of the spring coefficient) may be considered to be more excellent adaptability for changes in surface form of the object to be adsorbed, and more effective adsorptive power. If the flexibility of the support member is too great, however, the force for adsorbing and holding the object to be adsorbed will be reduced, and therefore excessive flexibility is undesirable.

The suitable degree of flexibility of the support member will differ depending on the type, size and shape of the object to be adsorbed and the performance, form, dimensions and weight of the electrostatic adsorption module or electrostatic adsorption device (described below), and it may therefore be selected as appropriate for the electrostatic adsorption module, device and object to be adsorbed.

The length of the support member or the distance from the support substrate to the tip member may be enough to allow the support member to displace the tip member by the predetermined distance in the near and far direction with respect to the adsorption surface. The length of the support member and the distance (shortest distance) from the support substrate to the tip member do not necessarily need to match, as they will depend on the angle in which the support member extends from the support substrate. The distance of the tip member in the near and far direction with respect to the adsorption surface is the degree of displacement when the tip member (electrostatic adsorption surface) adapts to change in the surface form of the object to be adsorbed, and it depends on the surface form of the object to be adsorbed and on the dimensions and rotational angle of the tip member or electrostatic adsorption surface. The degree of displacement may be 10 to 1000 μm, 1 to 10 mm or 10 to 100 mm, for example.

The support member or its components may be fabricated by a common mechanical production method or using a 3D printer.

(Joint)

The electrostatic adsorption module according to the first aspect of the invention is provided with a freely rotatable joint between each tip member and the support member supporting the tip member. The joint may be provided separate from the tip member and support member, or as a part of the tip member or support member. The first aspect of the invention specifies that the tip member and support member are coupled via a freely rotatable joint, and when the tip member consists only of a sheet-like or laminar electrostatic adsorption member, this means that the support member supporting the tip member includes the joint, the joint being at the tip on the tip member side of the support member, or a middle part. When the joint is at a middle part of the support member, the tip member side of the support member with respect to the joint may be considered to be part of the tip member according to the first aspect.

A freely rotatable joint is one in which the tip member supported by the support member, and especially its electrostatic adsorption surface, is freely rotatable around the two-dimensional rotation axis or three-dimensional rotation midpoint of the joint. For the electrostatic adsorption module according to the first aspect of the invention, this may be rotatable within at least one imaginary plane, or rotatable in two dimensions. In other words, according to the first aspect of the invention, "freely rotatable" means the ability to rotate within an imaginary plane around and including at least the axis which is the shaft center of the joint. According to a preferred aspect of the first aspect of the invention, however, the joint may be rotatable in three dimensions, this being preferred since rotation in three dimensions allows adaptation to the surface shapes of objects to be adsorbed that are complex in three dimensions.

According to the first aspect of the invention, the freely rotatable nature of the joint does not need to be the ability to rotate 360°, as it is sufficient if the electrostatic adsorption surface is rotatable within a predetermined angle range necessary to adapt to change in the surface shape of the object to be adsorbed. For example, the angle may be 1800 or smaller, 1600 or smaller, 1200 or smaller, 900 or smaller or 600 or smaller.

In the electrostatic adsorption module according to the first aspect of the invention, the location of the joint is at the opposite side from the electrostatic adsorption surface of the tip member (the support member side), but it is preferably as close as possible to the electrostatic adsorption surface since this will reduce displacement of the electrostatic adsorption surface in the near and far direction with respect to the adsorption surface (usually the perpendicular direction) and in the direction perpendicular to the near and far direction (usually the horizontal direction), as it rotates. For example, representing the maximum dimension of the electrostatic adsorption surface of the tip member as L and the height of the rotation axis or center of rotation of the joint in the direction away from the electrostatic adsorption surface (usually the perpendicular direction) as H, the relationship $H \leq (3/2)L$ or $H \leq L$, and $H \leq L/2$ or $H \leq L/3$, is preferred, although this is not limitative. In addition, the interior angle $\alpha$ formed between lines connecting the rotation axis or center of rotation of the joint and both ends of the maximum dimension of the electrostatic adsorption surface may be defined, the angle $\alpha$ being preferably 600 or greater, 900 or greater or 1200 or greater. A large electrostatic adsorption surface will generally make it easier to reduce H/L, allowing the upper limit to be further lowered in the aforementioned range.

Preferably, while the tip member is provided in a laminar or sheet-like form, the joint is situated in direct contact with the opposite side from the adsorption surface side of the tip member.

That the joint is freely rotatable preferably means that it can freely rotate without resistance, but even with some degree of resistance, it is sufficient if the electrostatic adsorption surface can satisfactorily adapt to changes in the shape of the surface of the object to be adsorbed. In other words, it is sufficient if the electrostatic adsorption surface can satisfactorily adapt to any changes in the shape of the surface of the object to be adsorbed when the electrostatic adsorption surface has moved or been pressed with light force against the surface of the object to be adsorbed.

Two-dimensional and three-dimensional freely rotatable mechanisms (joints) are well known, and any publicly known freely rotatable mechanism may be used. An example of a joint with rotational freedom 1 is a rotating shaft/bearing structure or ball bearing, and example of a three-dimensional freely rotatable joint is a ball joint. A flexible string material, fabric or combination thereof may also be used as the joint. Two or more joints may also be used, although this constitutes a more specialized structure. According to the invention, the freely rotatable joint is preferably small, and it is preferred to use a 3D printer method for production of small joints.

(Support Substrate)

The support member that supports a tip member having an electrostatic adsorption surface extends from the support substrate, and it may be integral with the support substrate or affixed to the support substrate by some method.

The support substrate may be a laminar material, or it may have a structure or mechanism with multiple support members in linkage. It may also be a robotic arm tip, if possible. The support substrate may also be itself deformable, as described below for the second aspect.

For example, when the support member is constructed of a double cylindrical member and an elastic member, the cylindrical member of the support member may be affixed to the support substrate using appropriate fixing means. The cylindrical member may also be formed integrally with the support substrate. When the support member is constructed from an elastic member (elastic beam) that is elastically deformable in the near and far direction with respect to the object to be adsorbed, the elastic member and support substrate may be integral, with part of the support substrate extending from the support substrate to form the elastic member (elastic beam).

According to a preferred aspect of the electrostatic adsorption module of the first aspect of the invention, multiple sets of a tip member and a support member supporting the tip member may be fixed to a single support substrate, and in particular, multiple tip members may be arranged to form a large electrostatic adsorption surface (electrostatic adsorption surface aggregate). The method of arranging the multiple tip members may be as desired, and for example, rectangular or square tip members may be arranged in rows to form a large rectangular or square shape overall, or arc-shaped tip members may be arranged around a concentric point to form an overall circular shape.

By using multiple sets of a tip member and a support member, 1) a larger area can be covered, and 2) the multiple effects of rotational freedom stabilize the mechanical state (orientation and stress state) of the adsorbed sheet. Moreover, even when multiple sets of a tip member and a support member are used, a high degree of adsorptive power is still maintained around a single tip member (the absolute value of adsorptive power increases by the area increase). All of the multiple sets of a tip member and a support member may be densely arranged, or spaces or distance may be provided between sets. If the adsorptive power is sufficient, spaces or distance may be provided to 1) cover a larger area and 2) stabilize the mechanical state (orientation and stress state) of the adsorbed sheet, with fewer groups of tip members and support members.

A large adsorption surface formed by the entirety of the multiple tip members supported by a support substrate is preferably flat from the viewpoint of adsorptive power. However, the large adsorption surface formed by the entirety of the tip members may be curved depending on the object. A curved adsorption surface may be achieved by how the tip members are mounted on the support substrate, or the surface form of the support substrate on which the support members are affixed may be curved to form a curved adsorption surface.

The support members affixed to a single support substrate, and thus the shapes, number and arrangement of the tip members, may be as desired and determined in consideration of the dimensions, shape and weight of the object to be adsorbed to be gripped. However, the individual tip members are preferably arranged so that a large electrostatic adsorption surface is formed by the arrangement of the tip members, for example, in rows.

For example, it may be a composite adsorption surface (about 4.5 cm×about 5.5 cm) with electrostatic adsorption module units, each with square or rectangular adsorption surfaces having approximately 1 cm sides in a 4×5 matrix at 1 mm spacings, or a composite adsorption surface (about 22.5 cm×about 25 cm) with electrostatic adsorption module units, each with square or rectangular adsorption surfaces having approximately 5 cm sides in a 4×5 matrix at 5 mm spacings.

The spacing between the tip members supported on the support substrate may be a sufficient size so as to avoid interference with adjacent tip members when the individual tip members are rotated to adapt to the surface form of an object to be adsorbed, while preferably being as small a size as possible.

[Electrostatic Adsorption Device]

According to the second aspect, the present invention provides an electrostatic adsorption device comprising:

a support substrate, multiple tip members each having a bipolar electrostatic adsorption surface, and multiple support members extending from the support substrate and supporting the multiple tip members, wherein the multiple support members are able to elastically displace the multiple tip members in the near and far direction with respect to the support substrate, and the support substrate itself is deformable.

In this electrostatic adsorption device, the electrostatic adsorption module is constructed of a tip member having a bipolar electrostatic adsorption surface, and a support member, but the electrostatic adsorption module according to the second aspect of the invention may also be an electrostatic adsorption module according to the first aspect of the invention, though this is not limitative, and may also be the electrostatic adsorption module with the fine piliform structure described in Japanese Patent Publication No. 6,846,821, so long as the tip members with bipolar adsorption surfaces are elastically displaceable in at least the near and far direction with respect to the object to be adsorbed so as to provide an electrostatic adsorption surface that can adapt to the surface forms of objects to be adsorbed.

For an electrostatic adsorption module having an electrostatic adsorption surface that can adapt to the surface forms of objects to be adsorbed by tip members having bipolar electrostatic adsorption surfaces that are able to be elastically displaced in the near and far direction with respect to the object to be adsorbed (referred to as "shape-adaptable electrostatic adsorption module" according to the second aspect), it becomes necessary to change the electrostatic adsorption force depending on the state of contact with the surface of the object to be adsorbed, such that the electrostatic adsorption surfaces of the tip members must be made smaller and the amount of elastic displacement of the tips must necessarily be reduced. In order to grip, convey and detach a relatively large object to be adsorbed with a shape-adaptable electrostatic adsorption module, therefore, it is necessary to greatly increase the number of shape-adaptable electrostatic adsorption modules or the number of tip sections, but the present inventors have found that merely increasing greatly the number of shape-adaptable electrostatic adsorption modules or the number of tip sections usually makes it impossible to adapt to surface forms (large shape deformation) of objects to be adsorbed by small displacement of the shape-adaptable electrostatic adsorption module.

The present inventors found that if the small displacement of a shape-adaptable electrostatic adsorption module is compensated for by making a support substrate that supports shape-adaptable electrostatic adsorption modules to be a deformable support substrate, or by charging the support substrate which is itself deformable and also preferably suitable for production to large dimensions a role of form adaptability (of the support substrate as a whole) to large changes in surface form of the object to be adsorbed, then it becomes possible to allow adaptation to both large shape deformation and small shape deformation of surface forms of objects to be adsorbed without losing adsorptive power (adsorptive power is improved), and the present inventors have thus completed the second aspect of the invention.

(Tip Member and Support Member)

In the electrostatic adsorption device of the second aspect, as mentioned above, it is sufficient if the multiple tip members and multiple support members are such that the tip members having a bipolar electrostatic adsorption surface can be elastically displaced in at least the near and far direction with respect to the support substrate, and according to a preferred aspect, they may be multiple tip members and multiple support members forming, for example:

i) an electrostatic adsorption module according to the first aspect, i.e. an electrostatic adsorption module provided with multiple tip members, multiple support members supporting the multiple tip members and a support substrate fixing the multiple support members on the opposite end from the tip members, wherein the tip members can be elastically displaced in the near and far direction with respect to the support substrate, and the tip members and support members are each coupled via a freely rotatable joint, or ii) an electrostatic adsorption module with a fine piliform structure as described in Japanese Patent Publication No. 6,846,821, i.e. an electrostatic adsorption module wherein the tip members and support members have a fine piliform structure, the fine piliform structure having an insulating layer between a positive electrode layer and negative electrode layer to form a bipolar electrostatic adsorption surface at the tip of the fine piliform structure, or iii) another structure.

The electrostatic adsorption module of i) above was explained in relation to the first aspect.

Referring to Japanese Patent Publication No. 6,846,821, in the electrostatic adsorption module of ii), the fine piliform structure which has a bipolar electrostatic adsorption surface is characterized by a structure with an insulating layer between a positive electrode layer and a negative electrode layer.

For the electrostatic adsorption module of ii), as explained in greater detail below with reference to FIG. 10, the fine piliform structure in the electrostatic adsorption module is formed on the adsorption surfaces of tip sections of electric conductor beams (beam aggregates), and preferably formed of elastic beam aggregates with tip areas of about 5 μm×10 μm to 100 μm×100 μm, lengths of about 5 mm to 300 mm, spacings of 5 μm to 100 μm and mounting angles of about 30° to 60°, although this is not limitative and the shapes and dimensions may be selected according to the type of object to be adsorbed. There is no particular restriction on the number of elastic beams, but it is preferably selected to be about 20 to 200, for example. The fine piliform structure is preferably spatula-shaped at the tips.

Since the electrostatic adsorption module has a fine piliform structure, it is delicate with a surface that does not produce stress on thin soft materials, while exhibiting sufficient gripping force and having an easy detachment mechanism. In other words, since the beam tips adsorb (pseudo-adhere onto) a gripped object, gripping force is generated in the direction perpendicular to the adsorption surface, and then rotation with respect to adsorption surface to apply force in a momentum-imparting direction generates a stress distribution on the adsorption surface, resulting in detachment of the gripped object from the section where a high stress state is produced.

(Deformable Support Substrate)

In the electrostatic adsorption device of the second aspect of the invention, the support substrate is a deformable support substrate. The deformable support substrate may comprise multiple laminar bodies supporting multiple tip members and multiple support members, wherein displacement of the multiple laminar bodies causes deformation of the support substrate as a whole. For this purpose, the design may be 1) bonding of the multiple laminar bodies in a mutually displaceable manner to allow deformation of the multiple laminar bodies as a whole, or 2) bonding of the multiple laminar bodies to deformable sections of a mechanism which is itself deformable, to allow deformation of the multiple laminar bodies as a whole.

The deformable support substrate may be, for example:

1) a support substrate that comprises multiple laminar bodies aligned in parallel and connects the laminar bodies together in an elastically refractable manner by linking means such as a rotation spring, 2) a support substrate that is a combination of multiple laminar bodies with a mechanism that is itself deformable and that allows deformation between flat and curved surfaces or between curved and flat surfaces, with the laminar bodies extending from the deformed part of the deformable mechanism.

In such cases each laminar body (plate) is itself a support substrate, but according to the second aspect the entire combination of the multiple laminar bodies and the means which allows deformation of the multiple laminar bodies as a whole constitutes the support substrate. The deformable support substrate may be operated by a robotic hand, for example, but the deformable support substrate itself is a passive component or passive mechanism (apparatus).

The deformable support substrate of the electrostatic adsorption device of the invention is preferably operated by a robotic arm.

The electrostatic adsorption device of the second aspect of the invention may include multiple tip members forming the device and multiple laminar bodies (plates) supporting the multiple support members, wherein displacement or deformation of the multiple laminar bodies by some means allows deformation of the entire support substrate including the multiple laminar bodies. The electrostatic adsorption device of the second aspect is useful because deformation of the entire support substrate can compensate for the amount of elastic displacement of the tip members based on the support substrate. The size of deformation (maximum displacement) of the entire substrate in the direction away from the object to be adsorbed is preferably greater than the size of maximum elastic displacement of the tip members based on the support substrate. In this sense, deformation of a large support substrate is easier with the electrostatic adsorption device of the second aspect of the invention. The side of the support substrate (virtual side) that supports the multiple support members is preferably flat as the initial value for deformation of the support substrate, but it may also be a shape other than flat.

According to one preferred aspect, the support substrate comprises multiple laminar bodies supporting multiple tip members and multiple support members, for example, the multiple laminar bodies being aligned in parallel to form a larger adsorption surface, such as a large sheet-like adsorption surface, and if the multiple laminar bodies are connected together in an elastically refractable manner using rotation springs, for example, then typically gripping both ends of each linked laminar body to narrow the distance between both ends can distort the connected laminar bodies as a whole, deforming their cross-sections from a straight line into an arc-shape. Conversely, deformation of the cross-section from an arc-shape to a straight line is also possible.

The locations where the connected laminar bodies are gripped may also be three or more locations instead of two.

When the refraction deformation of the connected laminar bodies is elastic deformation, such as when adjacent laminar bodies are connected with rotation springs, the linked laminar body rows are flat in the absence of force applied to the linked laminar body rows, but a robotic arm bonded to both ends of the linked laminar body rows can be used to deform the linked laminar body rows into a cross-sectional arc-shape so as to press against a curved surface, or to return the linked laminar body rows to the flat state.

According to a preferred aspect, the support substrate may be a combination of multiple laminar bodies supporting multiple tip members and multiple support members, with a mechanism that is itself deformable (shape-adapting). The multiple laminar bodies may form part of the mechanism that is itself deformable (shape-adapting) (at the deformable (shape-adapting) section), or they may be coupled with the deformable (shape-adapting) section of the mechanism that is itself deformable (shape-adapting). One example of a mechanism that is itself deformable (shape-adapting) is a pair of scissor members (a scissor mechanism) comprising a first scissor member having a first arm and second arm of the same length, extending to both sides of an inflection point at a predetermined angle, and a second scissor member having mirror symmetry with the first scissor member, linked in a mutually rotatable manner at the inflection point, wherein a plurality of such scissor mechanisms are aligned in rows to form a linked scissor mechanism where adjacent scissor members are connected in the rotatable manner at the ends of the arms of each scissor member, preferably with both ends of the linked scissor mechanism coupled with a robotic arm (or gripped with the hand of the robotic arm). For example, the coupled scissor mechanisms may form a circular arc or elliptical arc, with the distance between both ends widening or narrowing with the robotic arm, thus allowing the curvature radius of the circular arc or elliptical arc to be varied. If laminar bodies are formed on or coupled with all or some of the scissor mechanisms, then the multiple laminar bodies (support substrates) are relatively displaceable (deformable as a whole) by the coupled scissor mechanisms. The coupled scissor mechanisms may be aligned in two or more parallel rows with each of the scissor mechanisms gripping common laminar bodies.

In this electrostatic adsorption device, the means for operating the deformable support substrate is preferably a robotic arm. The robotic arm is connected in a rigidly deformable manner to both ends of the deformable support substrate, such as the multiple linked laminar bodies, or both ends of the multiple linked scissor mechanisms are gripped by the hand of the robotic arm, so that operation of the robotic arm allows the deformable support substrate or multiple laminar bodies as a whole to be deformed into the desired shape. The robotic arm itself may be any publicly known one.

When a robotic arm is used, connection between the support substrate and robotic arm may be a freely rotatable rigid joint, or it may be a grippable hand attached to the tip of the robotic arm.

As mentioned above, there is demand for working robots that attach organic EL panels (flexible sheets) to curved surfaces, or that attach protective resin sheets (flexible sheets) to curved glass, especially as relates to large-sized products, and therefore the electrostatic adsorption device of the second aspect is highly useful for such purposes.

(Example of Preferred Embodiment for Second Aspect)

As a preferred embodiment for the second aspect of the invention, there is provided an electrostatic adsorption device comprising:

a support substrate, multiple tip members each having a bipolar electrostatic adsorption surface, and multiple support members extending from the support substrate and supporting the multiple tip members, wherein the multiple support members are able to elastically displace the multiple tip members in the near and far direction with respect to the support substrate, and the multiple support members and tip members are coupled via freely rotatable joints while the support substrate as a whole is deformable.

To better exhibit the effect of the deformable support substrate, the support substrate preferably has multiple laminar bodies, each of the multiple laminar bodies holding multiple tip members and support members.

According to this preferred embodiment, preferably the support substrate comprises multiple laminar bodies and is a deformable support substrate wherein the multiple laminar bodies are connected together in an elastically refractable manner.

The tip members, support members (including the structure which elastically displaces the tip members) and the joints according to this preferred embodiment were explained in regard to the first aspect while the deformable support substrate was explained in regard to the second aspect. Those descriptions will now be referred to.

The electrostatic adsorption device according to this preferred embodiment further includes a support substrate in addition to the multiple tip members and multiple support members, the support substrate being deformable as a whole, with deformation accompanied by displacement that is preferably greater than the elastic displacement of the tip members. The entire support substrate is preferably operated by a robotic arm. Deformation of the support substrate as a whole may therefore be deformation close to the shape of the macroscopic surface form of the object to be adsorbed, resulting in an effect allowing adaptation to the surface form of the object to be adsorbed and changes in it, even with small elastic displacement of the tip members themselves in the electrostatic adsorption module supported on the support substrate.

Furthermore, when the electrostatic adsorption module itself composed of the tip members and support members according to this preferred embodiment comprise freely rotatable joints on the opposite side from the electrostatic adsorption surfaces of the tip members, which allows the electrostatic adsorption surfaces of the tip members to satisfactorily adapt to the surface form of the object to be adsorbed while also having high adsorptive power, this combined with the ability of the deformable support substrate to adapt to large-sized products makes it especially suitable as an electrostatic adsorption device for objects that have large flexibility or curved surfaces.

[Embodiments]

The electrostatic adsorption module and electrostatic adsorption device of the invention will now be described in greater detail with reference to the attached drawings.

FIGS. 1a to 1f (hereunder also collectively referred to as FIG. 1, the same for other Figures with branch numbers) are perspective views schematically showing an example of an electrostatic adsorption module of the invention. FIG. 1(a shows an electrostatic adsorption module 1-1 having a joint with rotational freedom 3, FIG. 1b shows an electrostatic adsorption module 1-2 having a rotatable joint 4 with rotational freedom 1, FIG. 1c shows an electrostatic adsorption module 1-3 having a joint with rotational freedom 2, and FIG. 1d shows an electrostatic adsorption module 1-4 using an elastic hinge as a freely rotatable joint.

The electrostatic adsorption module 1 of FIG. 1a comprises a tip member 2 having an electrostatic adsorption surface 2s, a support member 3 that supports the tip member 2, and a joint 4a between the tip member 2 and support member 3. The joint 4 for this example is a ball joint 4a on the opposite side from the electrostatic adsorption surface of the tip member 2, and it has rotational freedom 3 (three-dimensional rotatability). The ball joint 4a of this example is composed of a frame body 4-2 that holds a sphere 4-1 in a slidable manner and coupled with the support 3. The sphere 4-1 and frame body 4-2 may be molded with a 3D printer. After the frame body 4-2 has gripped the sphere 4-1 on the lower receiving surface, a top that covers the sphere 4-1 may be molded or fitted over it. The structure of the joint or ball joint for rotational freedom 3 is not limited to the mode shown in FIG. 1a and examples thereof are publicly known. The upper part of the support member 3 is either integral with the support substrate 5 or coupled with the support substrate.

The electrostatic adsorption module 1-2 of FIG. 1b comprises a tip member 2 having an electrostatic adsorption surface 2s, a support member 3 that supports the tip member 2, and a joint 4b between the tip member 2 and support member 3. The joint 4b for this example is a ball bearing on the opposite side from the electrostatic adsorption surface of the tip member 2, and it is freely rotatable with rotational freedom 1 around an axis 4-5. The joint 4b with rotational freedom 1 is constructed by passing the axis 4-5 running through a hole formed at the tip of the support 3, through a hole inside a ball bearing 4-4 held in a frame body 4-3. The structure of the joint or ball bearing for rotational freedom 1 is not limited to the mode shown in FIG. 1b and examples thereof are publicly known. The upper part of the support member 3 is either integral with the support substrate 5 or coupled with the support substrate.

The electrostatic adsorption module 1-3 of FIG. 1c comprises a tip member 2 having an electrostatic adsorption surface 2s, a support member 3 that supports the tip member 2, and a joint 4c between the tip member 2 and support member 3. The joint 4c for this example is on the opposite side from the electrostatic adsorption surface of the tip member 2, and it is freely rotatable around two perpendicular axes 4-4, 4-7, with rotational freedom 2. The first joint 4c-1 in FIG. 1c, constructed of the frame body 4-3, the ball bearing 4-4 and the axis 4-5, may also be the same as the joint 4b shown in FIG. 1b, with rotational freedom 1 around the axis 4-5. The joint 4c-2 at the lower end of the joint 4c-1 is constructed of a bearing frame body 4-6 and a shaft part 4-7 formed integrally with the frame body 4-5 of the joint 4c-1, with rotational freedom 1 around the shaft part 4-7. The axis 4-5 and shaft part 4-7 are at a perpendicular angle, and the joint 4c has rotational freedom 2. The bearing frame body 4-6 may be a simple rotation structure or may also have a ball bearing (not shown). The structure of the joint with rotational freedom 2 may have a simple rotation structure, a complex structure or a combination, of a type that can be produced by a person skilled in the art.

The electrostatic adsorption module 1-4 of FIG. 1d comprises a tip member 2 having an electrostatic adsorption surface 2s, a support member 3 that supports the tip member 2, and a joint 4d between the tip member 2 and support member 3. For this example, the joint 4d is an elastic hinge type, having a rotating spring part with wires wrapped several times around, wherein one wire is coupled with the tip member 2 and another wire may be the support member 3 itself. An elastic hinge type is a joint with rotational freedom 1.

FIG. 1e shows an example of an electrostatic adsorption surface 2s on the opposite side from the support member 3 of the tip member 2 of FIGS. 1a to 1d. The electrostatic adsorption surface 2s has a positive electrode 2-1, a negative electrode 2-2, an insulation region 2-3 between the positive electrode 2-1 and negative electrode 2-2, and a surrounding insulation region 2-4 around the electrostatic adsorption surface 2. The positive electrode 2-1 and negative electrode 2-2 are both rectangular and of the same size. For example, the positive electrode 2-1 and negative electrode 2-2 may be 5 mm×10 mm or 4 mm×10 mm, the width of the insulation region 2-3 may be 0.8 mm, the width of the surrounding insulation region 2-4 may be 1 mm, and the height (thickness) of the tip member 2 may be 0.8 mm. The electrode surface of the electrostatic adsorption surface 2s of the tip member 2 and the surface on the opposite side may be covered with insulating layers.

Figure 1F:
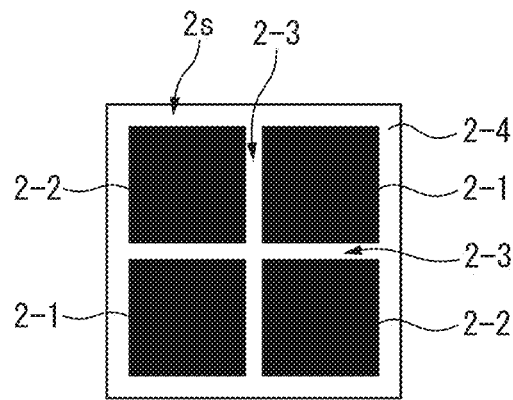

FIG. 1f shows a modified example of FIG. 1e. In this modified example there are two each of the positive electrode 2-1 and negative electrode 2-2, arranged with one alternately on the top and bottom and the left and right, for a total of four electrodes. All are square and of the same size. For example, the positive electrode 2-1 and negative electrode 2-2 may be 4 mm×5 mm or 5 mm×5 mm, the width of the insulation region 2-3 may be 0.8 mm, and the width of the surrounding insulation region 2-4 may be 1 mm. The electrodes may also be rectangular.

Figure 2A:
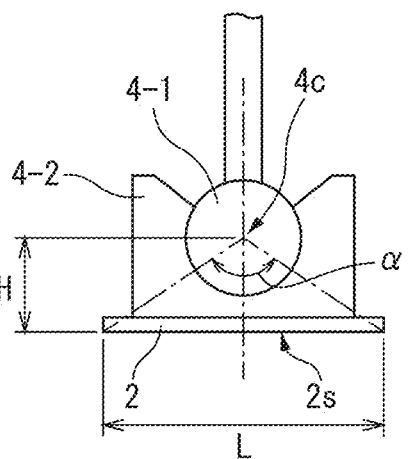
FIGS. 2a and 2b are diagrams illustrating the location of a joint in an electrostatic adsorption module of the invention.
Figure 2B:
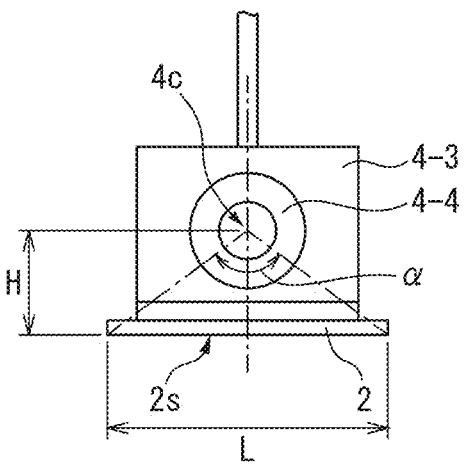

FIG. 2 schematically shows the relationship between the tip member 2 and the joint 4 shown in FIG. 1, FIG. 2a being a schematic cross-sectional view at the center of the ball for a ball joint 4a, and FIG. 2b being a side view for a ball bearing 4b, as a view in the direction of the rotation axis of the ball bearing. Shown are the dimension L of the tip member 2, the height H from the electrostatic adsorption surface 2s at the rotational center or shaft center of the joint 4 (both hereunder also referred to simply as "rotational center") 4c, and the angle α of lines connecting the rotational center or shaft center 4c of the joint 4 and both ends of the electrostatic adsorption surface 2s. These are in the relationship H≤(3/2)L, H≤L, H≤L/2 or H≤L/3, for example. The interior angle α is preferably 600 or greater, 90° or greater or 120° or greater. For the joint with rotational freedom 2 shown in FIG. 1c, preferably both shaft centers of the two rotating shafts are within the range specified above, and preferably at least the shaft center of the rotating shaft near the tip member is within that range.

FIGS. 3a to 3d show examples of several support members 3 for the electrostatic adsorption module shown in FIG. 1. In these drawings, a ball bearing 4b with rotational freedom 1 is assumed for the electrostatic adsorption module, although the joint 4 may be a three-dimensional freely rotatable joint 4a instead.

Figure 3A:
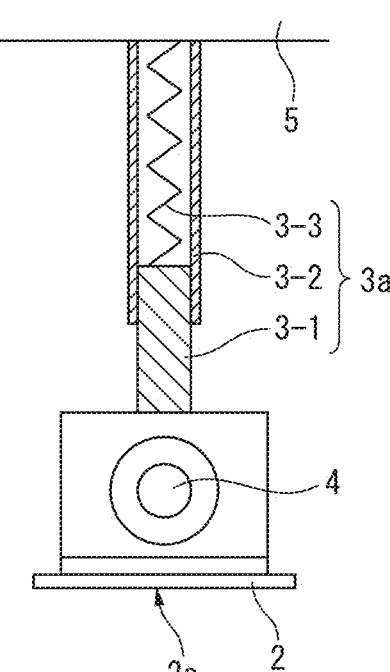
FIGS. 3a to 3d are diagrams schematically showing an example of the support of a joint in an electrostatic adsorption module of the invention.

In FIG. 3a, one end of support member 3a is fixed to the support substrate 5 while the other end is coupled with the shaft of the joint 4, but in order for the tip member 2 and joint 4 to be displaceable in the near and far direction with respect to the object to be adsorbed (the vertical direction in this drawing), the support member 3a has a double tube structure consisting of double cylinders 3-1, 3-2. A compression spring 3-3 is also provided inside the double cylinders 3-1, 3-2, in a manner so that elasticity of the tip member 2 acts in the near and far direction with respect to the object to be adsorbed, and especially so that elasticity of the compression spring acts in the stretching direction in response to contraction of the length of the support member. Thus, when the surface of the object to be adsorbed has rising/falling inclinations, for example, the tip member 2 rotates around the rotation axis center of the joint 4, while contraction of the double tube structure of the support member 3a causes the entire length of the support member 3a to be shortened resulting in vertical movement of the tip member 2, which allows the adsorption surface 2s of the tip member 2 to flexibly adapt to rising/falling inclinations on the surface of the object to be adsorbed. Since the double tube structure of the support member 3a is elastic, the tip member 2 is acted to press against the adsorption surface.

Figure 3B:
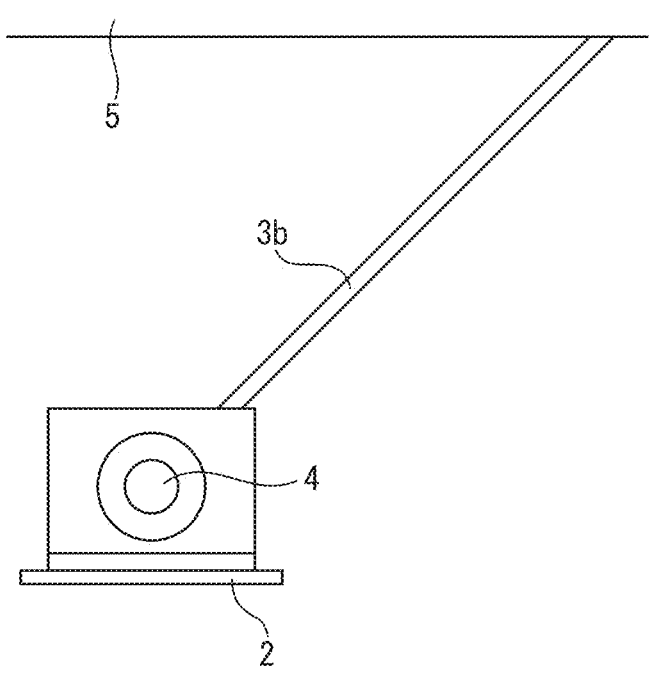

In FIG. 3b, the support member 3b is made of an elastic beam, constructed of a thin stainless steel sheet, for example, and having elasticity by a leaf spring which is anchored at an angle of 30° to 60°, and especially 45°, with respect to the support substrate 5. Thus, when the surface of the object to be adsorbed has rising/falling inclinations, for example, the tip member 2 must rotate around the shaft center of the joint 4 while the tip member 2 moves vertically, but since the support member 3b is elastic the elastic deformation is vertical (curved), which allows the adsorption surface 2s of the tip member 2 to flexibly adapt to rising/falling inclinations on the surface of the object to be adsorbed. In the support member 3b according to the aspect shown in FIG. 3b, when the tip member 2 moves upward, the support member 3b being an inclined beam, also moves to the left (top left) in the diagram as the tip member 2 moves upward, even if a flat surface is assumed for the object to be adsorbed. Therefore the tip member 2 cannot adapt to the surface of the object to be adsorbed unless it rotates with respect to the support member 3b which is an elastic beam. However, if the tip member 2 and the support member 3b consisting of an elastic beam are coupled via a freely rotatable joint 4, as shown in FIG. 3b, then the adsorption surface 2s of the tip member 2 can undergo both upward movement and rotational movement simultaneously, thus allowing adaptation with upward movement as well. Furthermore, since the elastic beam of the support member 3b is elastic, the tip member 2 is acted to press against the adsorption surface.

Figure 3C:
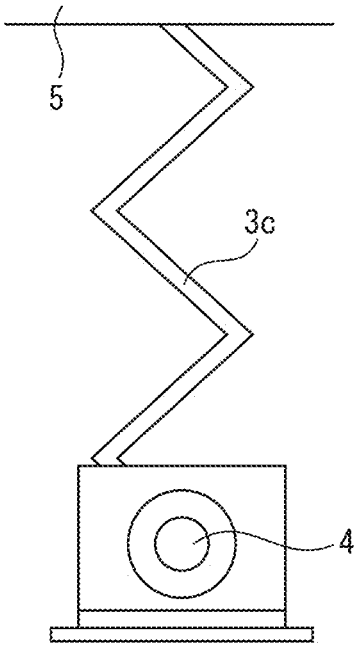

In FIG. 3c, the support member 3c is made of an elastic beam with multiple curves, constructed of a thin stainless steel sheet, for example, and having elasticity by a leaf spring which is anchored to the support substrate 5. The elastic beam of this structure can act elastically in the near and far direction with respect to the object to be adsorbed, similar to the straight linear elastic beam 3b of FIG. 2b, while the support 3 may be a shape extending in approximately the perpendicular direction without being inclined with respect to the surface of the object to be adsorbed. The dimensions and angle and frequency of refraction of the elastic beam may be selected as appropriate.

As an example that combines FIG. 3b and FIG. 3c, the support member 3 may be gripped from the support substrate 5 at an inclination angle as shown in FIG. 3b, but with the support member 3 itself being a rigid body without elasticity, and a rotation spring being provided at the joint position between the support member 3 and the support substrate 5, to allow elastic displacement of the support member 3 in the near and far direction with respect to the support substrate 5. The elastic hinge shown in FIG. 1d is such an example.

Figure 3D:
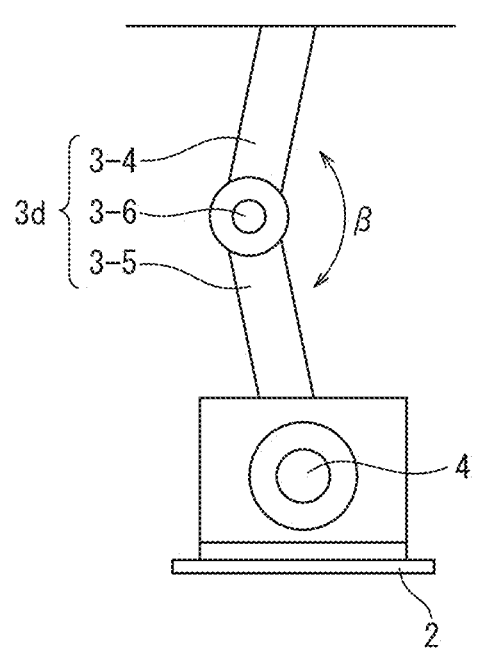

In FIG. 3d, the support member 3d has two tubular bodies 3-4, 3-5 coupled at an angle β at a bent section 3-6, the bent section 3-6 having elasticity which resists against a smaller angle β. For example, if a rotating spring extending in the direction of the two tubular bodies 3-4, 3-5 is enclosed with the bent section 3-6 as the center, then angle β between the tubular bodies 3-4, 3-5 can be reduced but with elastic resistance against the smaller angle β, with the result that the tip section 2 coupled with the support member 3*c* via the joint 4 will be able to move in the near and far direction with respect to the object to be adsorbed, though with elasticity against the mobility. The number of bent sections 3-6 in the support 3*d* does not need to be only one and may be more than one, in which case the direction of bending may be reversed so that the support 3 as a whole is extended essentially perpendicular with respect to the surface of the object to be adsorbed.

FIGS. 3*a* to 3*d* illustrate examples of a support member 3 for an electrostatic adsorption module 1 according to the first aspect of the invention, but the support member according to the first aspect of the invention is clearly not limited to these examples.

Figure 4:
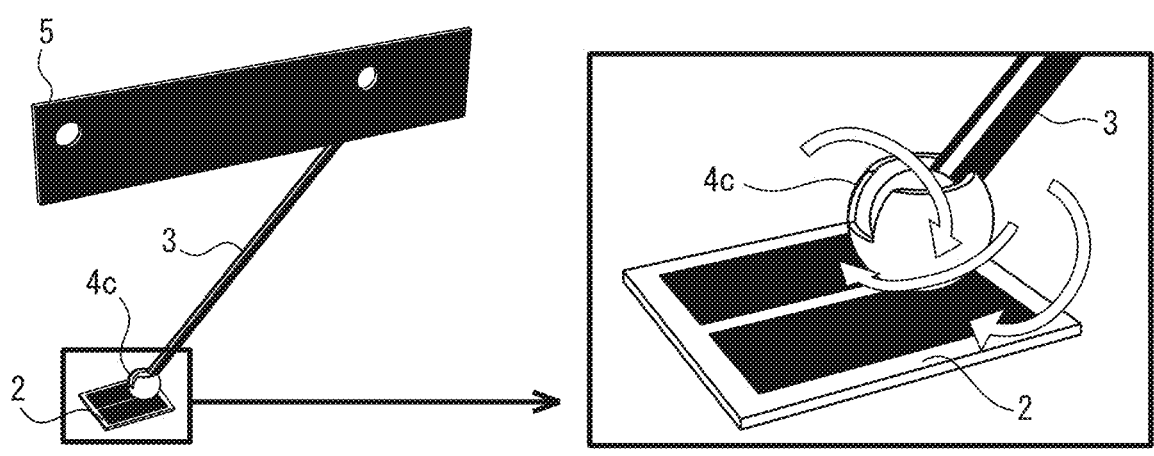
FIG. 4 is a diagram showing an example of a ball joint.

FIG. 4 shows another example of a ball joint. The ball joint 4*a* of FIG. 1*a* is composed of a frame body 4-2 that holds a sphere 4-1 in a slidable manner and coupled with the support 3, with a solid lubricant at the surface of the frame body 4-2 which receives the sphere 4-1. The ball joint 4 of FIG. 4 is a joint that couples the elastic beam 3 and tip member 2 together in a three-dimensional freely rotatable manner as shown in FIG. 3*b*, as an example of a joint in which the frame body holding the sphere coupled with the tip of the elastic beam has a multiple structure and the different layers are freely rotatable in different directions (such as two or three perpendicular directions), making it freely rotatable in three dimensions as a whole. Producing the ball joint 4*a* with a 3D printer is advantageous as it allows the support member with the ball to be inserted in the tip during production.

Figure 5A:
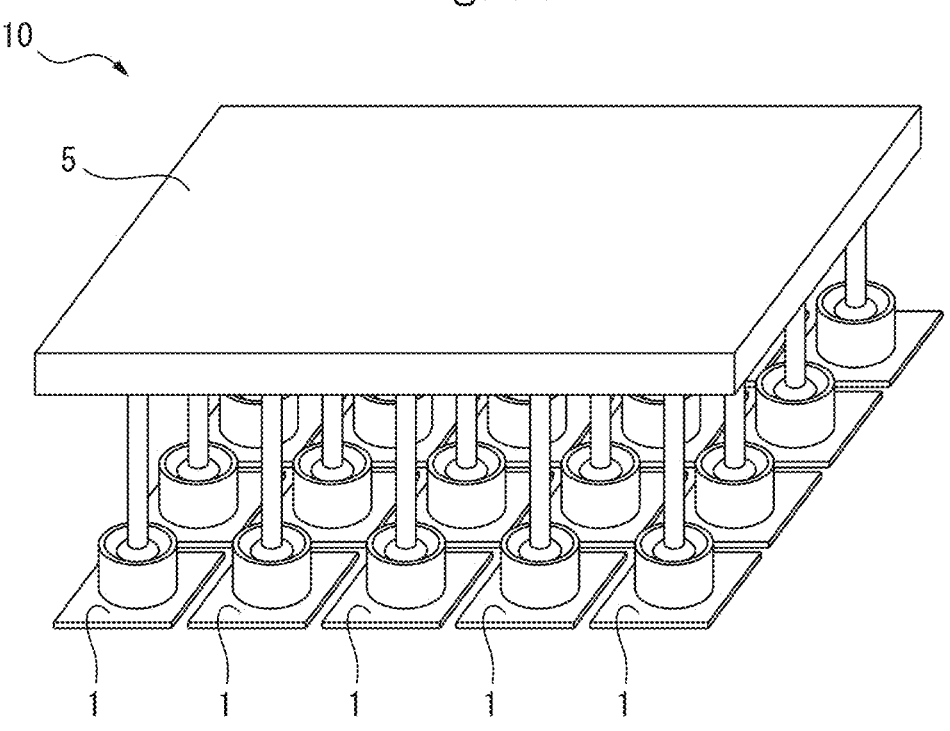
FIG. 5 is a diagram schematically showing an electrostatic adsorption module having multiple tip members mounted on a single support substrate.
Figure 5B:
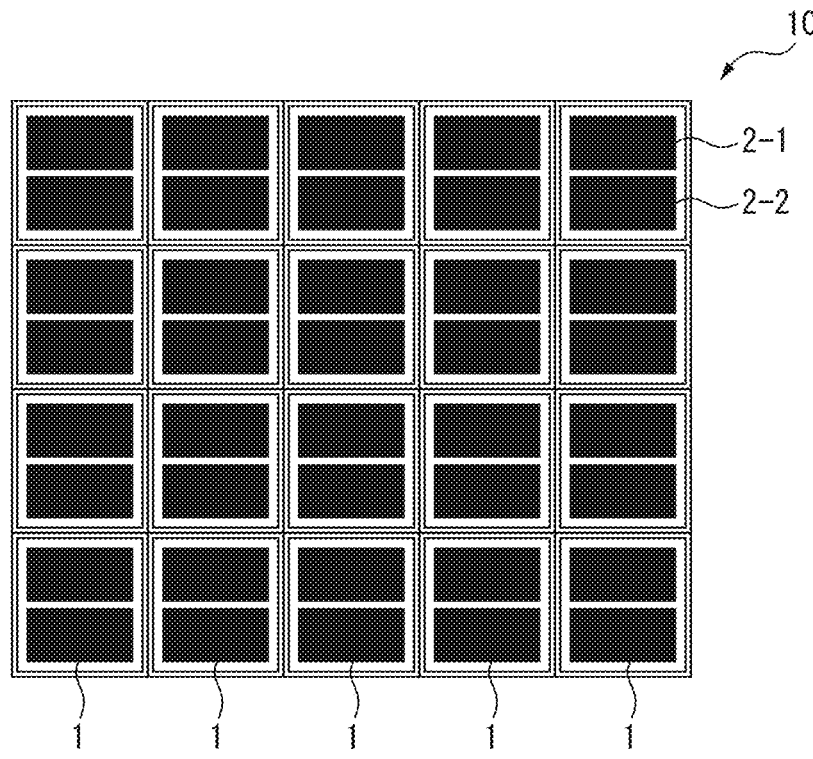

FIGS. 5*a* and 5*b* shows an example of an electrostatic adsorption module 10 according to a preferred aspect wherein multiple members which are each the electrostatic adsorption module 1 shown in FIG. 1*a* (hereunder referred to as "single electrostatic adsorption module") are mounted on a single support substrate 5. In the perspective view of FIG. 5*a*, each single electrostatic adsorption module 1 comprises a support member supporting the tip member via a freely rotatable joint, and is fixed to the support substrate 5 at the support side. For this example, the single electrostatic adsorption modules 1, each having a rectangular electrostatic adsorption surface, are arranged in 4×5 rows as shown by the schematic bottom view on the electrostatic adsorption surface side in FIG. 5*b*, to form a large rectangle as a whole. For an example with a unit electrostatic adsorption surface as shown in FIG. 1*c* (12 mm×12.8 mm), the unit electrostatic adsorption surfaces are arranged with (1 mm-width) gaps between them, and therefore the outer dimensions of the electrostatic adsorption module 10 are: (12 mm×5+4 mm)×(12.8 mm×4+3 mm)=63 mm×54.2 μm, so that taking the gaps into account, the effective area of the electrostatic adsorption surface of the unit module may be considered to be 13 mm×13.8 mm, while the effective area ratio of the electrodes is (10 mm×5 mm×2)/(13 mm×13.8 mm)=~55.7%.

An electrostatic adsorption module 10 having multiple pairs of tip members and support members on a single support substrate 5, as in FIG. 5*a*, is advantageous in that it can maintain high adsorptive power while the multiple tip members of the electrostatic adsorption module flexibly adapt to surfaces, even if the area of the object to be adsorbed or the substrate to be adsorbed is large or the surface is not flat, or if the object to be adsorbed is flexible, or even if the object to be adsorbed or adsorption substrate has a curved surface.

Nevertheless, the form of the support substrate and the type, number shape and arrangement of the multiple electrostatic adsorption modules 1 mounted on the single support substrate 5 are clearly not limited to the above description. Selection may be made as appropriate for adapting to the shape, dimensions and surface form of the object to be adsorbed.

Figure 6:
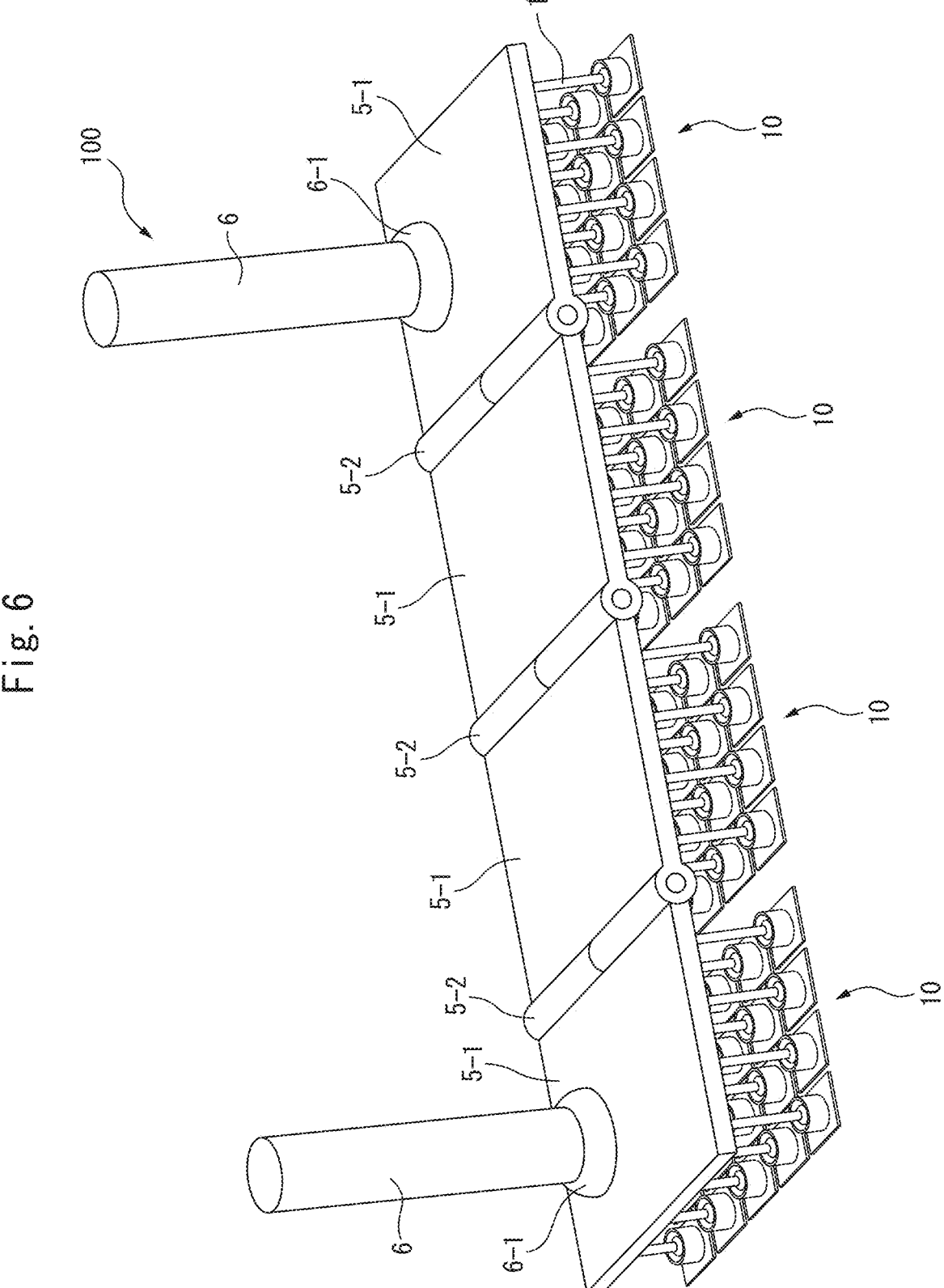
FIG. 6 is a diagram showing an example of an electrostatic adsorption device according to the second aspect of the invention (support substrate elastic refraction model).

An example of an electrostatic adsorption device 100 of the invention is shown in FIG. 6.

FIG. 6 shows an example of the electrostatic adsorption device 100 having multiple electrostatic adsorption modules 10 (each being the module of FIG. 5, for example), in turn having a plurality of electrostatic adsorption modules 1 mounted on a single laminar body 5-1 as a support substrate according to the first aspect, where the multiple laminar bodies 5-1 are connected in a mutually elastic bendable manner using a rotating spring 5-2, for example. In FIG. 6, robotic arms 6 are attached at both ends of the arranged multiple laminar bodies 5-1, each via a variable stiffness joint 6-1. Two robotic arms 6 are attached at either end in FIG. 6, but 3 or more may be attached instead to allow more complex shape deformation.

Since the rows of multiple laminar bodies 5-1 are mutually elastically bendable, using the robotic arms 6 to narrow the distance between both ends of the rows of laminar bodies 5-1 while rotating them can cause deformation of the rows of the multiple laminar bodies 5-1 from flat to an approximately curved surface (a circular cross-section shape, or more specifically a polygonal stepped cross-sectional shape), or conversely, from a curved surface to a flat surface, or from a curved surface to a different curved surface. Alternatively, the rows of laminar bodies 5-1 may be pressed against a curved surface to also deform the rows of laminar bodies 5-1 to match the curved surface. When the rows of laminar bodies 5-1 are deformed in this way, the electrostatic adsorption surface of the electrostatic adsorption module can minutely and flexibly adapt to an object to be adsorbed, thus allowing shape adaptation to either a curved surface form of an object to be adsorbed or large and small deformation of a flexible object to be adsorbed. With the electrostatic adsorption module according to the first aspect of the invention, the flexibility of the electrostatic adsorption surface may be not only in the direction of the rows of laminar bodies 5-1 but also in the direction transversing the rows. Deformation of the laminar bodies allows a different degree of deformation for each laminar body, which is advantageous for detachment of the object to be adsorbed. Using this method it is possible to almost exactly match the shape of the rows of laminar bodies 5-1 to the surface form of a cylindrical column, for example, so that it can be used as an electrostatic adsorption device for the operation of attaching a large-sized organic EL panel to the curved surface of such a cylindrical column.

Clearly if the electrostatic adsorption module 1 is freely rotatable in three dimensions it will be more able to adapt to three-dimensional (such as spherical) curvature of the surface of an object to be electrostatically adsorbed.

The electrostatic adsorption device 100 described above does not need to be a single one alone, as a combination of multiple pairs may be used to allow adaptation to larger and more complex adsorption surface forms.

Figure 7:
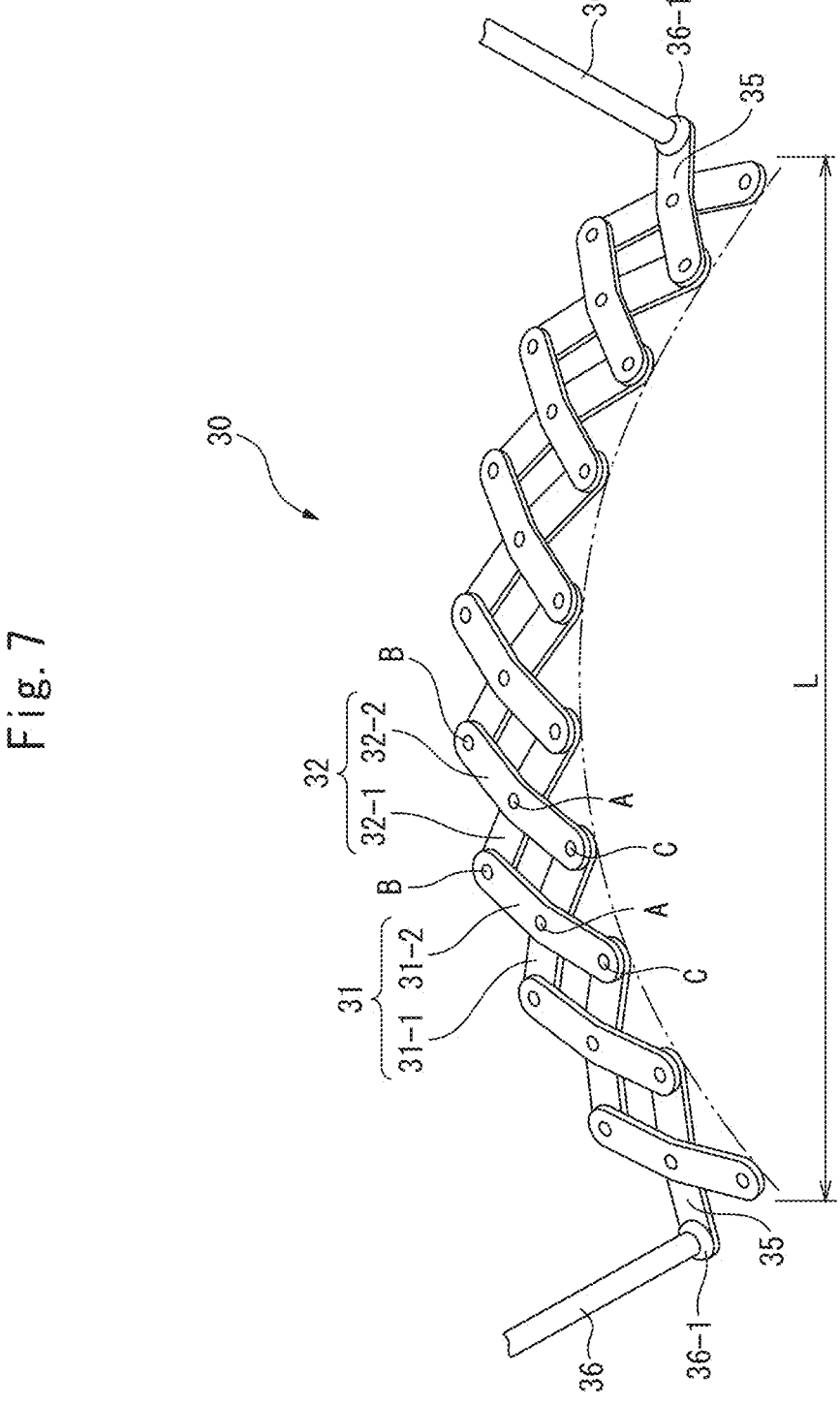
FIG. 7 is a diagram showing another example of a deformable support substrate in an electrostatic adsorption device of the invention.

FIG. 7 shows an example 30 of a mechanism which is itself deformable, combining laminar bodies on which multiple unit electrostatic adsorption modules are mounted, to allow larger deformation than just displacement of the unit electrostatic adsorption module.

In FIG. 7, the deformable mechanism 30 has multiple scissor mechanisms 31, 32 . . . all having the same structure and arranged and linked in series, and robotic arms 36 gripping each of the scissor mechanisms 35 at both ends from among the multiple scissor mechanisms 31, 32 . . . . The robotic arms 36 are coupled with the scissor mechanisms 35 at both ends using variable joints 36-1, varying the distance L between the scissor mechanisms 35 at both ends.

The scissor mechanism 31 has a pair of arms 31-1, 31-2, each of the arms being bent at the center at a predetermined angle (an obtuse angle for this example), with equal lengths from the center to both ends. The shapes and dimensions of the arm 31-1 and arm 32-1 may be the same, and are linked together in a rotatable manner by a joint A at the center (inflection point).

The end of the arm 31-1 is connected in a mutually rotatable manner, by a rotating couple C, to the end of one of a pair of arms 32-2, 32-2 forming the scissor mechanism 32 adjacent to the scissor mechanism 31 (the arm 32-2 in this case), and similarly the end of the arm 32-1 is connected in a mutually rotatable manner, by a rotating couple B, to the end of the arm 31-2. The arms 31-1, 32-2 are also connected in a mutually rotatable manner, by a rotating couple A, at their centers (inflection points).

In this linked scissor mechanism, the electrostatic adsorption modules or their support substrates (laminar bodies) are mounted at the location of all or part of the couple C of each scissor mechanism, so that when a flexible display is gripped, it can cause the flexible display to be deformed to a curved surface shape.

Referring to FIG. 7, the multiple laminar bodies may be mounted on the dash-dot-dot line connecting the locations of the couples C of the linked scissor mechanisms, each of the multiple laminar bodies supporting multiple sets of support members and tip members. The rows of multiple laminar bodies can form a virtual curve (curved surface). The rows of linked multiple scissor mechanisms and all of the multiple laminar bodies may be considered to be the deformable support substrate. Operation of this deformable support substrate using the robotic arms 36 allows the curvature of the (circular) curve formed by the multiple laminar bodies to be varied.

Figure 8:
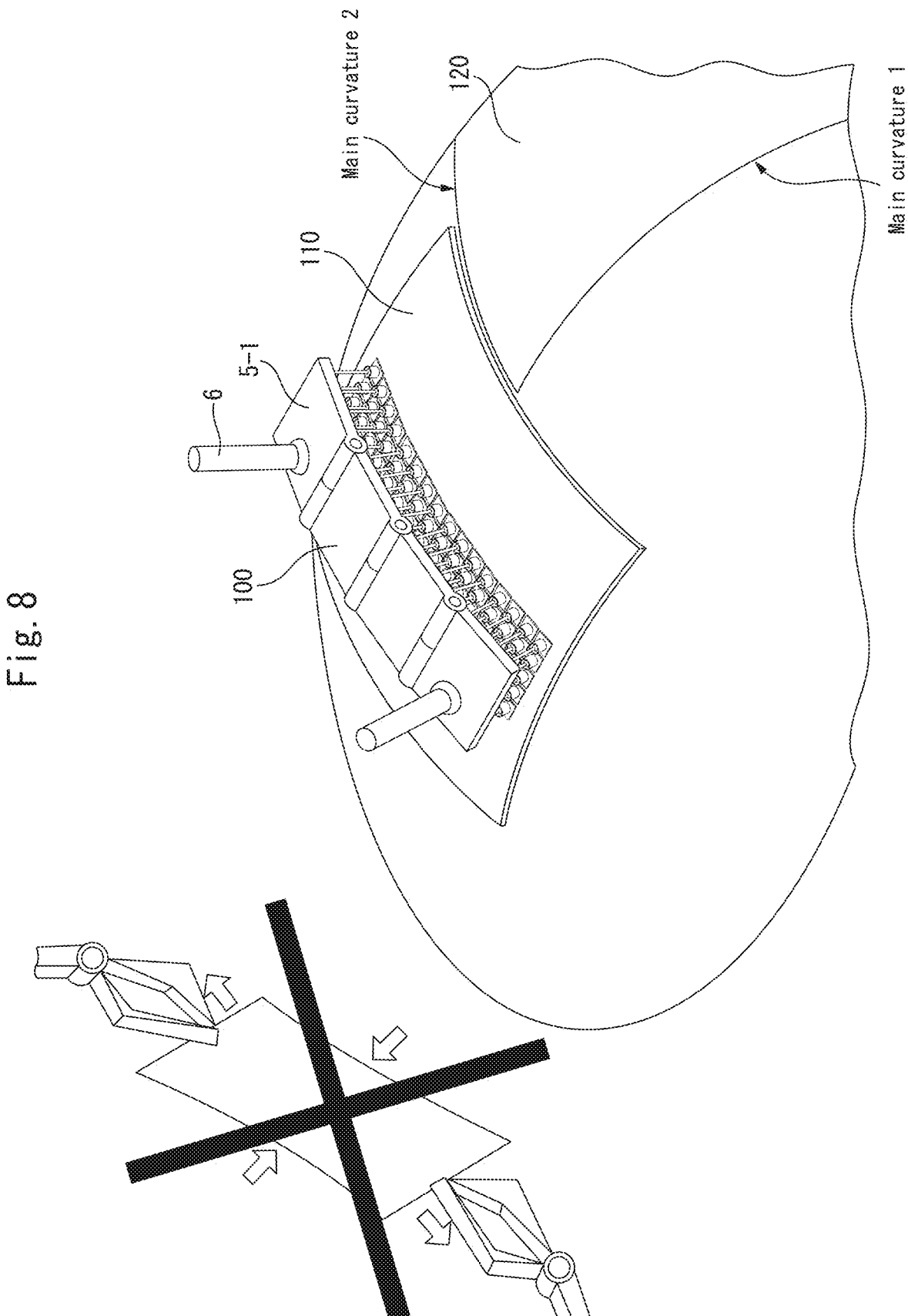
FIG. 8 is a diagram showing adaptation of an electrostatic adsorption device of the invention to a curved surface.

FIG. 8 shows a state of the electrostatic adsorption device 100 of FIG. 6, adapting to a spherical adsorption surface having main curvature 1 and main curvature 2. In FIG. 8, 100 is the electrostatic adsorption device, 110 is a film to be adsorbed, such as an organic EL panel, and 120 is a setting base where the film to be adsorbed 110 is to be set. The surface of the setting base 120 may also be a cylindrical curved surface having a curvature γ (main curvature 2 alone), instead of a spherical surface with main curvature 1 and main curvature 2, and in order to set the film to be adsorbed 110 on the setting base 120 having such a curved surface, the electrostatic adsorption device 100 is used to electrostatically adsorb the film to be adsorbed 110 at a different location, convey it onto the setting base 120, and detach it.

Since the multiple laminar bodies 5-1 in the electrostatic adsorption device 100 are capable of mutual elastic bending deformation as explained above, the robotic arms 6 at both ends of the laminar body rows are used to arrange the rows of laminar bodies 5-1 in the direction of main curvature 2 (curvature γ), for example, to cause curved deformation overall that approximately matches main curvature 2. Since the individual laminar bodies 5-1 are mutually curved, even though the rows of laminar bodies 5-1 themselves do not completely match the shape of the cylindrical surface with main curvature 2 (curvature γ), the individual electrostatic adsorption modules 1 can be elastically displaced in the near and far direction with respect to the adsorption surface, the electrostatic adsorption surfaces being freely rotatable while also having flexibility on the adsorption surface, and as a result, the plurality of electrostatic adsorption modules 1 become curved to adapt not only to main curvature 2 but also main curvature 1. In particular, by reducing the dimensions of the individual electrostatic adsorption modules 1, the shapes of the electrostatic adsorption surfaces of the multiple electrostatic adsorption modules 1 can more satisfactorily match the cylindrical shape of the setting surface 120.

In the electrostatic adsorption device 100, the laminar bodies preferably have gaps between them so that the tip members (electrostatic adsorption surfaces) of the electrostatic adsorption modules 1 coupled with the respective laminar bodies do not interfere with each other by curvature of the laminar bodies.

FIG. 8 shows a single electrostatic adsorption device 100, but it is clear that multiple electrostatic adsorption devices 100 may also be aligned (in parallel or series) to allow formation of an electrostatic adsorption surface of larger area.

When using the electrostatic adsorption device 100 as shown in FIG. 8 to grip, convey and detach the film to be adsorbed 110, for example, it is not necessary to grasp both sides of the film with hands as shown at left in FIG. 8, making the device useful for working, such as on-site installation of organic EL panels, for example.

Figure 9:
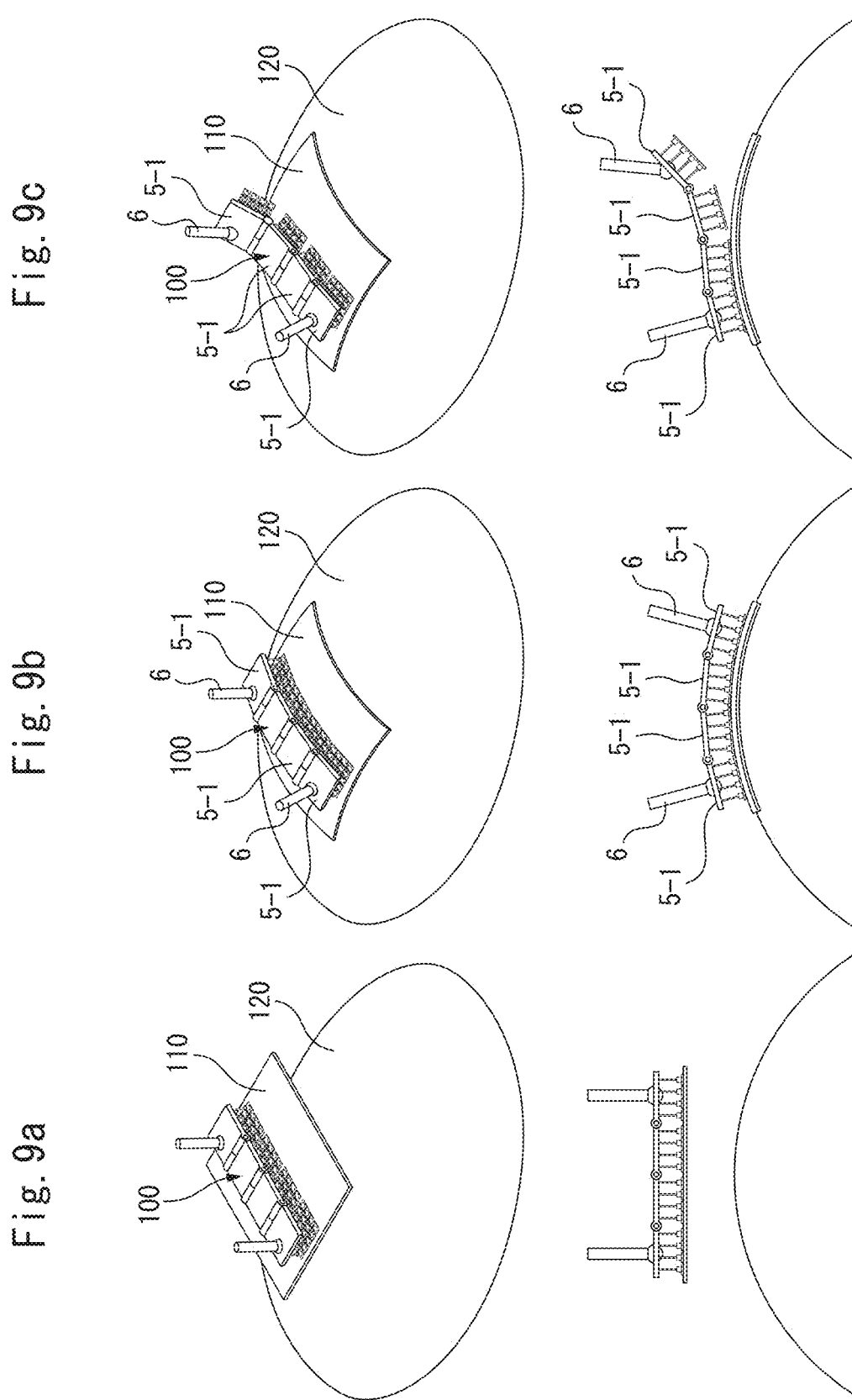
FIGS. 9a to 9c are diagrams showing the state of conveying of a film onto a curved surface followed by detachment, using an electrostatic adsorption device of the invention.

FIG. 9 shows the state of conveying, setting and detachment of a flexible sheet to be adsorbed 110 on a setting location 120 having a curved surface, using the electrostatic adsorption device 100 shown in FIG. 8.

FIG. 9a shows the state where the electrostatic adsorption device 100 is using robotic arms to adsorb a flat flexible sheet to be adsorbed 110 and convey it onto a setting location 120. The flat flexible sheet to be adsorbed 110 may initially be placed in a flat state on a flat storage location.

FIG. 9b shows the state where, after the sheet to be adsorbed 110 has been adsorbed and conveyed as shown in FIG. 9a, the flexible sheet to be adsorbed 110 is placed against the setting location (setting base) 120 which has a curved surface. The multiple electrostatic adsorption surfaces of the electrostatic adsorption device 100 of the invention and the sheet to be adsorbed 110 can flexibly adapt to the curved surface of the setting location 120. In the state shown in FIG. 9b, therefore, the sheet to be adsorbed 10 may be fixed to the curved surface of the setting location 120 by a method such as adhesion or by mechanical anchoring means.

After the flexible sheet to be adsorbed 110 has been fixed to the curved surface of the setting location 120 in the state shown in FIG. 9b, the electrostatic adsorption device 100 may be detached from the electrostatic adsorption device 100 as shown in FIG. 9c. Specifically, after the flexible sheet to be adsorbed 110 in the state shown in FIG. 9b has been fixed to the curved surface of the setting location 120, the power source is cut off and the electrostatic adsorption device is then moved in the direction away from the object to be adsorbed 110, allowing detachment. As seen in FIG. 9c, one edge of the row of laminar bodies (the left side in the drawing) is left pressed against the setting location 120 while the other edge (the right side in the drawing) is deformed away from the curved surface of the setting location 120, thereby creating an angle between the deformed part of the electrostatic adsorption surface and the curved surface of the setting location 120 which reduces the adsorptive power, detaching only that part, and the operation is continued until the entire sheet to be adsorbed 110 is finally detached. In the latter case, the sheet to be adsorbed 110 can be more reliably set on the setting location, and can be detached while confirming that it is set.

With the electrostatic adsorption device 100 of the invention, therefore, it is possible to mount a flexible organic EL panel (sheet) onto a curved surface (such as a cylindrical column) of a building using a robot, for example.

Figure 10:
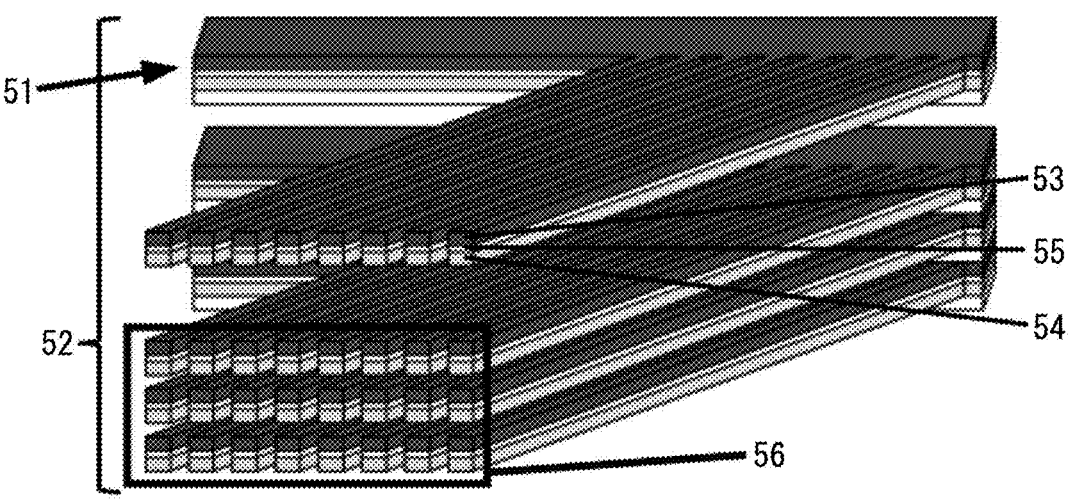
FIG. 10 is a diagram showing an example of an electrostatic adsorption module having a fine piliform structure.

FIG. 10 shows a conceptual drawing of a bipolar electrostatic chuck monolayer module 51 having the fine piliform structure disclosed in Japanese Patent Publication No. 6,846,821, and a stacked bipolar electrostatic module 52 having a large-area fine piliform structure obtained by stacking the monolayer modules. In FIG. 10, 53 is a positive electrode, 54 is a negative electrode, 55 is an insulating layer, and 56 is a contact surface (adsorption surface) with a fine piliform structure.

With the electrostatic adsorption device 100 of the invention it is possible to use a bipolar electrostatic chuck module 51 with a fine piliform structure as shown in FIG. 10, instead of the electrostatic adsorption module 1 or 10 according to the first aspect of the invention. The construction and method of producing the bipolar electrostatic chuck module 51 is disclosed in detail in Japanese Patent Publication No. 6,846,821, which may be used as reference.

[Electrostatic Adsorption Method]

The present invention provides, as a third aspect, an electrostatic adsorption method wherein an electrostatic adsorption module according to the first aspect or an electrostatic adsorption device according to the second aspect is used to adsorb and grip an object to be adsorbed.

In particular, the electrostatic adsorption method of the invention can adapt to objects that are flexible or have curved surfaces, and can also adapt to setting locations both with curved surfaces or with non-uniform surfaces, making it an effective electrostatic adsorption method for such purposes.

In the electrostatic adsorption method of the invention, the electrostatic adsorption module or electrostatic adsorption device can also be used for conveying and detachment after having adsorbed and gripped the object to be adsorbed.

Most especially, the electrostatic adsorption module or electrostatic adsorption device of the invention may be used to adsorb and grip an object to be adsorbed that is flexible or has a curved surface, from a state of placement on an optionally flat initial setting location, and then to convey the object to be adsorbed to a setting location that is curved or has a non-uniform surface, adapting the object to be adsorbed to the curved surface or non-uniform surface of the setting location and then detaching, and further to fix the object to be adsorbed that has been adapted to the curved surface of the setting location, onto the curved surface or non-uniform surface and detaching from it. This makes it possible to set organic EL panels onto curved surfaces and to adapt resin protective sheets onto curved glass surfaces, which has been difficult to achieve in the prior art.

The electrostatic adsorption module or electrostatic adsorption device of the invention can be advantageously used in particular for adapting objects to be adsorbed that are flexible or have curved surfaces onto setting locations with curved surfaces or non-uniform surfaces, but can also be used for other cases such as for adapting flexible flat objects to be adsorbed onto flat setting locations.

The electrostatic adsorption method according to the third aspect of the invention based on the drawings may also be understood by referring to the method of using the electrostatic adsorption device described above with reference to FIG. 9.

(Method of Detaching Object to be Adsorbed)

As a fourth aspect of the invention there is provided a method wherein the electrostatic adsorption module or electrostatic adsorption device has multiple tip members arranged in rows from one end to the other end, the multiple tip members are used to adsorb and grip the object to be adsorbed and the object to be adsorbed is conveyed onto the setting base, after which the voltage applied to the multiple tip members for adsorption and gripping is turned OFF in polarity reversal attenuation mode, and the multiple tip members on the object to be adsorbed on the setting base are separated so that the object to be adsorbed at the other end recedes more quickly than the object to be adsorbed at the one end, with respect to the surface of the setting base, by which the multiple tip members are detached from the object to be adsorbed on the setting base while the object to be adsorbed is allowed to remain on the setting base.

With the electrostatic adsorption module or device of the invention, the object to be adsorbed can be detached after the object to be adsorbed has been adsorbed and gripped, but depending on the object to be adsorbed, it may be difficult to detach the object to be adsorbed from the electrostatic adsorption module or device in some cases due to residual charge remaining in the object to be adsorbed if the object to be adsorbed is a thin and flexible (light) resin film, for example (especially if the resin film is thin and flexible (light) and tends to retain a residual charge, being highly affected by electrostatic adsorption of the residual charge). The present inventors have found that the detachment method according to the fourth aspect allows an object to be adsorbed to be suitably detached.

Based on experimentation by the present inventors, the known methods for removing residual charge remaining on objects to be adsorbed include a method of simply turning OFF the applied voltage, and a method of turning an applied voltage OFF in polarity reversal attenuation mode. A method of turning voltage OFF in polarity reversal attenuation mode is a method in which, for example, +600 V is applied to one electrode A of a pair of electrodes and −600 V is applied to the other electrode B to cause adsorption, after which −500 V is applied to electrode A and +500 V is applied to electrode B; subsequently +400 V is applied to electrode A and −400 V is applied to electrode B; subsequently −300 V is applied to electrode A and +300 V is applied to electrode B; subsequently +200 V is applied to electrode A and −200 V is applied to electrode B; and subsequently −100 V is applied to electrode A and +100 V is applied to electrode B, thereby gradually attenuating the applied voltage while reversing the polarity, and finally turning the voltage OFF (0 V). Methods of turning OFF applied voltage in polarity reversal attenuation mode are known. The foregoing example is merely an example, and the attenuation history of applied voltage may differ. Based on experimentation by the present inventors, however, it has sometimes not been possible to effectively detach specific thin, flexible resin films even when using the electrostatic adsorption module or electrostatic adsorption device of the invention.

The present inventors have also attempted a method of detaching an object to be adsorbed on a setting base from tip members by moving the multiple tip members as a whole away from the setting base at an inclination from the surface of the setting base (this will be referred to hereunder as "inclined detachment method"). The inclined detachment method was found to be effective against residual charge, but still did not allow effective detachment for specific thin, flexible resin films. However, the present inventors also found that for resin films that cannot be effectively detached by a polarity reversal attenuation method or inclined detachment method alone, a polarity reversal attenuation method and inclined detachment method may be used in tandem for effective detachment of such resin films.

When using a polarity reversal attenuation method and inclined detachment method in tandem (in combination), it is preferred to carry out the inclined detachment method after the polarity reversal attenuation is complete, or to carry out both simultaneously in parallel. While not preferred, the polarity reversal attenuation may also be carried out after the inclined detachment method.

For the fourth aspect, when it is stated that the electrostatic adsorption module or electrostatic adsorption device has multiple tip members arranged in rows from one end to the other end, this means that the "multiple tip members arranged in rows" may also partially be multiple tip members additionally having numerous tip members arranged in rows. For example, the multiple tip members arranged in a single row from one end to the other end may be considered to enclose two rows of tip members, and tip members at both ends around the center tip member of the single row may be preferentially detached from the surface of the setting base to accomplish inclined detachment. Alternatively, a polarity reversal attenuation method and inclined detachment method may be used in tandem for only a partial region of the object to be adsorbed.

For explanation of an inclined detachment method when a polarity reversal attenuation method and an inclined detachment method are used in tandem, FIG. 9*b* shows a state where the object to be adsorbed 110, which has been adsorbed and gripped by the electrostatic adsorption device 100, is conveyed to and set on the setting base 120. The support substrate of the electrostatic adsorption device 100 comprises multiple laminar bodies 5-1, the multiple laminar bodies 5-1 being connected together in a mutually rotatable manner and both ends of the multiple laminar bodies 5-1 being operated by robotic arms 6. Referring to FIG. 9*c* showing the step following FIG. 9*b*, the robotic arm 6 at the far end in FIG. 9*c* is lifted, causing the laminar body 5-1 at the far end to be fully separated from the surface of the setting base 120 and the object to be adsorbed 110. The second laminar body 5-1 from the far end is still being separated from the surface of the setting base 120 and the object to be adsorbed 110 while the far end of the 2nd laminar body 5-1 is beginning to be separated from the setting base 120 and the surface of the object to be adsorbed 110. During this time, the 2nd laminar body 5-1 from the far end has its front end pressed by its own weight against the setting base 120 and the surface of the object to be adsorbed 110, while the far end separates while being inclined with respect to the front end of the laminar body 5-1. Thus, the tip members of the multiple electrostatic adsorption modules in rows are separated away from the setting base 120 and the surface of the object to be adsorbed 110, in order from one end toward the other end of the row, making it possible to accomplish inclined detachment.

In an electrostatic adsorption module 10 where the support substrate 5 is not deformable, as shown in FIG. 5, one end of the support substrate 5 may be inclined with respect to the other end to cause the multiple tip members to separate from the setting base 120 and the surface of the object to be adsorbed 110, while being oriented in an inclined manner. Likewise in an electrostatic adsorption device 100 where the support substrate 5 is deformable, as shown in FIG. 6, the robotic arms 6 may be operated so that all of the multiple laminar bodies 5-1 are operated as if they were a single laminar body, with one end of the whole as a single laminar body being inclined with respect to the other end, causing it to separate from the setting base 120 and the surface of the object to be adsorbed 110.

The detachment method for a material to be adsorbed by using a polarity reversal attenuation method and inclined detachment method in tandem according to the fourth aspect can more effectively detach objects to be adsorbed from tip members onto setting bases and leave the objects to be adsorbed on the setting bases, even for objects to be adsorbed that have been difficult to detach by other methods (such as thin, flexible resin films).

The detachment method used for the electrostatic adsorption method of the invention is not limited to a combination of a polarity reversal attenuation method and inclined detachment method, and it is to be understood that a polarity reversal attenuation method or inclined detachment method alone may be used, or the detachment may be by simply turning OFF voltage, without using either a polarity reversal attenuation method or inclined detachment method.

EXAMPLES

The effectiveness of the electrostatic adsorption module and electrostatic adsorption device of the invention have been experimentally confirmed, as described below, with the understanding that the present invention is not limited to the following Examples.

Comparative Example 1

Following the method described in the Examples of Japanese Patent Publication No. 6,846,821, a 3D printer and water jet method were used to fabricate an electrostatic adsorption module having electrostatic adsorption surfaces at the tips of a fine piliform structure, as shown in FIG. 10.

Referring to FIG. 10, the support substrate was in a laminar form with a length of 75 mm, a height of 15 mm and a thickness of 1.6 mm. Elastic beams of the fine piliform structures having lengths of 50 mm, widths of 1 mm and thicknesses of 1.6 mm extend from the support substrate at an angle of 45°. The elastic beams of the fine piliform structure clamp an insulating layer between two conductive layers, and the end faces of the fine piliform structures form a hyperbolic electrostatic adsorption surface having an insulating layer between the positive electrode and negative electrode (with a theoretical electrode area of 600 μm×1000 μm×2).

A plurality of the fabricated electrostatic adsorption modules were layered with spaces between the support substrates, to fabricate electrostatic adsorption modules aligned with their electrostatic adsorption surfaces aligned vertically and horizontally, as indicated by reference numeral 56 in FIG. 10. The electrostatic adsorption surfaces of the tips of the fine piliform structures of the electrostatic adsorption modules can be elastically displaced in the near and far direction with respect to the object to be adsorbed.

Figure 11:
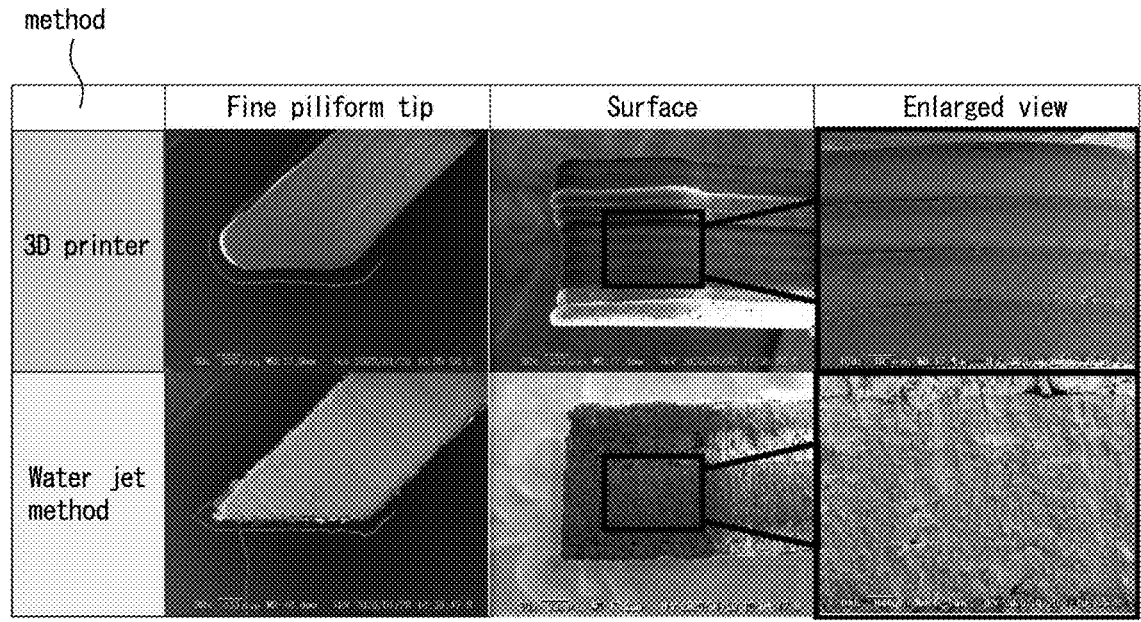
FIG. 11 is a set of photographs showing the tip of the fine piliform structure of an electrostatic adsorption module having a fine piliform structure.

FIG. 11 is a set of photomicrographs showing tip sections of fine piliform structures produced using a 3D printer and water jet method, where it was confirmed that in all of the methods, none of the obtained end faces were flat, but instead had rounded angles. With an electrostatic adsorption module having a fine piliform structure, therefore, the contact area with the surface of the object to be adsorbed is reduced and adsorptive power is not very high.

When the end faces of the electrostatic adsorption modules having electrostatic adsorption surfaces with fine piliform structures aligned horizontally and vertically are observed, as schematically indicated by reference numeral 56 in FIG. 10, wide non-contact surfaces (gaps) are seen between the electrostatic adsorption surfaces of the fine piliform structures, and the adsorptive power is reduced by the extent of the large area of the non-contact surface (gaps).

Comparative Example 2

For Comparative Example 2, a 3D printer was used to fabricate an electrostatic adsorption module in which a sheet-like electrostatic adsorption member (non-rotatable) was formed on the tip of each fine piliform structure of Comparative Example 1.

Figures 12A, 12B:
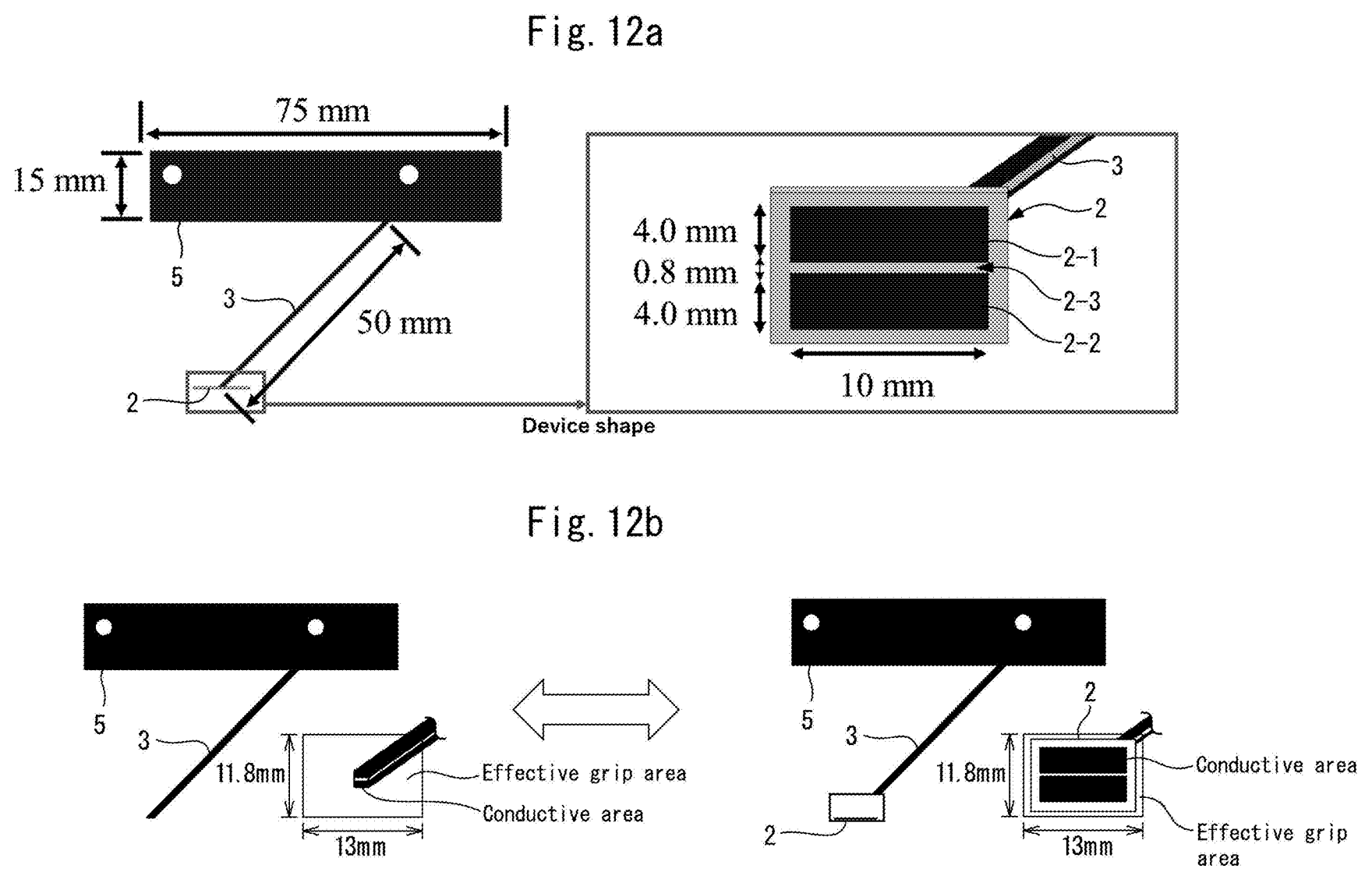

As shown in FIG. 12a, the support substrate was in a laminar form with a length of 75 mm, a height of 15 mm and a thickness of 1.6 mm. An elastic beam (fine piliform structure) 3 having a length of 50 mm, a width of 1 mm and a thickness of 1.6 mm extends from the support substrate 5 at an angle of 45°. At the tip of the elastic beam 3, provided was a sheet-like electrostatic adsorption member 2 with an electrostatic adsorption surface in which a positive electrode 2-1 and negative electrode 2-2 having 10 mm×4.0 mm dimensions were situated with a 0.8 mm-wide insulation region 2-3 between them, and the electrodes were also surrounded around by a 1.0 mm-wide insulation region. The electrostatic adsorption surface of the tip member had 12 mm×10.8 mm dimensions, with a thickness of 0.8 mm. FIG. 1(a is a view of the electrostatic adsorption surface from an angle, and therefore the horizontal/vertical aspect ratio does not appear as the actual ratio. The tip sections of the elastic beams (electrostatic adsorption surfaces) of the electrostatic adsorption modules can be elastically displaced in the near and far direction with respect to the object to be adsorbed.

FIG. 12b shows a comparison of the effective electrode areas of the electrostatic adsorption modules of Comparative Example 1 and Comparative Example 2 per unit area. The effective electrode area of the electrostatic adsorption module of Comparative Example 2 per unit area was notably increased compared to the effective electrode area of the electrostatic adsorption module of Comparative Example 1 per unit area.

Example 1: Fabrication of Bipolar Electrostatic Module

Figure 13A:
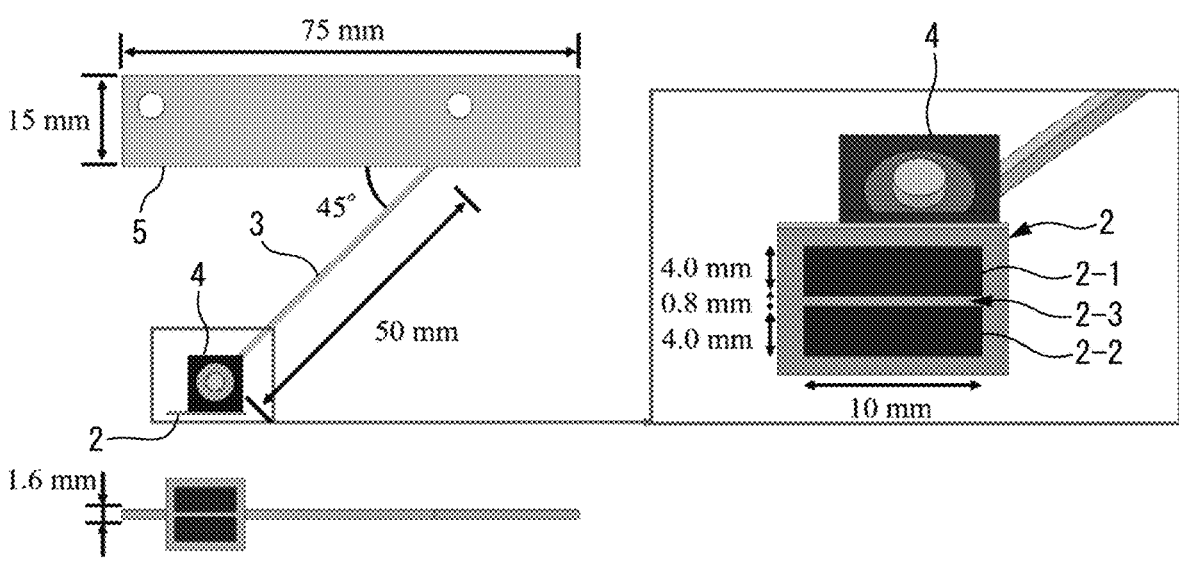
FIGS. 13a and 13b are diagrams showing electrostatic adsorption modules having freely rotatable tip adsorption surfaces, with one beam and with two beams.
Figure 13B:
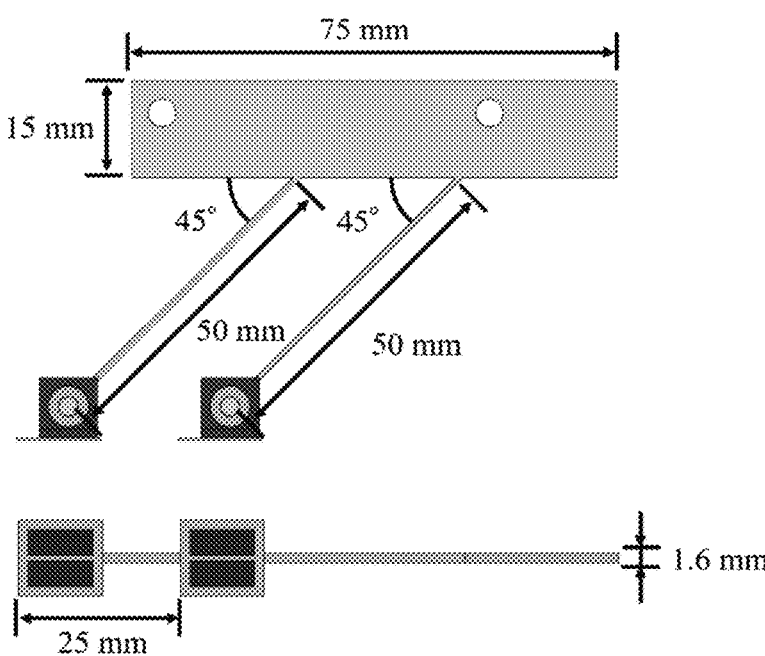

As electrostatic adsorption modules for Example 1 there were fabricated electrostatic adsorption modules comprising a rotating mechanism with one beam and two beams (both beams being elastic beams, as support members; same hereunder). The structures and dimensions and the like are shown in FIGS. 13a and 13b. The positive electrode 2-1 and negative electrode 2-2 of the tip member were 4 mm×10 mm, the width of the insulation region 2-3 between them was 0.8 mm, and the width of the surrounding insulation region was 1 mm. The thickness of the tip member was 0.8 mm.

The support substrate 5 was laminar with a length of 75 mm, a height of 15 mm and a thickness of 1.6 mm. One or two elastic beams (supports) 3 having a length of 50 mm, a width of 1 mm and a thickness of 1.6 mm extend from the support substrate 5 at an angle of 45°, the tip of each elastic beam forming a joint having a hole allowing insertion of the shaft of a ball bearing (diameter: 3 mm).

The tip member 2 having an electrostatic adsorption surface has, on the electrostatic adsorption surface, an insulation region with a width of 0.8 mm between a positive electrode and negative electrode each having a length of 4.0 mm and a width of 10 mm. They are also surrounded by an insulation region, the electrostatic adsorption surface of the tip member 2 having dimensions of 12 mm×10.8 mm.

The tip member 2 has a ball bearing mechanism as a freely rotatable joint 4 on the opposite side from the adsorption surface. As shown in FIG. 14, a shaft (SUS, 3 mm diameter) was passed through a commercially available ball bearing (SUS) 4-4 held with a frame body 4-3 fixed to the tip member and the tip section (with open hole) of the elastic beam 3 was connected to the shaft 4-5 to fabricate a mechanism allowing the tip member 2 to rotate with respect to the elastic beam 3.

The support substrate 5, elastic beam 3, tip member 2 and the frame body 4-3 of the ball bearing 4-4 were shaped with a 3D printer. The materials used were carbon mixed with PLA (polylactic acid) for the conductive part, and PLA (polylactic acid) for the insulating part. All of the materials were commercially available materials. For Comparative Example 1 and Comparative Example 2 as well, the same materials were used to fabricate each member using a 3D printer.

Conductive material: ProtoPasta conductive PLA resin filament (https://www.amazon.co.jp/gp/product/B014IH5TX8/)

Insulating material: Ultimaker PLA Pearl White 8w/NFC) (https://www.amazon.co.jp/Ultimaker-PLA-Pearl-White-NFC/dp/B072Q49G9Y/)

Figure 15A:
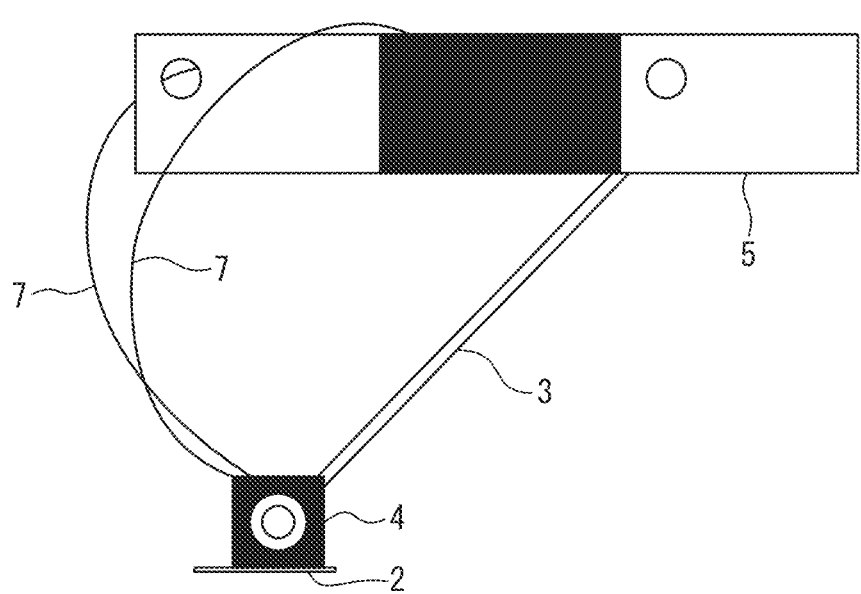
FIGS. 15a) and 15b) are diagrams showing wiring for an electrostatic adsorption module having a freely rotatable tip adsorption surface, with one beam and with two beams.
Figure 15B:
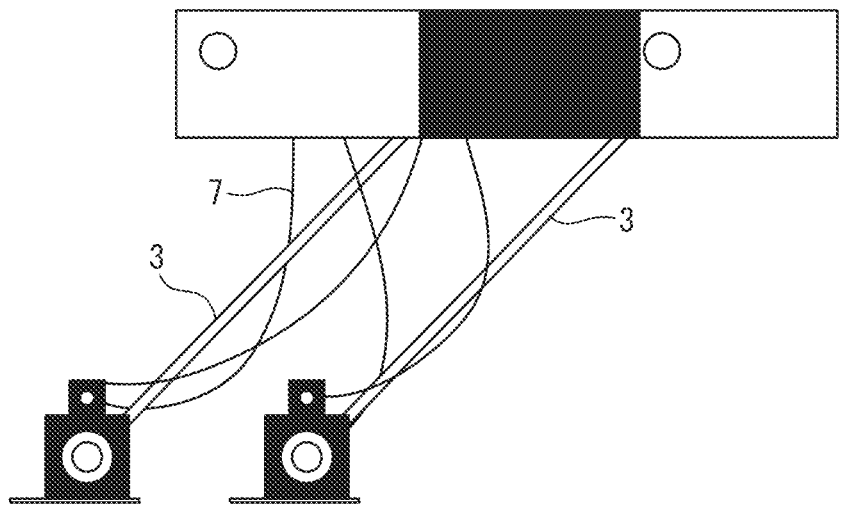

After shaping each part with the 3D printer, the ball bearing 4-4 was mounted on the frame body 4-3 shaped integrally with the tip member, on the opposite side from the adsorption surface of the tip member 2. The shaft 4-5 was used to connect the elastic beam 3 and the ball bearing 4-4. The power source was connected to the electrodes of the tip member 2 with thin conductive threads 7, as shown in FIGS. 15a and 15b.

Example 2: Adsorption Performance Confirmation Test

Figure 16:
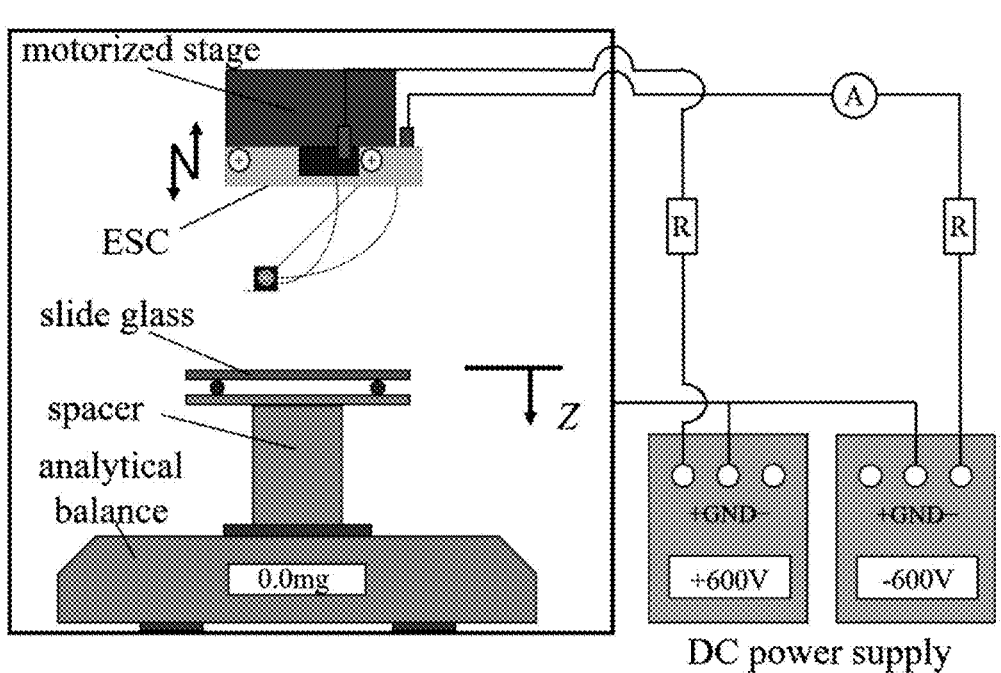
FIG. 16 shows an experimental system for measurement of electrostatic adsorption force.

An adsorptive power measurement test (force curve measurement test) was carried out using the experimental system illustrated in FIG. 16.

The object to be adsorbed was slide glass (SI111 by Matsunami Glass Industries, Ltd., dimensions: 76×26×0.91 mm, mass: 4.59 g), stacked in a number of four and fixed with double-sided tape. A linear stage was used to press the elastic beam tip of the device against the object surface, after which it was raised and the adsorptive power at different positions was measured using an electronic scale (Sartorius QUINTIX224-1SJP, resolving power: 0.1 mg, stabilization time: 2 s). In order to prevent sliding of the elastic beam tip on the slide glass during measurement, the slide glass was set on top of the ball.

The measuring procedure was as follows.

(1) The device (module) is fixed to the stage and the beam tip and slide glass are adjusted to be parallel as determined visually.

(2) After setting the electronic scale value to 0 mg, the elastic beam tip is brought near to the slide glass while applying step displacement to the stage, with the zero point (Z=0) as the position where the electronic scale value increased from 0 mg. The displacement Z is given with the direction of gravity defined as positive.

Figure 17:
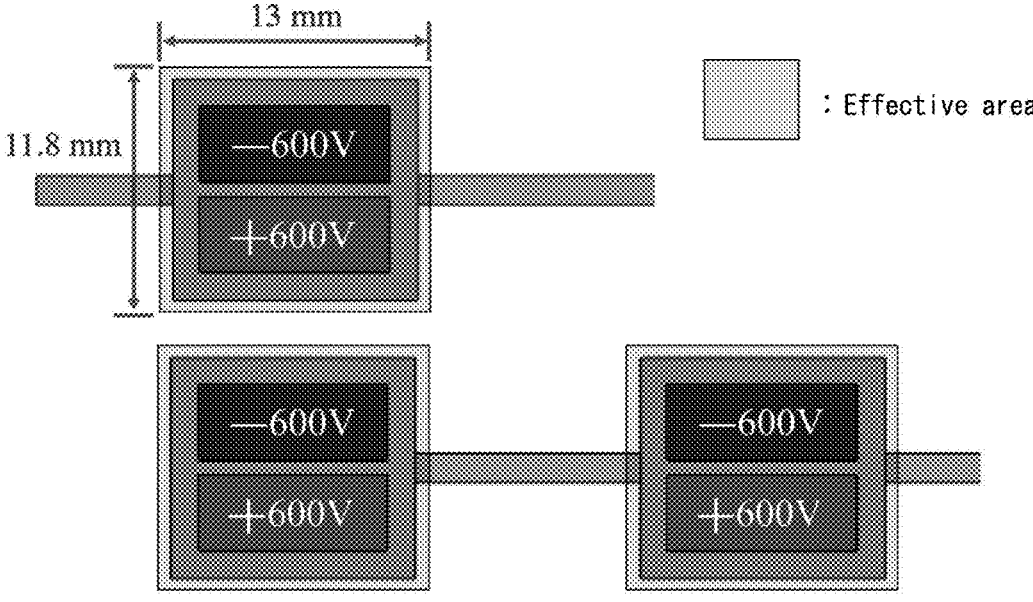
FIG. 17 is a diagram showing an electrode arrangement for an electrostatic adsorption surface.

(3) The elastic beam tip is raised to the position where Z=−1 mm, and voltage is applied to the device. The applied voltage is +600 V at the positive electrode and −600 V at the negative electrode. (FIG. 17)

(4) While applying 5 μm step displacement every 2.2 s to the stage, it was moved from the origin Z=−1 mm to the turning point Z=1 mm (stopping 10 s at the turning point) and then raised to Z=−3 mm, measuring the electronic scale value at each position.

Shown below are the results of force curve measurement for each model, where "adsorptive power per unit area" is the measured force divided by the effective area that takes into account the space when beams are assembled in the future. Specifically, in the case of Example 1, when the multiple tip members are aligned in horizontal and vertical rows as shown in FIG. 5, the area on the adsorption surface side per tip member 1 taking into account the 1 mm gap between tip members, is 13 mm×11.8 mm (the electrode area being 10 mm×4.0 mm×2), and the adsorptive power per unit area (effective adsorptive power) was calculated from this area and the measured adsorptive power.

For Comparative Examples 1 and 2 as well, the adsorptive power per unit area (effective adsorptive power) was calculated from the area and the measured adsorptive power, taking into account the space (non-contact surface) formed between the fine piliform structure.

(Adsorption Performance Results)

FIG. 18 shows the results of force curve measurement for Comparative Example 1 (fine piliform structure) and Comparative Example 2 (sheet).

Although moving from the origin Z=−1 mm to the turning point Z=1 mm (stopping 10 s at the turning point) was followed by raising to Z=−3 mm, FIG. 18 only shows the results of measuring the electronic scale value at each position from Z=−1 mm through Z=1 mm to Z=−1 mm (no change in measured value when raised from Z=−1 mm to Z=−3 mm).

In FIG. 18, with the electrostatic adsorption module having a fine piliform structure (Comparative Example 1), the measurement results when pressing the device against the slide glass and when raising almost fully overlap (a single line appears in the graph). This demonstrates that the electrostatic adsorption module with a fine piliform structure can flexibly adapt to the surface form of slide glass. However, the adsorptive power per unit area is only 1.53 N/m², represented as adsorptive power when the displacement Z is negative.

With the sheet-like electrostatic adsorption module of Comparative Example 2 in FIG. 18, on the other hand, when the displacement Z was negative the adsorptive power per unit area near Z=−0.4 mm reached 135.0 N/m², and therefore the adsorptive power water 88.2 times greater compared to Comparative Example 1. This was the result of an 83.3-fold increase in the electrode area. However, adsorptive power was lost when the displacement Z was between Z=−0.4 mm and near Z=−0.6 mm. This was the result of loss of contact as the adsorption surface of the sheet was unable to flexibly adapt to the surface form of the slide glass.

Changing the electrostatic adsorption surface from a fine piliform structure to a sheet was therefore found to increase apparent adsorptive power, but to be ineffective for actual objects having non-flat adsorption surfaces.

Figure 19A:
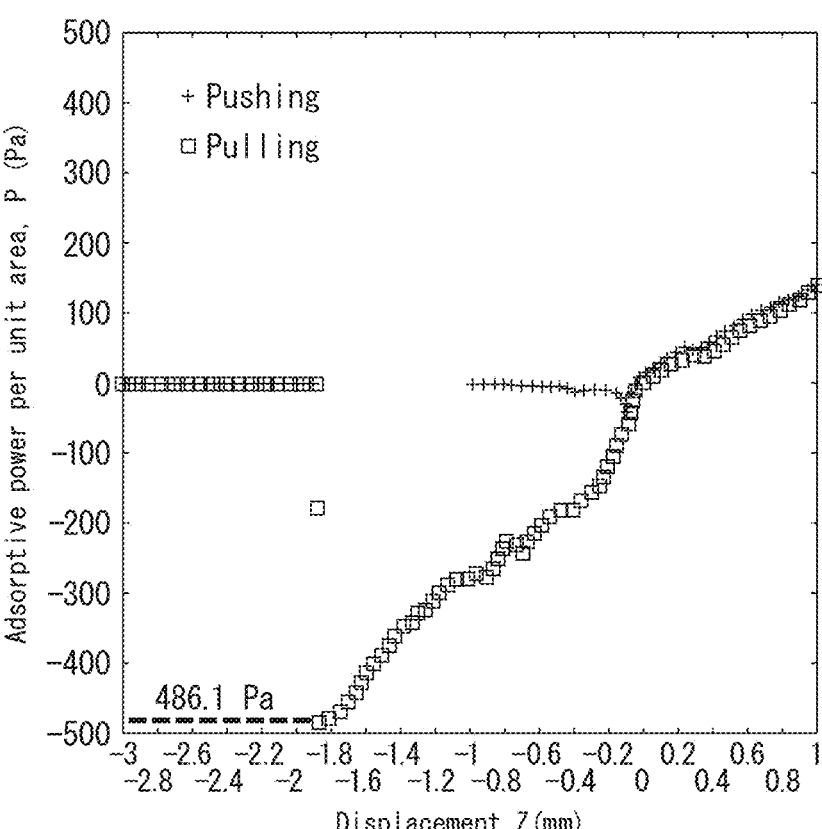
FIGS. 19a and 19b are graphs for electrostatic adsorption force curves measured using an electrostatic adsorption module of the Examples.
Figure 19B:
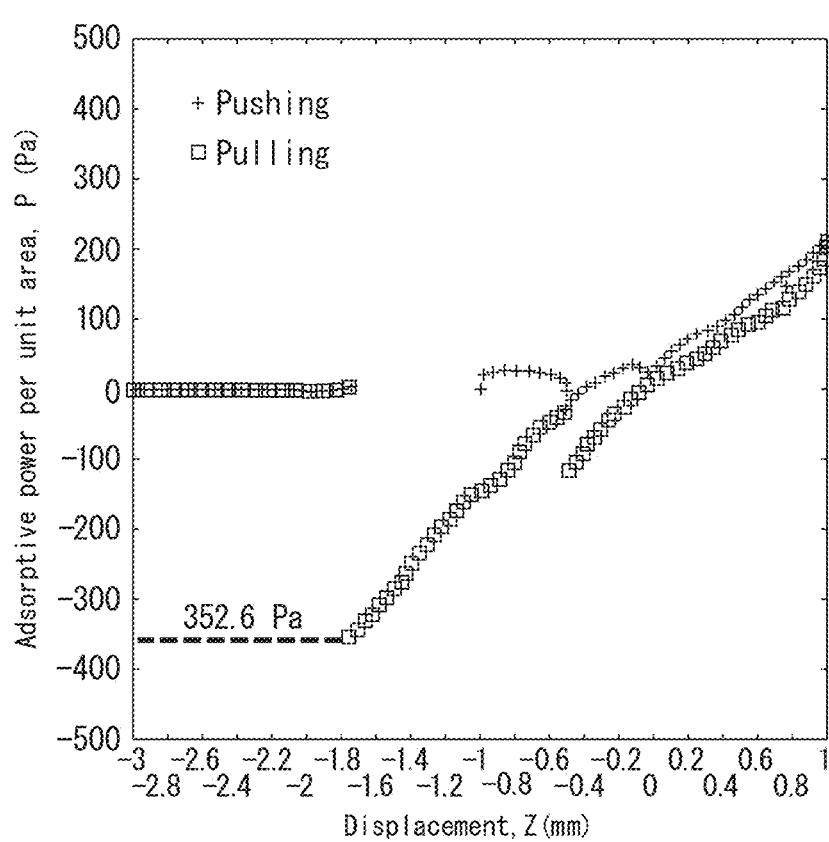

In contrast, referring to FIGS. 19a and 19b and Table 1, with the electrostatic adsorption modules of Example 1 having one and two beam rotating mechanisms, the adsorptive power per unit area was 486.1 N/m² and 352.6 N/m², respectively, and therefore the adsorptive power per unit area had increased not only in comparison to Comparative Example 1 but also in comparison to Comparative Example 2. Moreover, displacement Z was maintained at up to near Z=−1.9 mm and Z=−1.8 mm, indicating that the sheet-like adsorption surface was able to flexibly adapt to the surface form of slide glass by the rotating mechanism. It was thus confirmed that using multiple sheet-like adsorption surfaces 1) allows a larger area to be covered, and 2) stabilizes the mechanical state of the sheet to be adsorbed (its orientation and stress state) by the effect of multiple rotational freedoms, while maintaining high adsorptive power per sheet (increasing the absolute value of the adsorptive power due to larger area).

TABLE 1

| Model | Effective area | Maximum adsorptive power | Maximum adsorptive power per unit area |
|---|---|---|---|
| 1 sheet model | 153.4 mm² | 7608.9 mgf | 486.1 Pa |
| 2 sheet model | 306.8 mm² | 11038.5 mgf | 352.6 Pa |

Figure 20A:
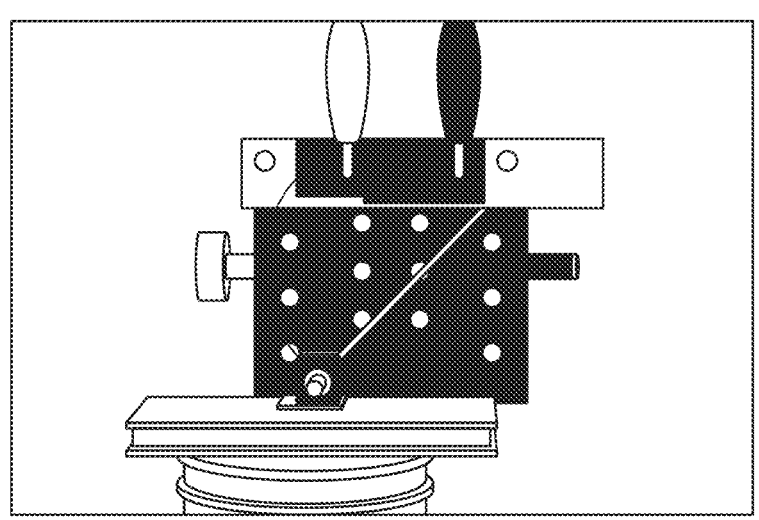
FIGS. 20a and 20b are diagrams showing slide glass raised using an electrostatic adsorption module with one beam and two beams.
Figure 20B:
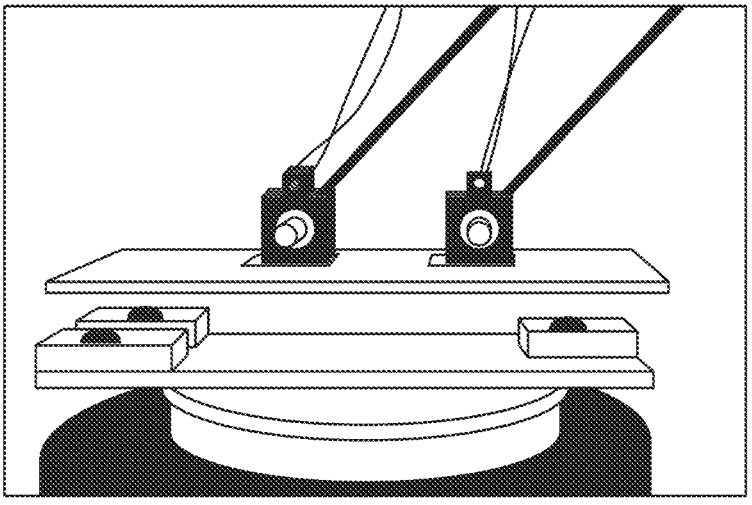

FIGS. 20a and 20b show the state of slide glass adsorbed and raised using electrostatic adsorption modules with rotating mechanisms having one beam and two beams, for Example 1. These images only show one glass slide, but four glass slides were used for the adsorptive power measurement described above, measuring the maximum adsorptive power.

Figure 21A:
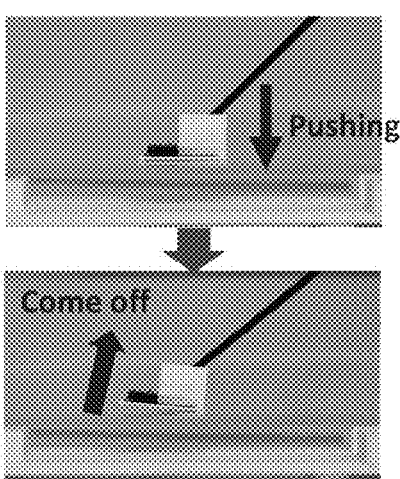
FIGS. 21a to 21c are diagrams illustrating the effect of a freely rotatable joint in an electrostatic adsorption module of the invention.
Figure 21B:
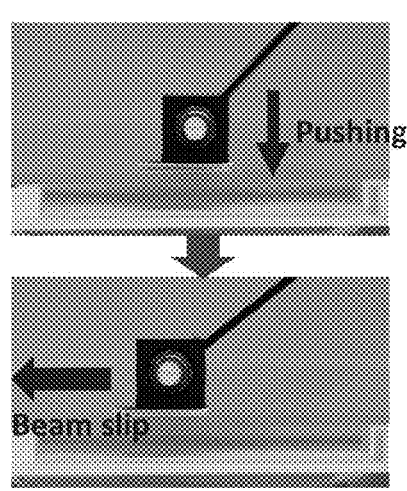

The reason for the difference between Comparative Example 2 and Example 1 will now be explained with reference to FIG. 21. In a sheet-like electrostatic adsorption module without a rotating mechanism, as illustrated in FIG. 21a, pressing the module against a glass plate causes the adsorption surface to rise, rapidly reducing the contact area. In a sheet-like electrostatic adsorption module with a rotating mechanism, on the other hand, as shown in FIG. 21b, pressing the module against a glass plate causes the adsorption surface to slide along the surface of the glass plate while rotating, and therefore the contact area is not reduced.

Figure 21C:
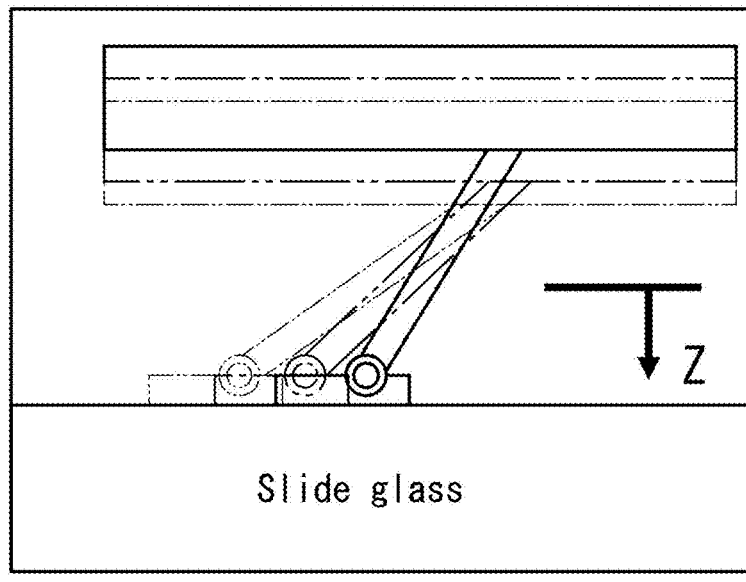

FIG. 21c schematically shows the state of displacement of the electrostatic adsorption module having a rotating mechanism, with respect to a glass plate, when the displacement Z is Z=0 mm (position P₁), Z=1.0 mm (position P₂) or Z=−1.0 mm (position P₃). In FIG. 21c, the position of the glass plate is fixed and the electrostatic adsorption module is displaced vertically.

Example 2: Gripping Stability of Multiple-Beam Module

Figure 22A:
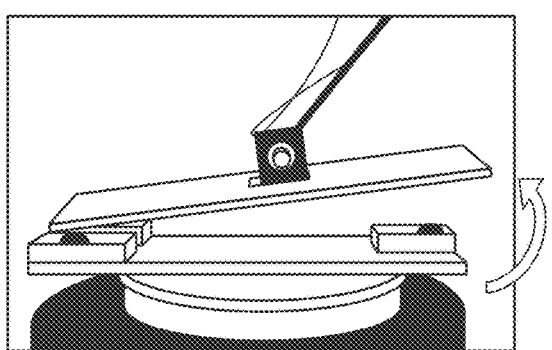
FIGS. 22a and 22b are diagrams showing slide glass raised using electrostatic adsorption modules with one beam and with two beams.
Figure 22B:
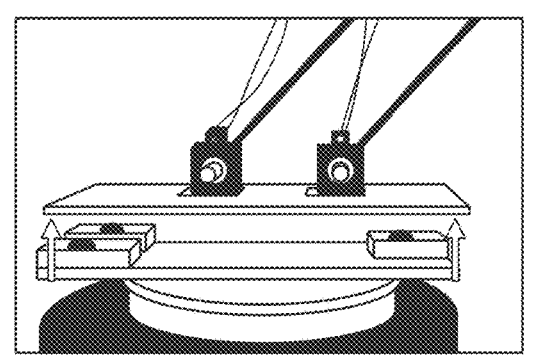

FIGS. 22a and 22b show holding of two glass plates using the electrostatic adsorption modules having rotating mechanisms with one beam and two beams fabricated in Example 1.

With one beam as shown in FIG. 22a, the glass plate is inclined due to the freely rotatable joint, resulting in poor gripping stability, but with two beams as shown in FIG. 22b, the glass plate can be held horizontally for excellent gripping stability. Since most electrostatic adsorption modules are small, an electrostatic adsorption module and electrostatic adsorption device provided with multiple tip members having electrostatic adsorption surfaces are preferred.

Example 3: Plastic Sheet and Curved Surface

Figure 23A:
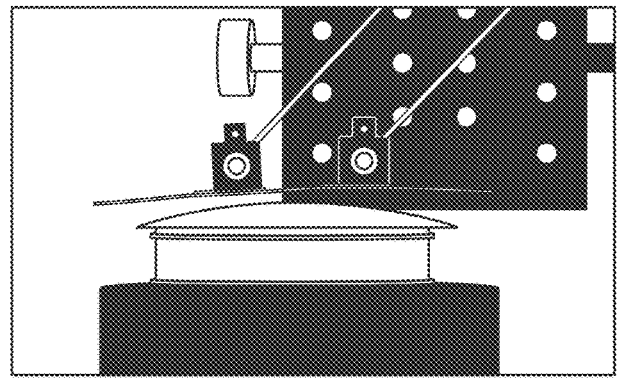
FIG. 23 shows an electrostatic adsorption module of the invention adapted to a curved surface.
Figure 23B:
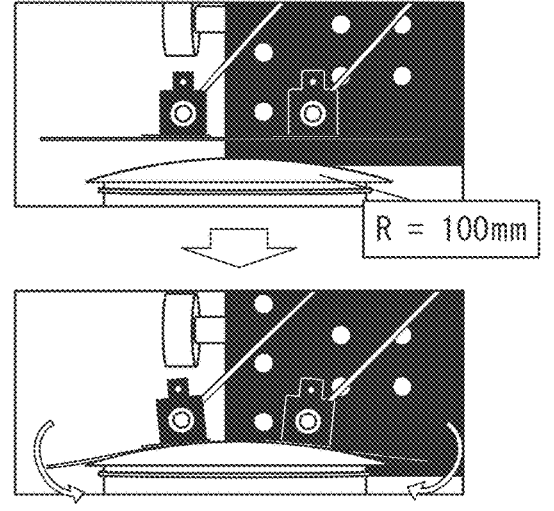

FIGS. 23a and 23b show an electrostatic adsorption module having a rotating mechanism with two beams fabricated in Example 1, gripping and holding a flexible plastic sheet and then conveying it to a curved surface and setting it on the curved surface.

This experiment confirmed that it is possible to grip a flexible plastic sheet using an electrostatic adsorption module having a rotating mechanism according to the Examples of the invention.

The experiment also confirmed that it is possible to set the gripped flexible plastic sheet in a shape adapted to a curved surface, using an electrostatic adsorption module having a rotating mechanism according to the Examples of the invention.

The electrostatic adsorption module having a rotating mechanism according to the Examples of the invention can also be used to grip a flexible plastic sheet on a curved surface, by reversing the order of the upper and lower images in FIG. 23*b*.

This further shows that, after having conveyed a flexible plastic sheet onto a curved surface using an electrostatic adsorption module with a rotating mechanism, and attaching the plastic sheet to the curved surface by adhesion or some other method while it is adapted to the curved surface, as shown in the lower image of FIG. 23*b*, the plastic sheet can be detached from the electrostatic adsorption module with the rotating mechanism and the electrostatic adsorption module with the rotating mechanism can be moved away from the curved surface and plastic sheet.

Example 4: Ball Joint

As an electrostatic adsorption module according to Example 4 there was fabricated an electrostatic adsorption module similar to the electrostatic adsorption module of Example 1, but using a ball joint instead of a ball bearing as the rotating mechanism. The structure and dimensions are the same as the electrostatic adsorption module of Example 1, except for the rotating mechanism (joint). FIG. 24*a* shows a photograph of the fabricated electrostatic adsorption module.

In this electrostatic adsorption module, the tip member has a ball joint mechanism as a three-dimensional freely rotatable (rotational freedom 3) joint on the side opposite from the adsorption surface. The support substrate, elastic beam (support member), tip member and ball joint frame body were shaped with a 3D printer. The materials used were carbon mixed with PLA (polylactic acid) for the conductive part, and PLA (polylactic acid) for the insulating part, similar to Example 1.

Referring to FIGS. 24*b* to 24*e* for explanation of the process for fabricating the ball joint mechanism, a 3D printer was used to shape the tip member, after which a ball was inserted into the ball receiver of the frame body while shaping the frame body of the ball joint, as shown in FIG. 24*b*, and the rest of the frame body of the ball joint was then shaped, as shown in FIG. 24*c*. Then, as shown in FIG. 24*d*, an elastic beam (integral with the support substrate: see FIG. 24*e*) was attached to the ball in the frame body. A power source was connected to the electrodes of the tip member with thin conductive threads. FIG. 24*e* shows a side view of the completed electrostatic adsorption module, where the tip member is rotatable with respect to the elastic beam, with the adsorption surface (back side) of the tip member thus appearing to be on the plane of the image.

Example 5: Rotational Freedom

Figure 25:
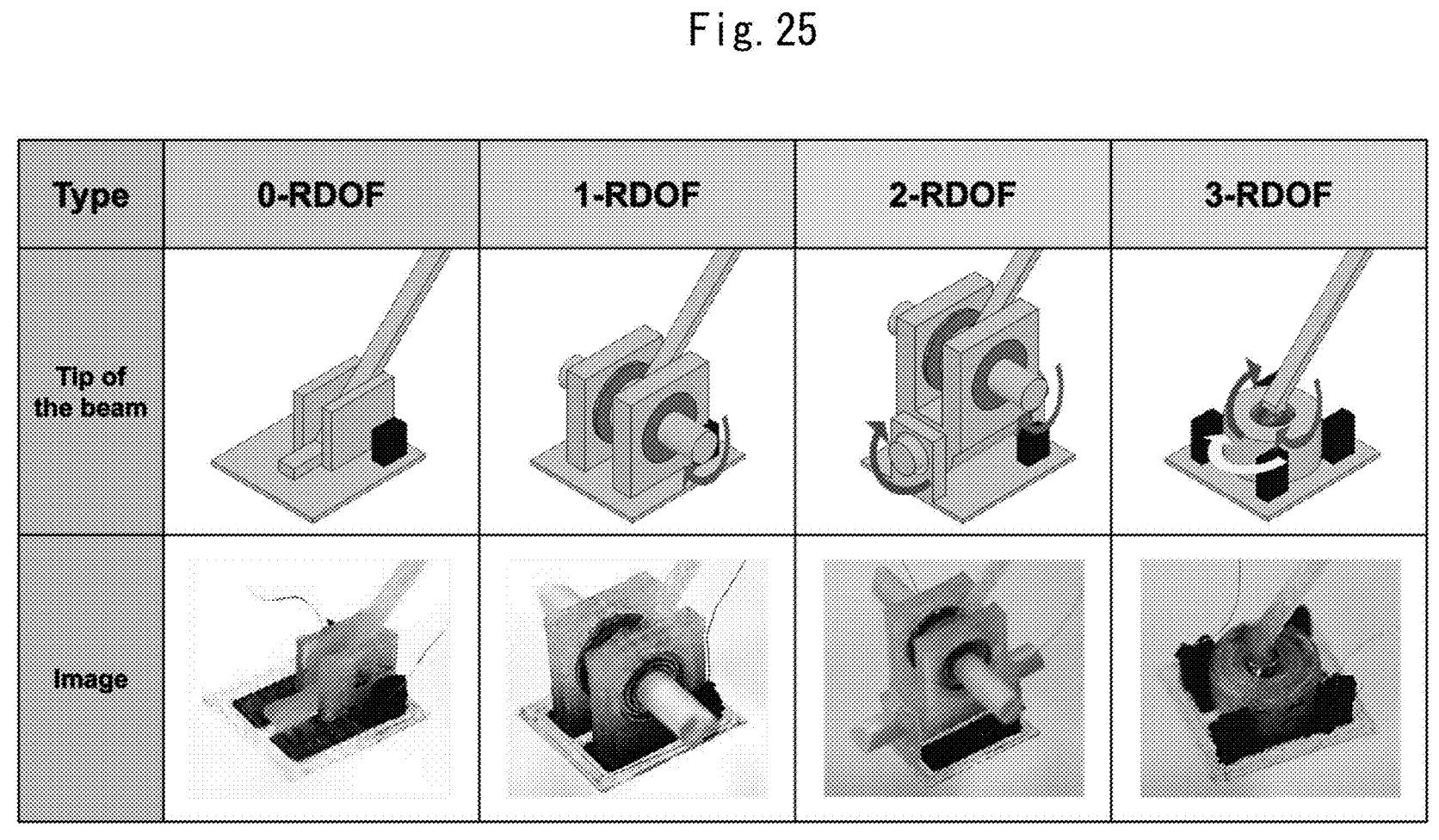

Four different electrostatic adsorption modules were fabricated, as shown in FIG. 25. In FIG. 25, the upper row of images show schematic models and the lower row are photographs of actually fabricated models.

All of the models had an electrostatic adsorption module of Example 1 as the base, using the same tip members with adsorption surfaces, and the same elastic beams (support members). They differed in the presence or absence of a joint, and in the rotational degree of freedom (RDOF) of the joint. The models in FIG. 25 have a rotational degree of freedom 0, a rotational degree of freedom 1, a rotational degree of freedom 2 and a rotational degree of freedom 3, in order from left. The joint section in the model with a rotational degree of freedom 0 was fixed with an adhesive and thus lacked rotational freedom. The model with the rotational degree of freedom 1 was the same as Example 1 (one ball bearing). The model with the rotational degree of freedom 3 was the same as Example 4 (ball joint).

The model with a rotational degree of freedom 2 was similar to the model of Example 1, but the joint was a mechanism that was rotatable in biaxial directions, as shown at second from right in FIG. 25. A 3D printer was used to shape an upper frame body part similar to the frame body with attached ball bearing and first shaft of Example 1, and a lower frame body part having a second shaft fixed to the lower end of the upper frame body part in a direction perpendicular to the first shaft. After shaping the tip member in the same manner as Example 1, a frame body for the second shaft seen in the model with rotational freedom 2 in FIG. 25 was shaped onto the tip member, inserting the second shaft while shaping.

Figure 26:
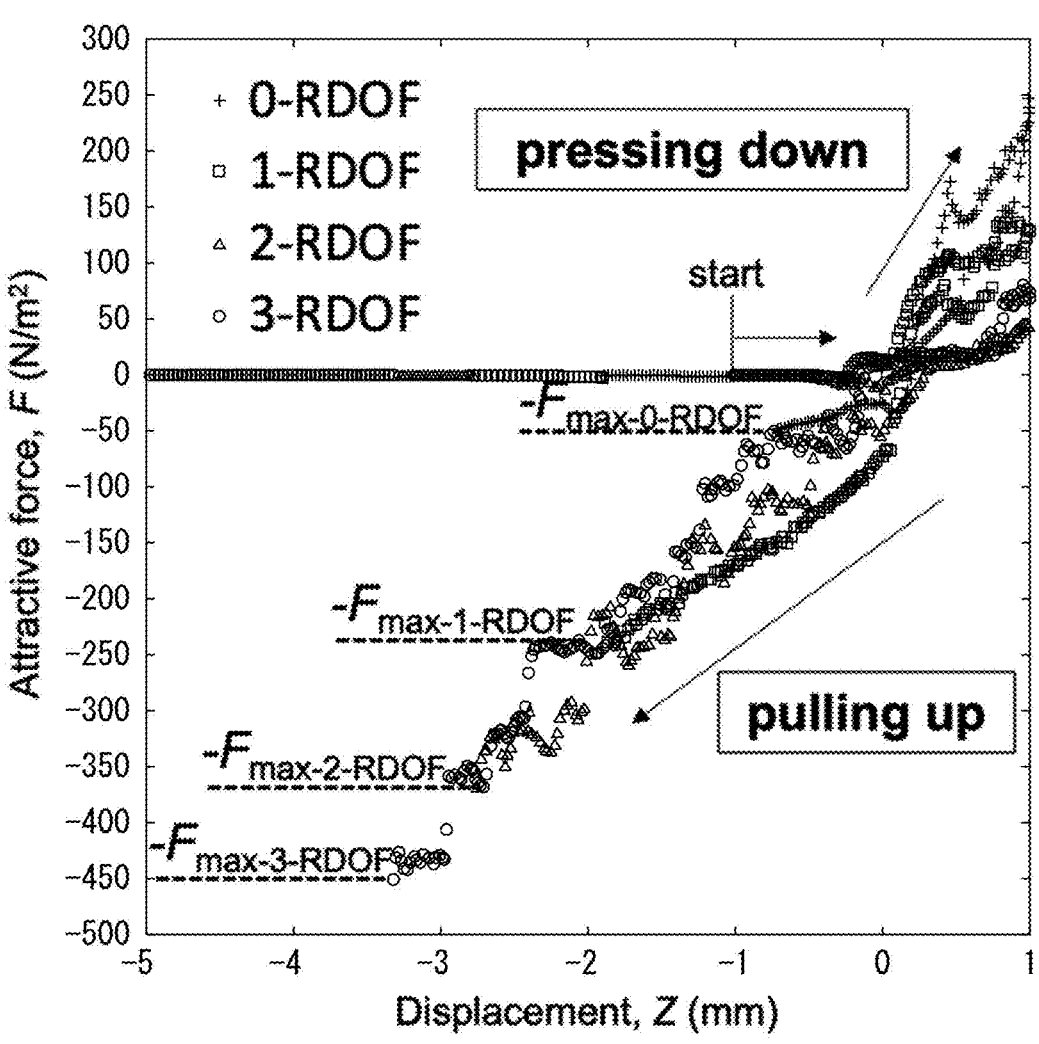
FIG. 26 is a graph showing the relationship between displacement and adsorptive power for tip members in an adsorption performance confirmation test using the four types of electrostatic adsorption modules shown in FIG. 25.

The four electrostatic adsorption modules were subjected to an adsorption performance confirmation test in the same manner as Example 2, with the results shown in FIG. 26. The abscissa in the graph of FIG. 26 represents displacement z of the tip member (with "+" indicating the direction of gravity), and the ordinate representing adsorptive power. When the adsorptive power F (ordinate) at each position was evaluated by pressing the tip member against the slide glass (positive z on the abscissa) and then raising it (negative z), as shown in FIG. 26, greater rotational freedom was found to result in increased maximum adsorptive power, as shown in Table 2. Table 2 shows the evaluated maximum adsorptive power (Fmax), and the ratio of the effective adsorptive power with respect to the theoretical maximum adsorptive power (SP Value, %).

TABLE 2

| | Type | | | |
|---|---|---|---|---|
| | 0-RODF | 1-RODF | 2-RODF | 3-RDOF |
| Fmax (1 beam) | 48.4 N/m$^2$ | 238.5 N/m$^2$ | 367.6 N/m$^2$ | 450.9 N/m$^2$ |
| SP Value | 4.8% | 73.3.% | 87.3% | 99.9% |

These results demonstrate that the electrostatic adsorption modules of the Examples, having rotational freedom, exhibit very high adsorption performance compared to modules without rotational freedom, and that higher rotational freedom results in superior adsorption performance.

Example 6: Multiple Integrated Models

Figures 27A, 27B:
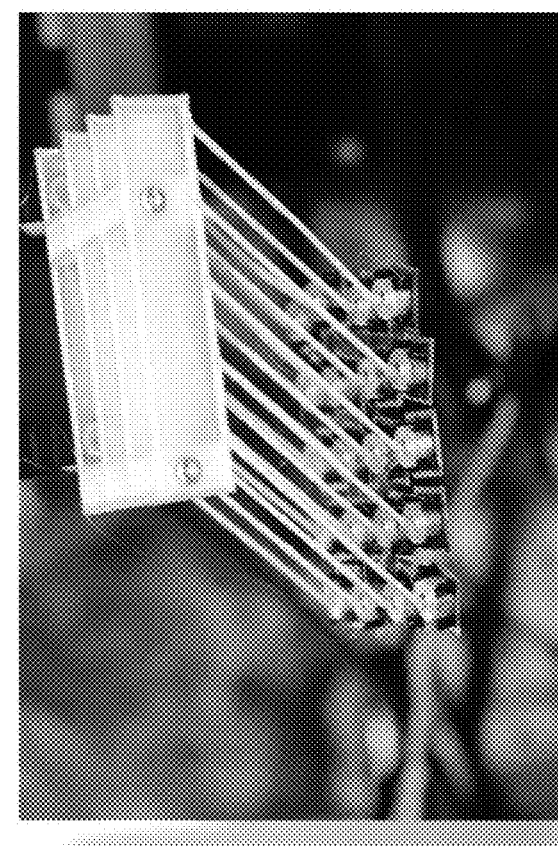
FIG. 27a is a photograph of an integrated model of electrostatic adsorption modules (3-RDOF) fabricated in Example 6, as seen from the adsorption surface side on the back sides of the tip members.
FIG. 27b is a photograph of the same as seen at an angle from the support substrate side.

FIG. 27 shows photographs of the integrated model of multiple electrostatic adsorption modules (3-RDOF) fabricated in Example 6 (5 columns×4 rows), FIG. 27*a* being a photograph as seen from the adsorption surface side on the back sides of the tip members, and FIG. 27*b* being a photograph as seen at an angle from the support substrate side.

Referring to FIG. 27, five elastic beams extend together from a single support substrate shaped in the same manner as Example 4. At the ends of each of the elastic beams there were attached the same electrostatic adsorption module (3-RDOF) as fabricated in Example 4, to construct five beam units. Four sets of five beam units were fabricated, fixing together the support substrates of the four sets of five beam units in parallel. In the electrostatic adsorption modules of the resulting integrated model, electrostatic adsorption modules fabricated in Example 4 were arranged in a 5×4 matrix.

The electrostatic adsorption modules, as an integrated model, were successfully used for electrostatic adsorption of an object to be adsorbed (weight: 81 gf) comprising a combined slide glass and metal sheet, as shown n FIG. 28*a*, at ±600 V. The adsorptive power corresponded to 192.9 Pa. The results for Example 6 demonstrate the effectiveness of multiple integrated models.

It was also confirmed that using an electrostatic adsorption module as an integrated model provides excellent adaptability to a curved surface, as shown in FIG. 28*b*.

When two types of elastic beam with compliance $\lambda_{low}$ of 0.142 m/N (low compliance) and 4.83 m/N (high compliance) were fabricated for the electrostatic adsorption modules as an integrated model, to evaluate the adsorptive power for an object to be adsorbed having a curved surface, the module with high compliance (high flexibility) exhibited higher adsorptive power than the module having a spring with low flexibility which had low compliance (low flexibility) (FIG. 28*b*). It was shown that when a module has a support member with high flexibility, the adaptability to (contact with) curved surfaces is excellent and the adsorptive power is high.

Example 7: Elastic Hinge Type, Flexibility

Figure 29:
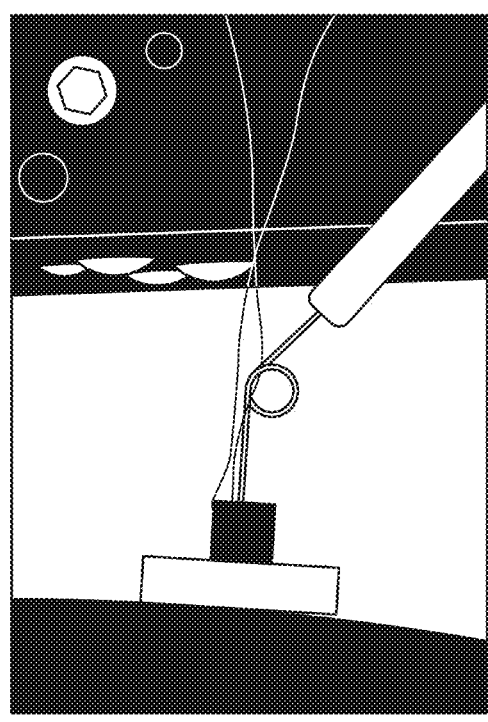
FIG. 29 is a photograph showing the elastic hinge type electrostatic adsorption module fabricated in Example 7.

The elastic hinge type electrostatic adsorption module shown in FIG. d was fabricated, changing only the number of winds of the rotating steel spring part, to fabricate multiple electrostatic adsorption modules with different spring coefficients (flexibilities). FIG. 29 shows a fabricated elastic hinge type electrostatic adsorption module. Example 7 likewise showed that when the module had a highly flexible elastic hinge, the adaptability to curved surfaces was excellent and high adsorptive power was obtained.

In an experiment in which an object to be adsorbed (glass plate) having a curved surface (inclination) was adsorbed and raised, with an electrostatic adsorption module lacking a freely rotatable joint the adsorption surface was not able to adequately contact the surface of the object to be adsorbed and could not lift it, but with an elastic hinge type electrostatic adsorption module, the adsorption surface could be inclined to allow the surface of the object to be adsorbed and electrostatic adsorption module to contact, in order to lift the object to be adsorbed.

Example 8: Residual Charge and Electrode Reversal Attenuation

Figure 30:
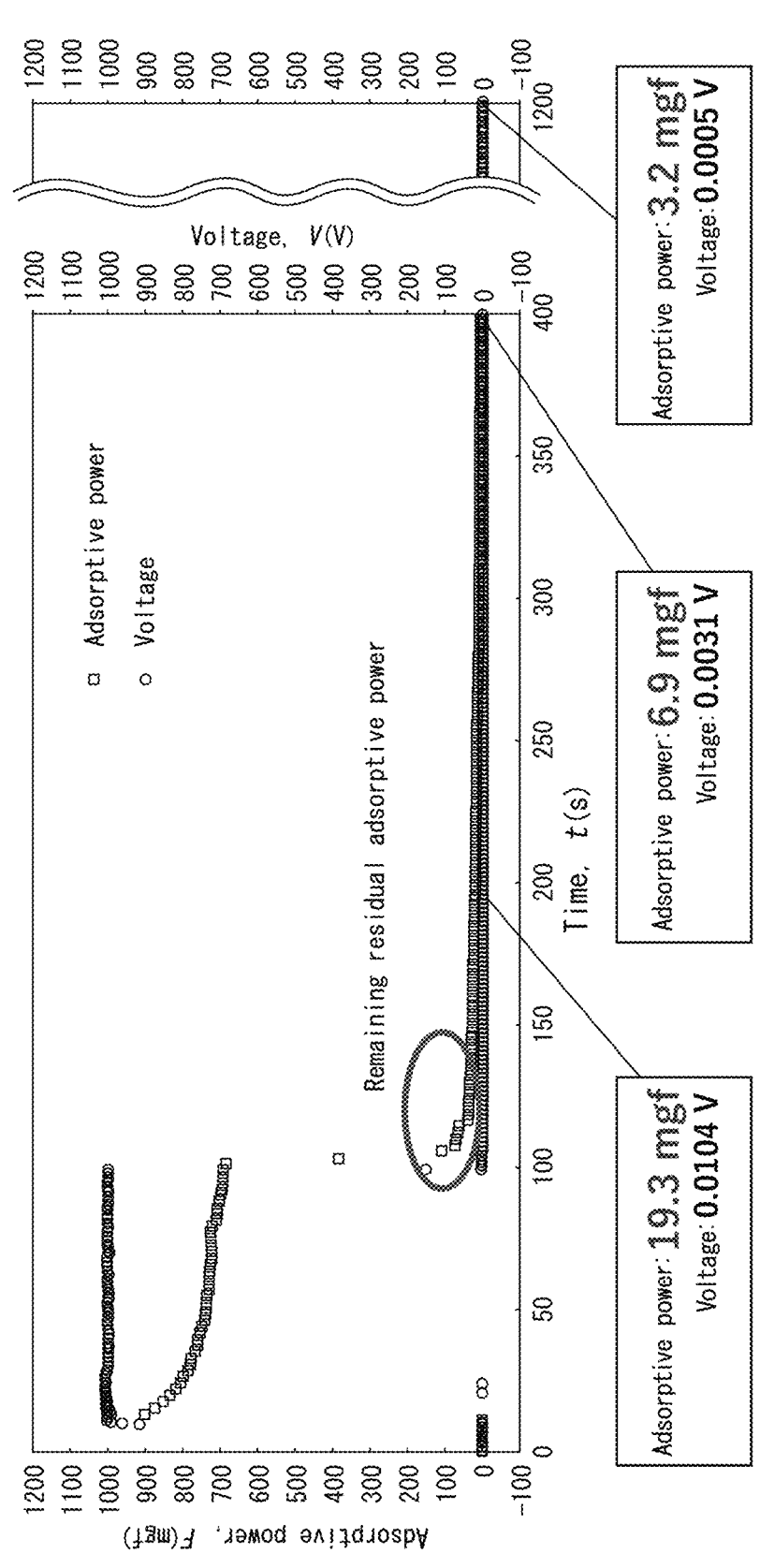
FIG. 30 is a graph showing time-dependent change in adsorptive power with slide glass as the object to be adsorbed and with an applied voltage of 0 V after voltage application, for the electrostatic adsorption module of Example 8.

For evaluation of the electrostatic adsorption performance in Example 2, a measuring apparatus as shown in FIG. 10 was used to evaluate the adsorptive power. First, the electrostatic adsorption module of Example 4 was used with slide glass as the object to be adsorbed, with application of a voltage of ±600 V followed by an applied voltage of 0 V, recording the change in adsorptive power as shown in FIG. 30. Based on FIG. 30, slight adsorptive power remained even after the applied voltage was switched OFF, confirming that residual charge remained on the slide glass.

Figure 31:
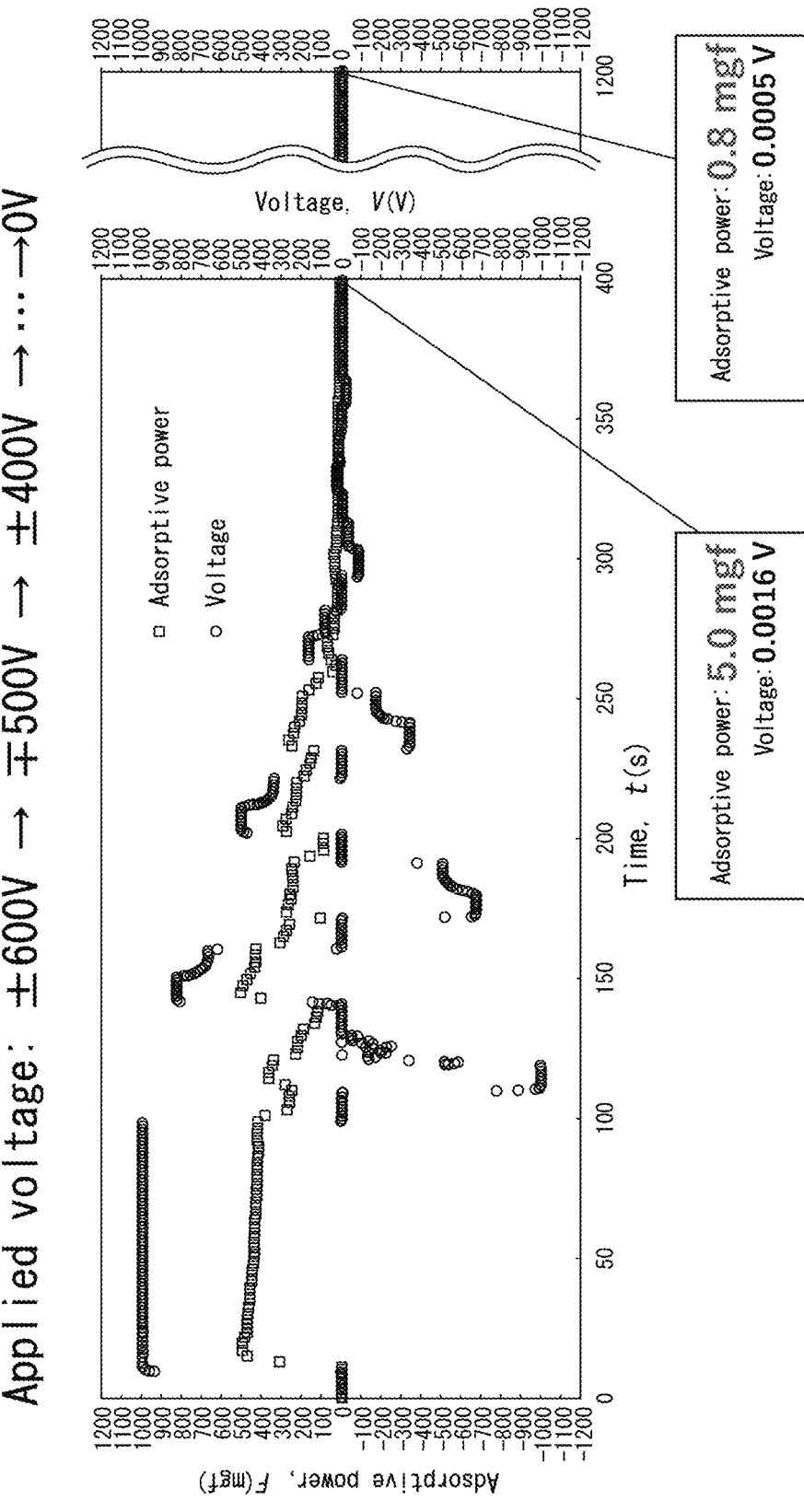
FIG. 31 is a graph showing change in voltage applied between electrodes of an electrostatic adsorption module, with slide glass as the object to be adsorbed and with an applied voltage of 0 V in polarity reversal attenuation mode after voltage application, for the electrostatic adsorption module of Example 8.

Next, using the electrostatic adsorption module of Example 4, with slide glass as the object to be adsorbed, change in the measured value for the voltage applied between electrodes of the electrostatic adsorption module was recorded as shown in FIG. 31, with application of a voltage of 600 V, followed by attenuating from 500 V→400V→ . . . 0 V while reversing the polarity of the applied voltage.

In FIG. 31 it is seen that the adsorptive power and residual charge after voltage OFF were lower compared to FIG. 30. The adsorptive power after 1200 seconds fell from 3.2 mgf to 0.8 mgf, or ¼.

Example 9: Electrode Reversal Attenuation+Inclination

Figure 32:
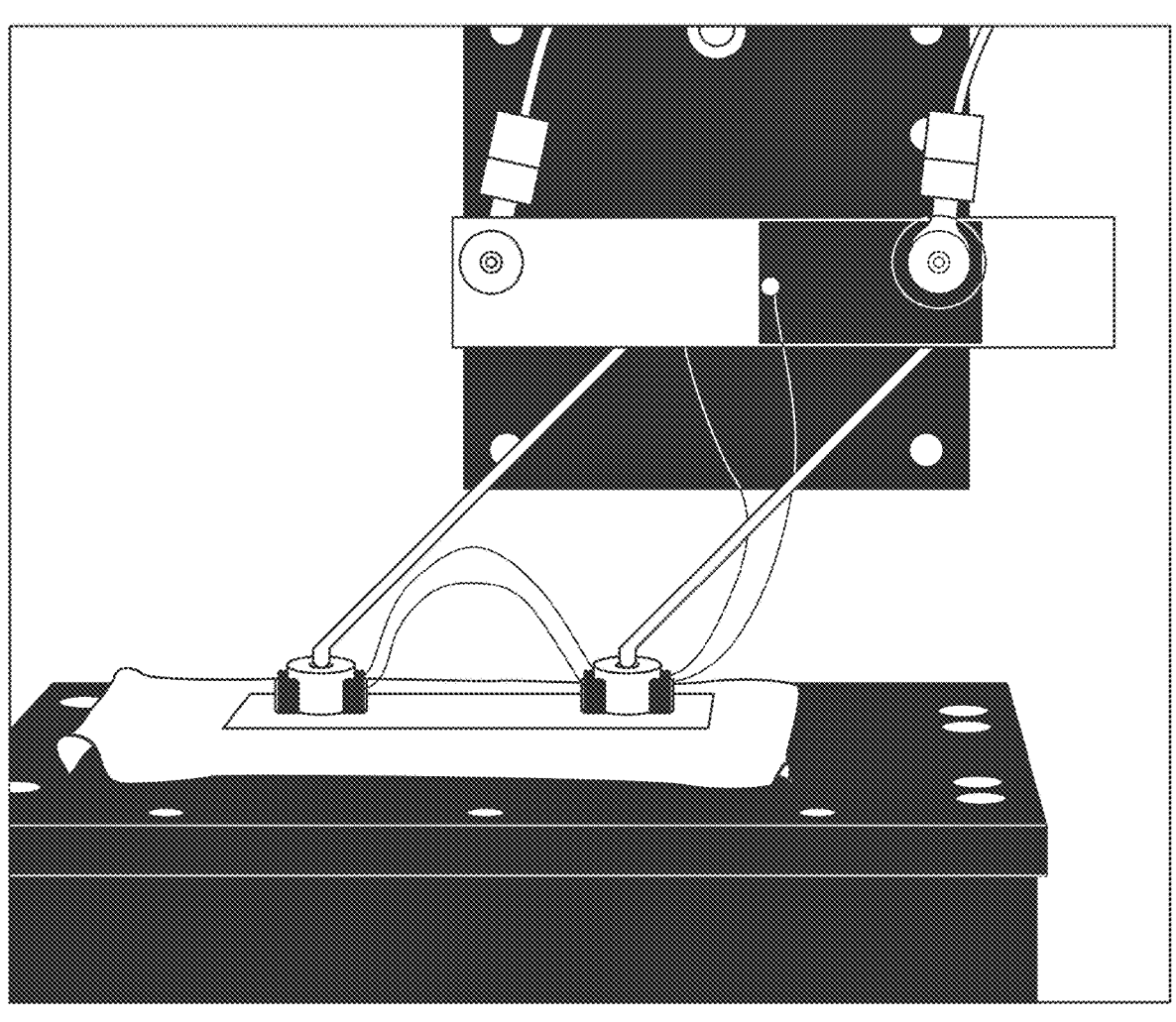
FIG. 32 is a photograph showing the electrostatic adsorption module fabricated in Example 9.

The electrostatic adsorption module model shown in FIG. 32 was fabricated for Example 9. This model is similar to Example 4 but differs from Example 4 in that not one but two electrostatic adsorption modules were formed integrally with a single support substrate. The model was used for adsorption and detachment of a plastic sheet (polyimide material) having a length of 50 mm, a width of 15 mm and a thickness of 0.05 mm. The applied voltage was ±600 V.

In the first experiment, after turning the applied voltage OFF, it was attempted to press one tip member against the plastic sheet while raising the other tip member to detach the plastic sheet, but the plastic sheet stuck to the tip member making it impossible to achieve satisfactory detachment.

In the second experiment, the applied voltage was attenuated from ±600 V to OFF while reversing the electrodes as in Example 8, and then both tip members were raised, but the plastic sheet stuck to the tip members making it impossible to achieve satisfactory detachment.

In the third experiment, the applied voltage was attenuated from ±600 V to OFF while reversing the electrodes in the same manner as the second experiment, after which one side electrostatic adsorption module was raised, and this resulted in satisfactory detachment without sticking of the plastic sheet to the tip members.

The integrated model electrostatic adsorption module of Example 6 was also used, with an applied voltage of ±600 V, and even when polarity reversal attenuation and inclined detachment (with 5 rows of inclined unit electrostatic adsorption modules) were combined, the plastic sheet was satisfactorily detached without sticking to the tip member.

REFERENCE SIGNS LIST

1, 1′ Electrostatic adsorption module
2 Tip member
2*s* Electrostatic adsorption surface
2-1 Positive electrode
2-2 Negative electrode
2-3 Insulation region
2-4 Surrounding insulation region
3, 3*a*, 3*b*, 3*c*, 3*d* Support member (elastic beam)
3-1, 3-2 Cylindrical member
3-3 Elastic member
3-4, 3-5 Tubular body
3-6 Bent section
4 Joint
4*a* Three-dimensional freely rotatable joint 4b Two-dimensional freely rotatable joint
4c Ball joint
4-1 Sphere
4-2 Frame body
4-3 Frame body
4-4 Bearing
4-5 Shaft
5 Support substrate
5-1 Laminar body
6 Robotic arm
6-1 Variable stiffness joint
7 Wiring
H Joint height
L Tip member length
10 Electrostatic adsorption module
30 Linked scissor mechanism
31, 32 Scissor mechanism
31-1, 31-2 Link pair
32-1, 32-2 Link pair
A, B, C Rotating couple
35 Both end links
36 Robotic arm
36-1 Variable stiffness joint
51 Unit electrostatic adsorption module
52 Laminated electrostatic adsorption module
53 Positive electrode layer
54 Negative electrode layer
55 Insulating layer
100 Electrostatic adsorption device
110 Object (sheet) to be adsorbed
120 Setting location

The invention claimed is:

1. An electrostatic adsorption module comprising
a tip member having a bipolar adsorption surface and an opposite side portion,
a support member that supports the tip member and has an elastically displaceable mechanism, and
a freely rotatable joint having a rotation axis or center located on the opposite side portion of the tip member and between the tip member and the support member,
wherein the tip member as a whole body can be elastically displaced in the near and far direction with respect to the object to be adsorbed, the elastic displacement being enabled by the elastically displaceable mechanism of the support member, and
the bipolar adsorption surface of the tip member is freely rotatable around the rotation axis or center of the freely rotatable joint and has a free rotation movement around the rotation axis or center,
whereby due to the elastic displacement of the support member itself in the near and far direction with respect to the object to be adsorbed as well as the free rotation movement of the tip member around the rotation axis or center of the freely rotatable joint, the electrostatic adsorption surface of the tip member can adapt to changes in the shape of the surface of the object to be adsorbed when the electrostatic adsorption surface has moved or been pressed against the surface of the object to be adsorbed.

2. The electrostatic adsorption module according to claim 1, wherein the bipolar adsorption surface has a positive electrode, a negative electrode, and an insulation region between them.

3. The electrostatic adsorption module according to claim 1, wherein the joint has two-dimensional or three-dimensional rotational freedom.

4. The electrostatic adsorption module according to claim 1, wherein the tip member is laminar and has the joint on the opposite end of the tip member from the electrostatic adsorption surface.

5. The electrostatic adsorption module according to claim 1, wherein the support member is constructed of multiple members that can be displaced in the depth direction, and an elastic member that joins the multiple members.

6. The electrostatic adsorption module according to claim 1, wherein the support member is constructed of an elastic member that can be displaced in the near and far direction.

7. The electrostatic adsorption module according to claim 1, which comprises multiple support members and multiple tip members, each of the multiple support members supporting each of the tip members, the multiple support members being fixed to a support substrate on the opposite end from the tip member, whereby the multiple tip members as a whole supported by the support substrate form a collected electrostatic adsorption surface.

8. An electrostatic adsorption device comprising:
a robotic arm,
a support substrate,
multiple tip members each having a bipolar electrostatic adsorption surface and an opposite side portion, and
multiple support members extending from the support substrate and supporting the multiple tip members, each of the support members supporting each of the tip members and having an elastically displaceable mechanism,
wherein the multiple support members are able to elastically displace the multiple tip members as a whole body in the near and far direction with respect to the support substrate, and the elastic displacement being enabled by the elastically displaceable mechanism of the support members,
each of the tip members and each of the support members are coupled via a freely rotatable joint having a rotation axis or center, the freely rotatable joint being located on the opposite side portion of the tip member and between each of the tip members and each of the support members, by which the bipolar adsorption surface of the tip member is freely rotatable around the rotation axis or center and has a free rotation movement around the rotation axis or center,
due to the elastic displacement of the support member itself in the near and far direction with respect to the object to be adsorbed, as well as the free rotation movement of the tip member around the rotation axis or center of the freely rotatable joint, the electrostatic adsorption surface of the tip member can adapt to changes in the shape of the surface of the object to be adsorbed when the electrostatic adsorption surface has moved or been pressed against the surface of the object to be adsorbed,
the support substrate itself is deformable, and
the support substrate is operated by the robotic arm.

9. The electrostatic adsorption device according to claim 8, wherein the support substrate comprises multiple aligned laminar bodies, the multiple laminar bodies being connected together in an elastically bendable manner.

10. The electrostatic adsorption device according to claim 9, wherein each of the multiple laminar bodies supports multiple pairs of support members and tip members.

11. An electrostatic adsorption method in which an object to be adsorbed that is flexible or has a curved surface is adsorbed and gripped using an electrostatic adsorption device according to claim 8.

12. The method according to claim 11, wherein the object to be adsorbed is flexible.

13. The method according to claim 11, which comprises the electrostatic adsorption module or electrostatic adsorption device conveying and detaching the object to be adsorbed after the electrostatic adsorption module or electrostatic adsorption device has adsorbed and gripped the object to be adsorbed.

14. The method according to claim 11, which comprises using the electrostatic adsorption module or electrostatic adsorption device to adsorb and grip an object to be adsorbed which is flexible or has a curved surface, to convey the object to be adsorbed to a setting location having a curved surface and to adapt the object to be adsorbed to the curved surface of the setting location, and then detaching the object to be adsorbed from the electrostatic adsorption module or electrostatic adsorption device.

15. The method according to claim 14, wherein the detachment is carried out after the object to be adsorbed that is adapted to the curved surface of the setting location has been fixed to the curved surface.

16. An electrostatic absorption method for adsorbing and gripping an object using an electrostatic adsorption device according to claim 8, wherein:

the electrostatic adsorption device has multiple tip members arranged in rows from one end to the other end, the multiple tip members are used to adsorb and grip the object wherein the object adsorbed is conveyed onto the setting base, after which the voltage applied to the multiple tip members for adsorption and gripping is turned OFF in polarity reversal attenuation mode, and the multiple tip members on the object on the setting base are separated so that the object at the other end recedes more quickly than the object at the one end, with respect to the surface of the setting base, to detach the multiple tip members from the object on the setting base while the object is allowed to remain on the setting base.

17. The electrostatic adsorption method according to claim 11, wherein the object is an organic EL panel.

18. The electrostatic adsorption method according to claim 16, in which the object is flexible.

19. The electrostatic adsorption method according to claim 16, in which the object has a curved surface.

20. The electrostatic adsorption module according to claim 1, wherein when representing the maximum dimension of the electrostatic adsorption surface of the tip member as L and the height of the rotation axis or center of the joint in the direction away from the electrostatic adsorption surface as H, the relationship $H \leq L$, is satisfied.

21. The electrostatic adsorption device according to claim 9, wherein when representing the maximum dimension of the electrostatic adsorption surface of the tip member as L and the height of the rotation axis or center of the joint in the direction away from the electrostatic adsorption surface as H, the relationship $H \leq L$ is satisfied.

\* \* \* \* \*